(12) United States Patent
Tarng et al.

(10) Patent No.: US 7,663,349 B2
(45) Date of Patent: Feb. 16, 2010

(54) GREEN TECHNOLOGIES: 7LESS MICROSYSTEMS

(75) Inventors: Min Ming Tarng, San Jose, CA (US); Mei Jech Lin, San Jose, CA (US); Eric Yu-Shiao Tarng, San Jose, CA (US); Alfred Yu-Chi Tarng, San Jose, CA (US); Angela Yu-Shiu Tarng, San Jose, CA (US); Jwu-Ing Nieh, San Jose, CA (US); Huang-Chang Tarng, San Jose, CA (US); Shun-Yu Nieh, San Jose, CA (US)

(73) Assignee: Tang System, San Jose, CA (US)

( * ) Notice: Subject to any disclaimer, the term of this patent is extended or adjusted under 35 U.S.C. 154(b) by 0 days.

(21) Appl. No.: 12/288,770

(22) Filed: Oct. 23, 2008

(65) Prior Publication Data

US 2009/0058386 A1    Mar. 5, 2009

Related U.S. Application Data

(63) Continuation-in-part of application No. 11/593,271, filed on Nov. 6, 2006, now Pat. No. 7,511,589.

(51) Int. Cl.
*G05F 1/613* (2006.01)
(52) U.S. Cl. ...................................... 323/225
(58) Field of Classification Search ................. 323/222, 323/223, 225
See application file for complete search history.

(56) References Cited

U.S. PATENT DOCUMENTS 5,633,579 A * 5/1997 Kim ........................... 323/222

* cited by examiner

*Primary Examiner*—David Mis

(57) ABSTRACT

The green technology is the technology for the green society having the green safety. The green technology is not only save the resource and recycle the resource but also save the energy and recycling the energy. The core technology of the Green Technology is the 7Less Microsystems. The 7Less Microsystems are the Xtaless Clock Generator, the Resistorless Current Sensor, the Capacitorless Low Drop Voltage Regulator, the Inductorless Switch Mode Power Supply, and the Avalanche Diodeless True Random Noise Generator, the Sawless Low Noise Amplifier, and the Brakeless Hybrid Electrical Vehicle. The Gain-Boost-Q LC VCO is the fundamental technology of the Xtaless Clock Generator, Spurfree/Jitterless Frequency and Phase Lock Loop, multi-phase high-speed high frequency clock and the Sawless Low Noise Amplifier. The switch inductor is the fundamental technology of the high power efficiency of the Switch Mode Power Supply. The high efficiency converter technology is the fundamental of the high efficiency power amplifier. The residue energy is recycling in the system to save the power from the wasted dissipation. The high efficiency power amplifier is the fundamental technology of the high efficiency plasma light and the $4^{th}$ generation OFDM Ultra-Wide Band communication and cellular phone. The dynamic balanced battery is the fundamental technology of the Hybrid Electric Vehicle. The polarized camera with the polarized micro lens and polarized cellular phone with the polarized antenna make the signal transmission much more clearly. All the above green technologies constitute the essential characteristics technologies of the Green Society.

20 Claims, 58 Drawing Sheets

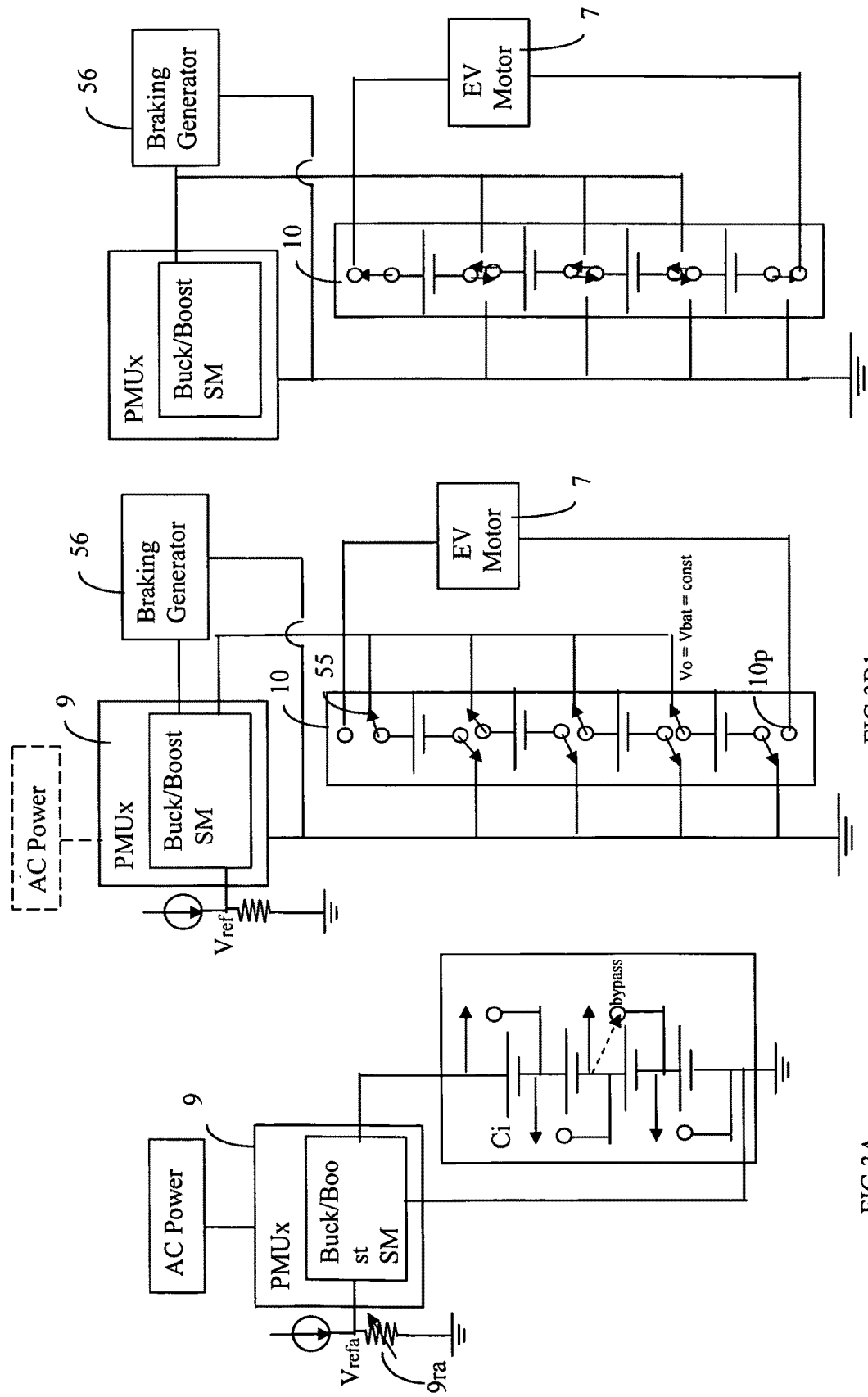

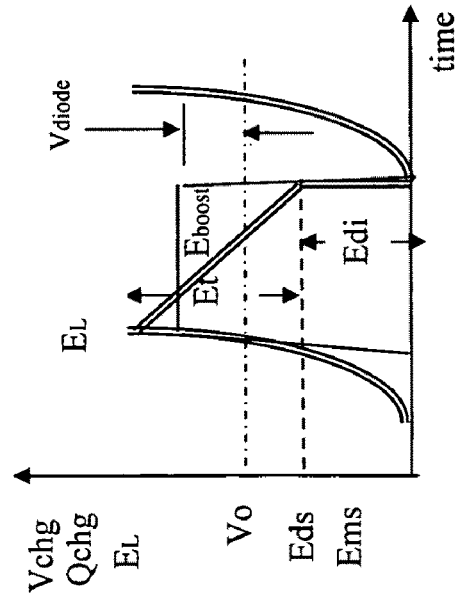
FIG.7A2
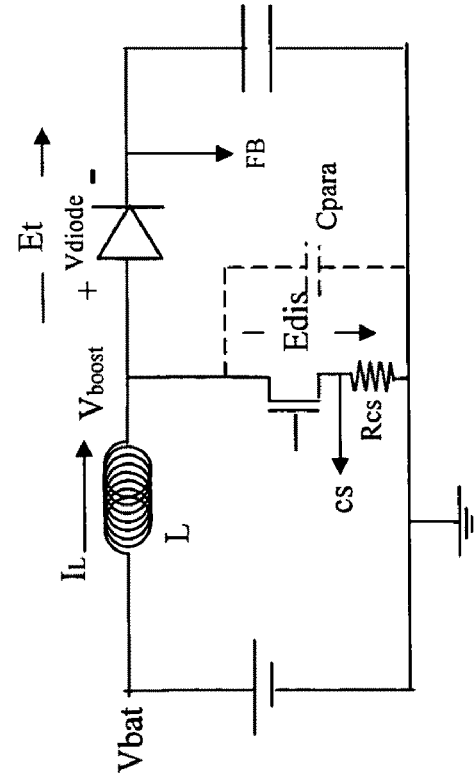
FIG.7B2
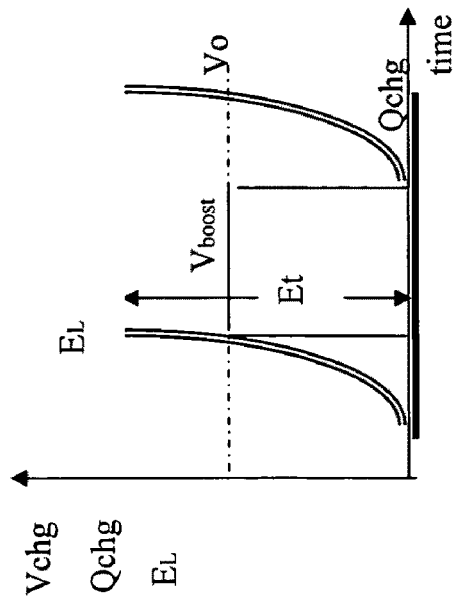
FIG.7A1 (Prior Art)
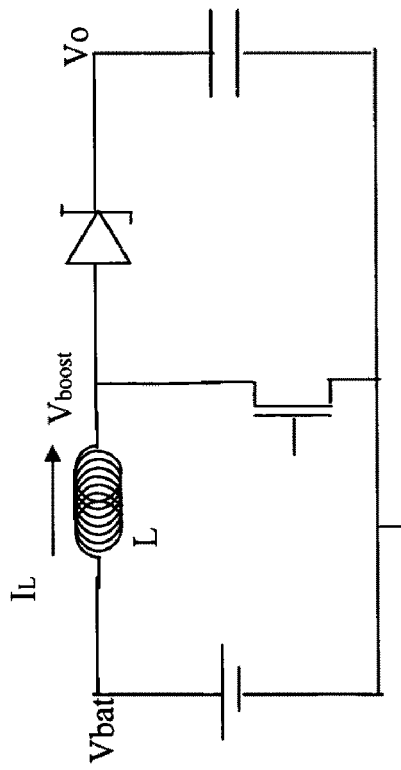
FIG.7B1 (Prior Art)

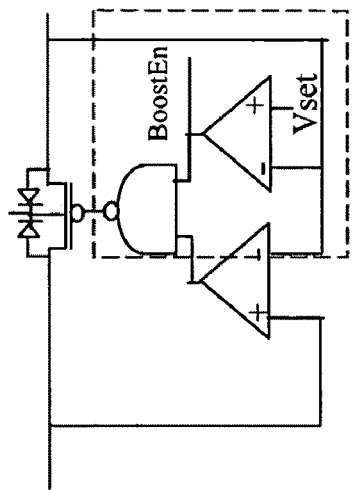
FIG.10C1
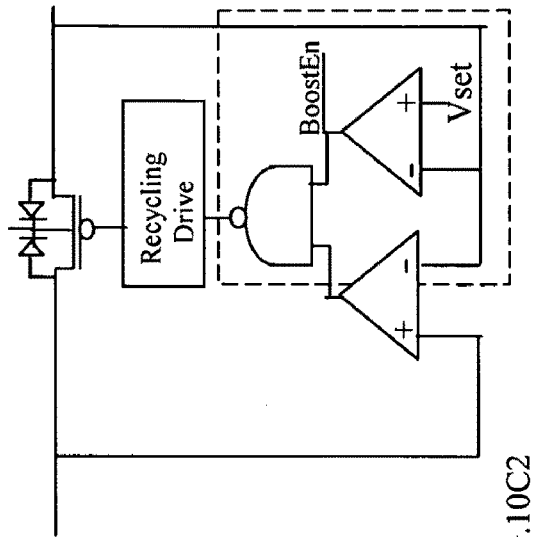
FIG.10C2
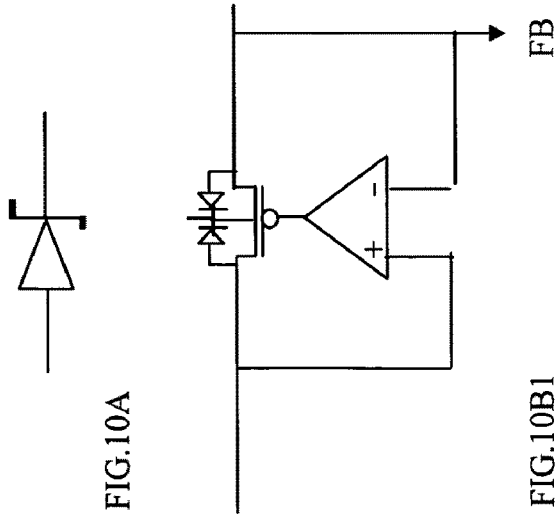
FIG.10A
FIG.10B1
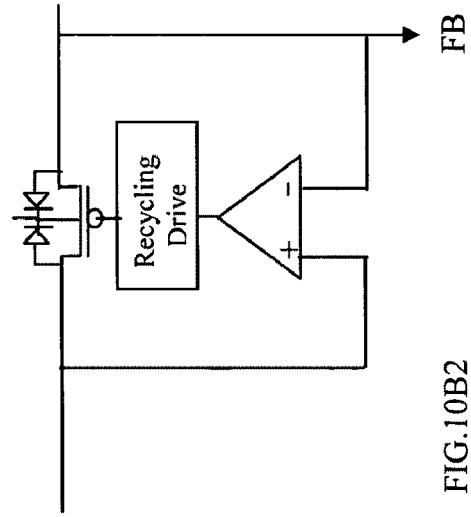
FIG.10B2

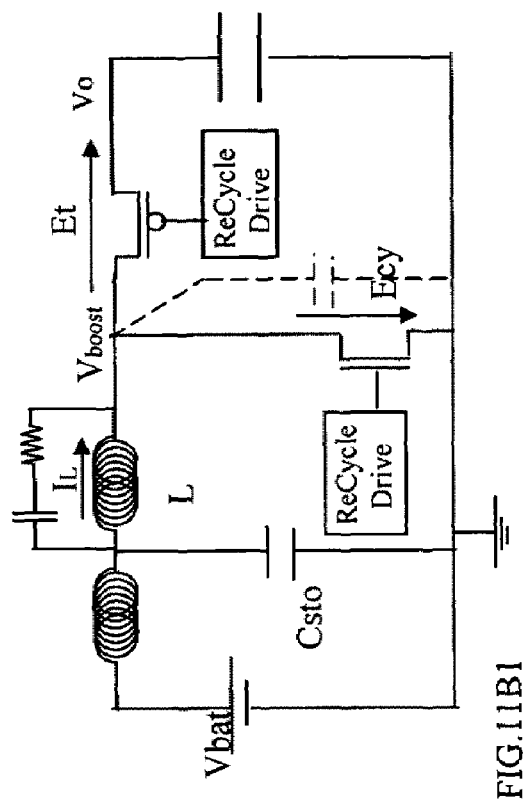
FIG.11A1
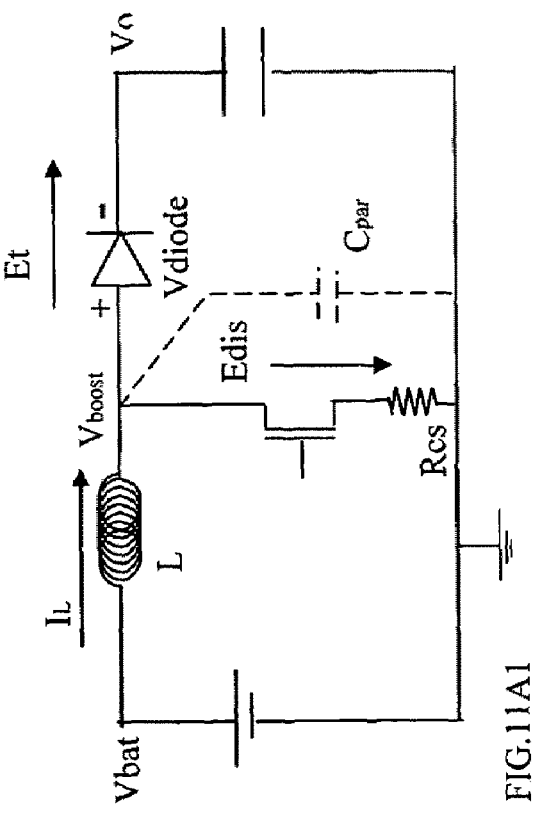
FIG.11B1
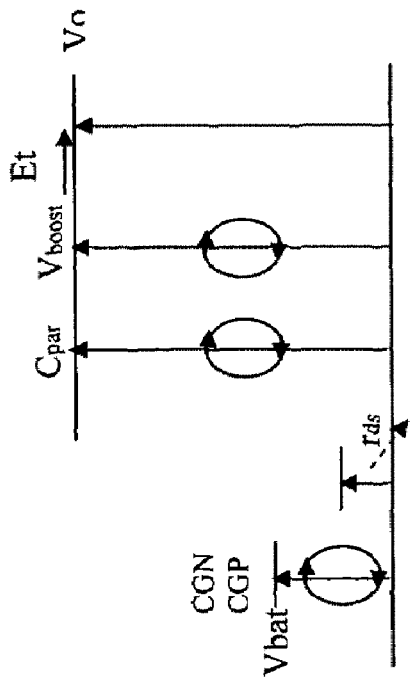
FIG.11A2
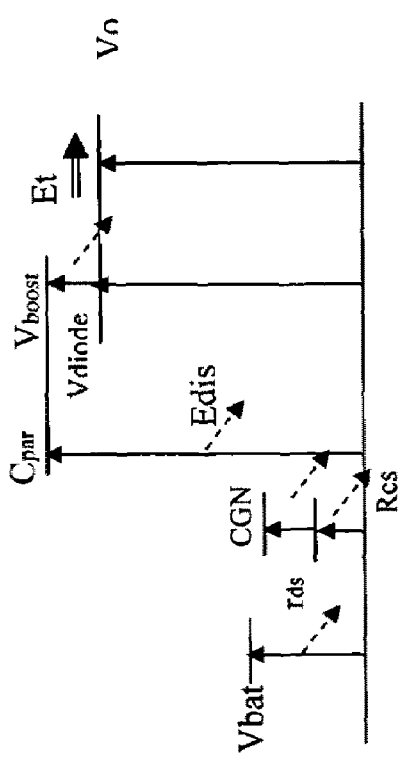
FIG.11B2

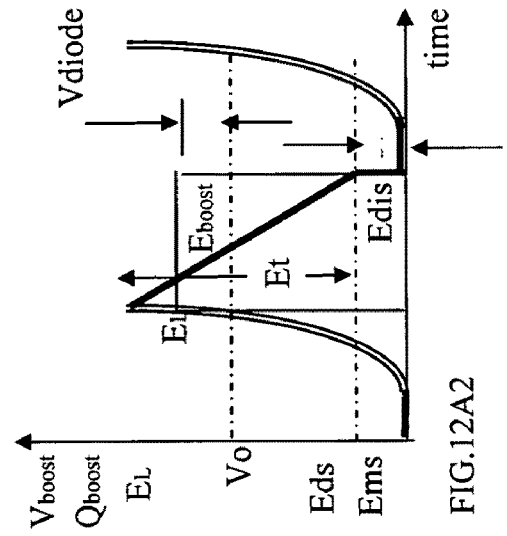
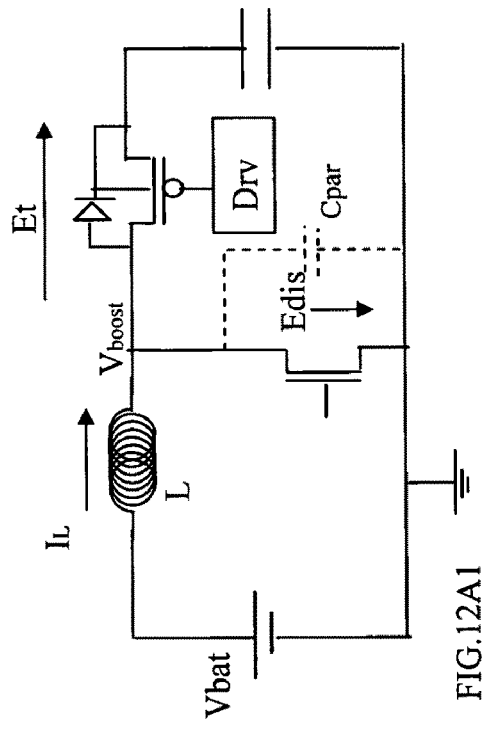
FIG.12A1
FIG.12A2
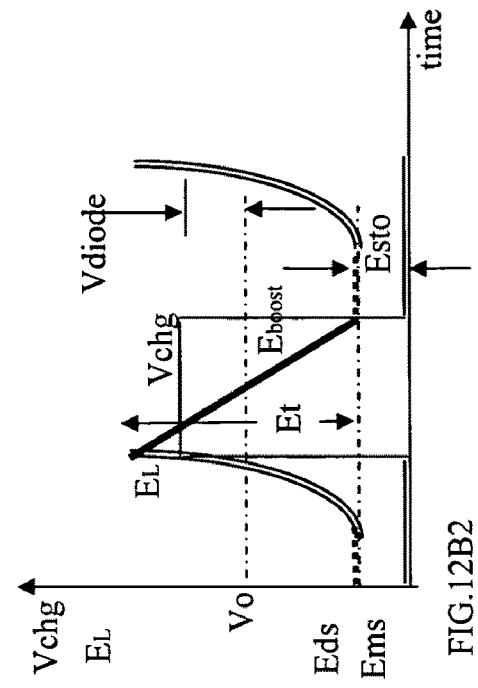
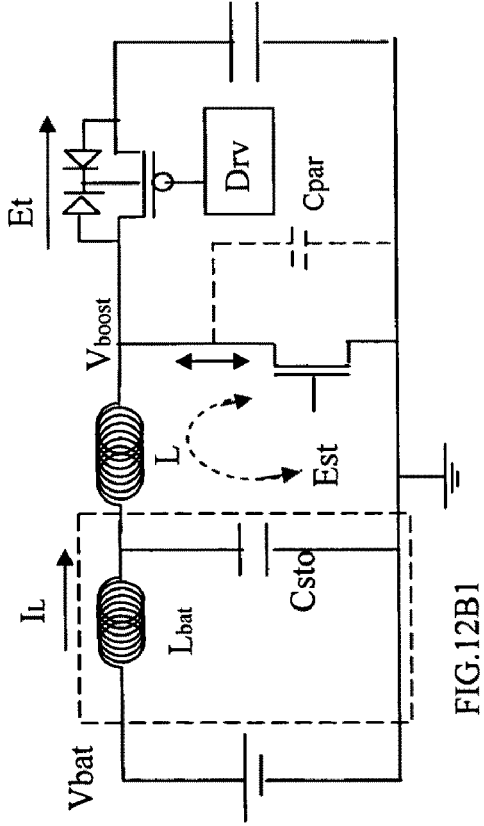
FIG.12B1
FIG.12B2

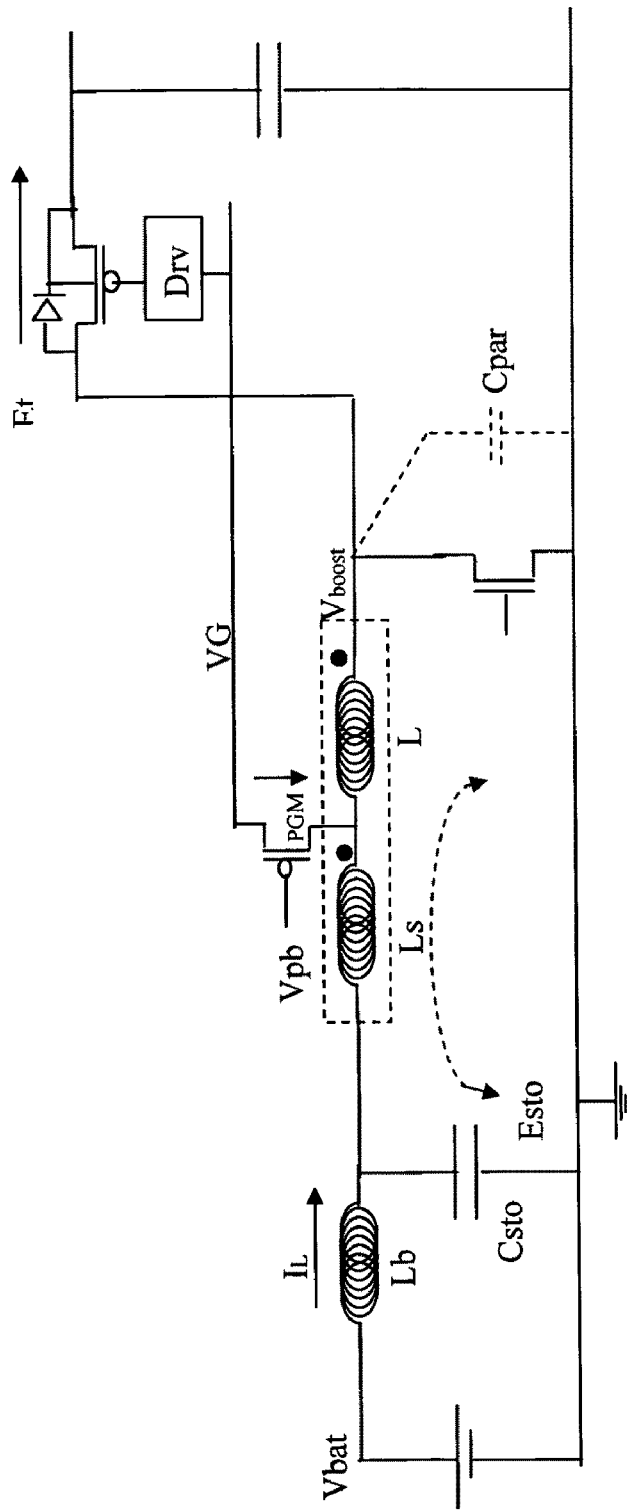
FIG.12C1
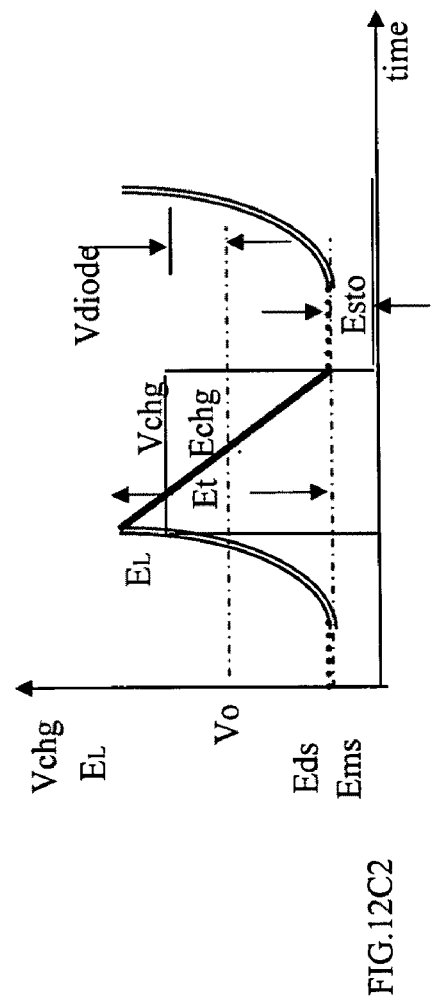
FIG.12C2

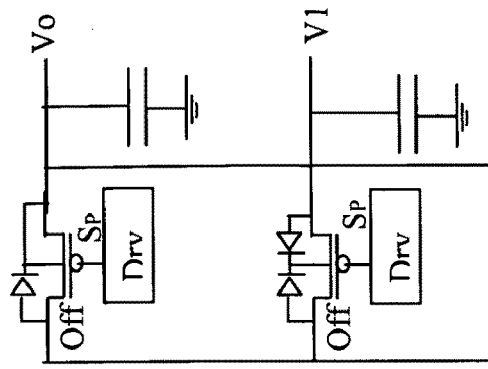
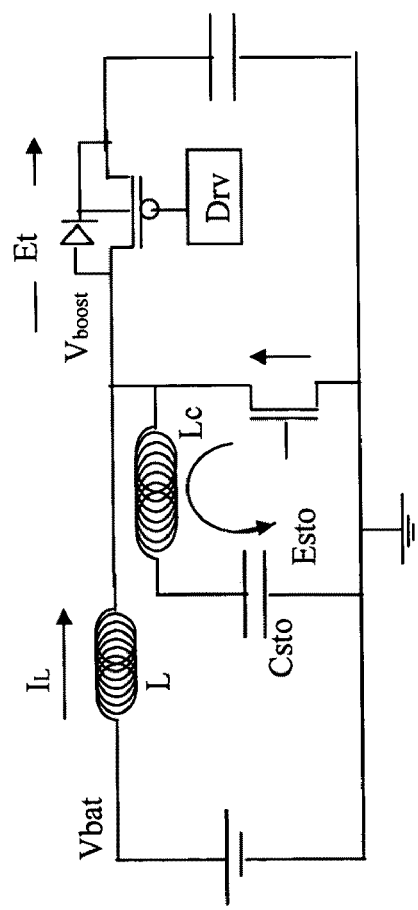
FIG.12D
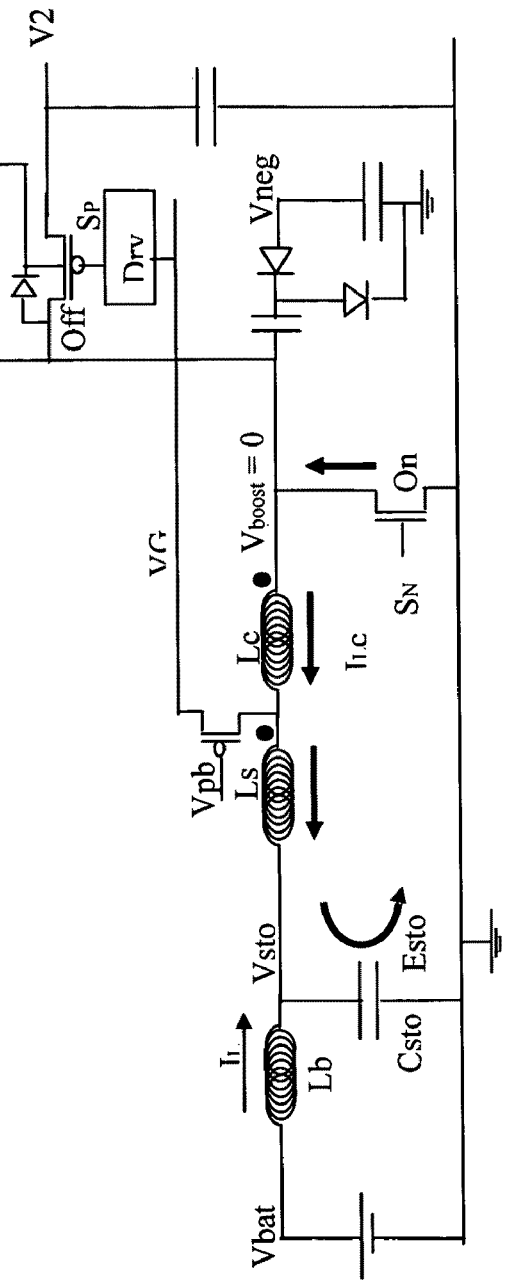
FIG.12E

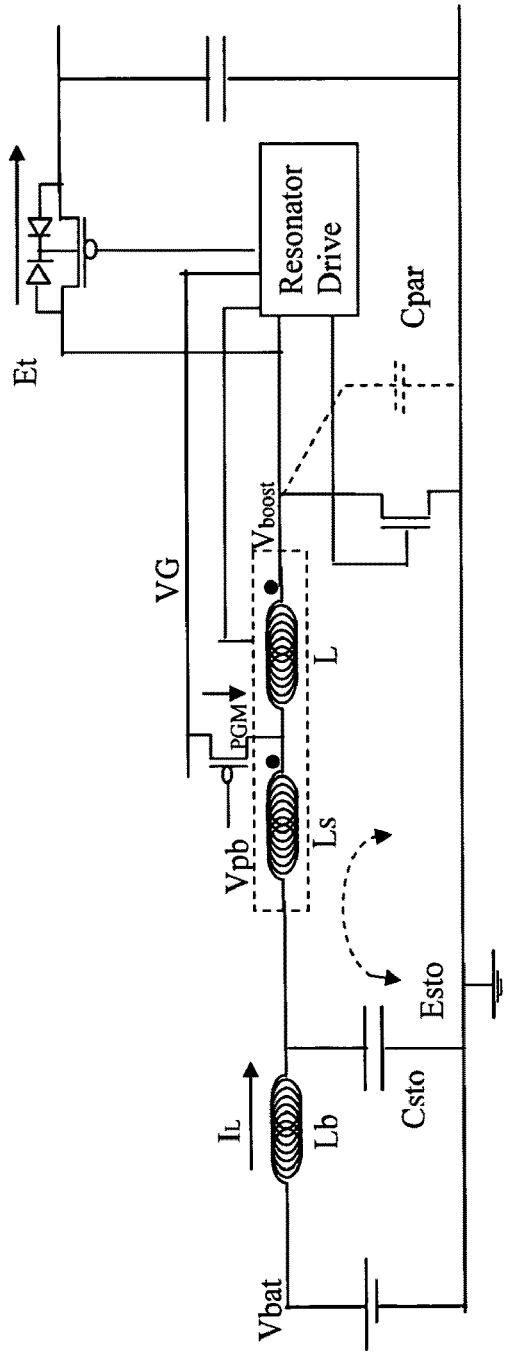
FIG.12F1
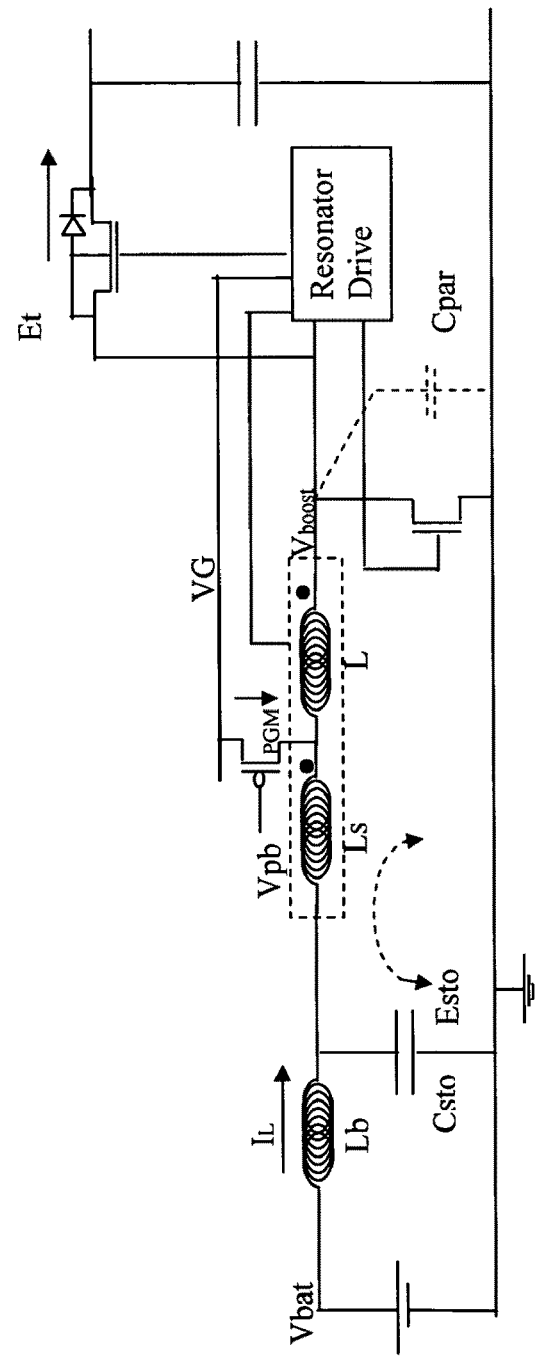
FIG.12F2

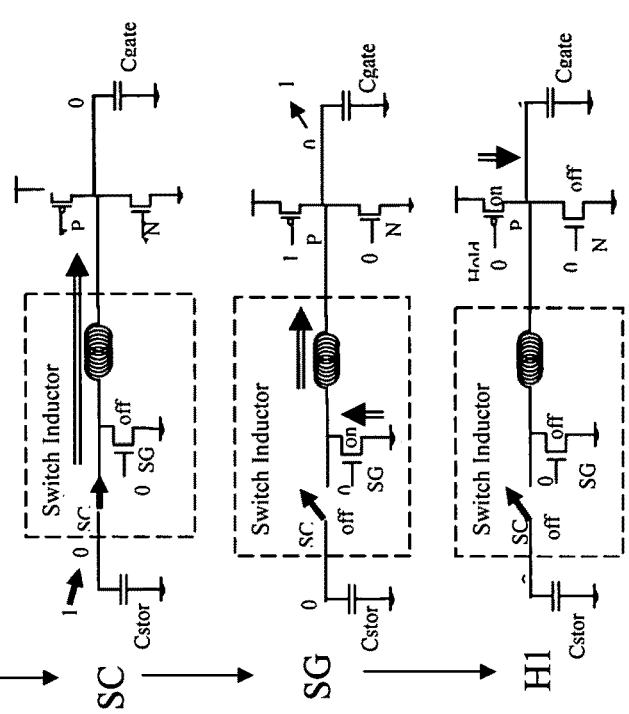
FIG.20E
FIG.20
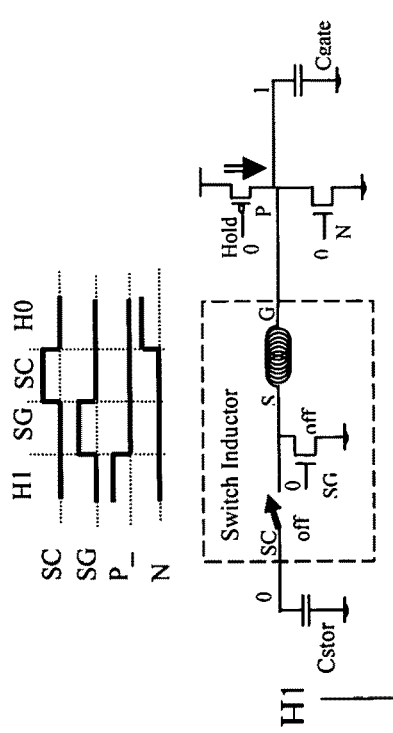
FIG.19

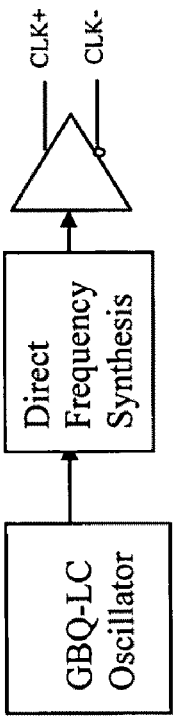
FIG.23A1
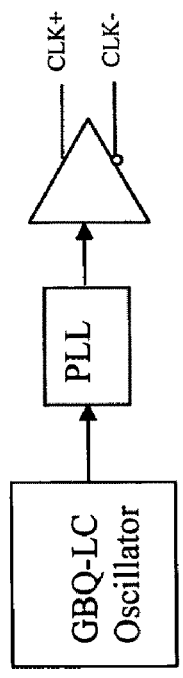
FIG.23B1
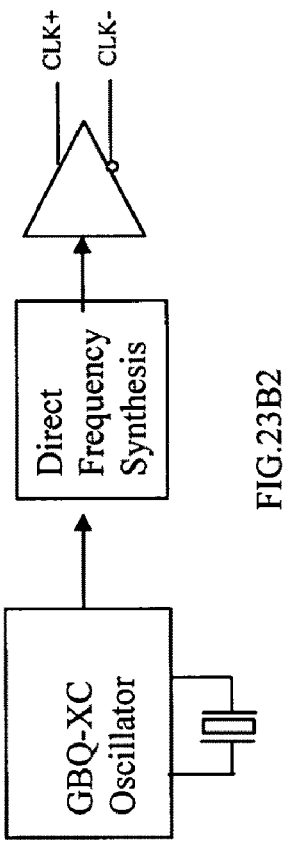
FIG.23A2
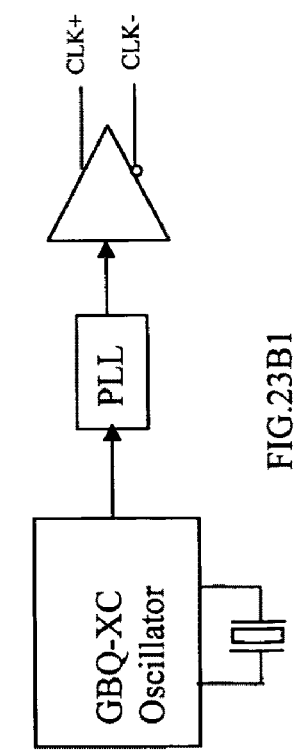
FIG.23B2
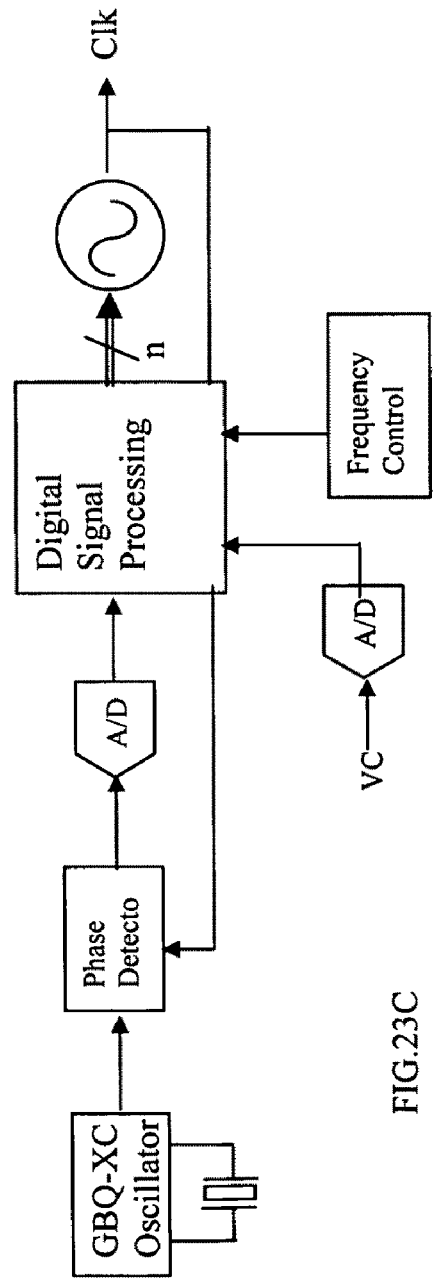
FIG.23C

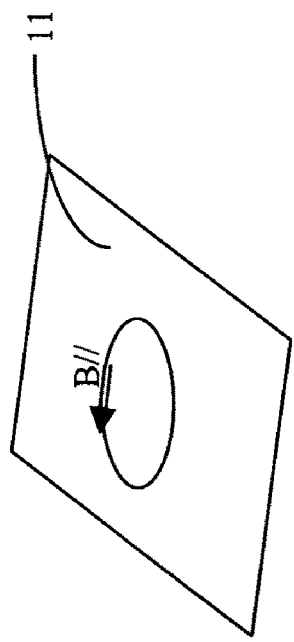
FIG.25A
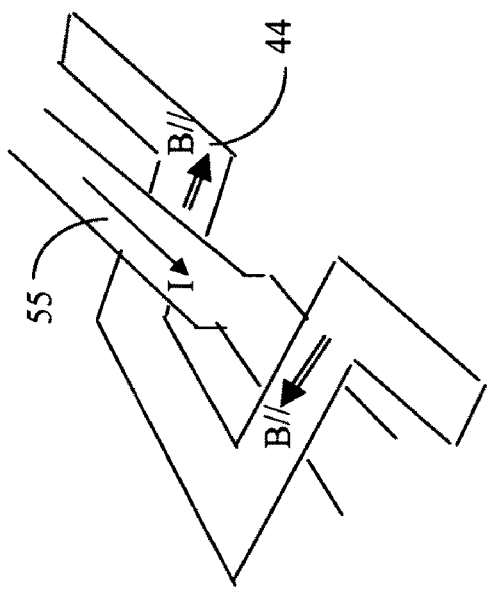
FIG.25B1
FIG.25B2
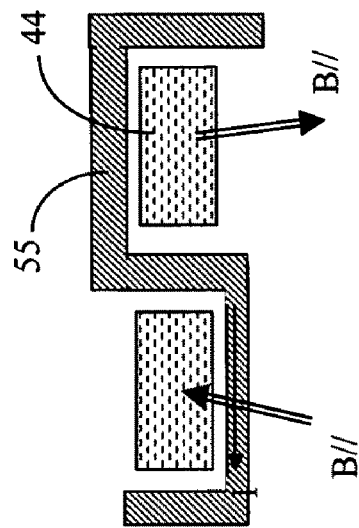
FIG.25C1
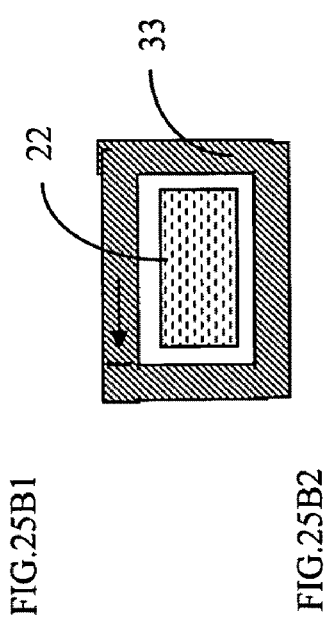
FIG.25C2

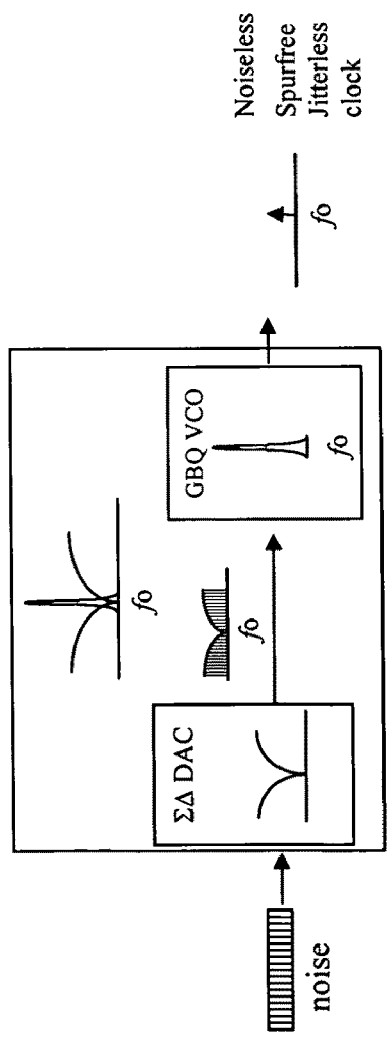
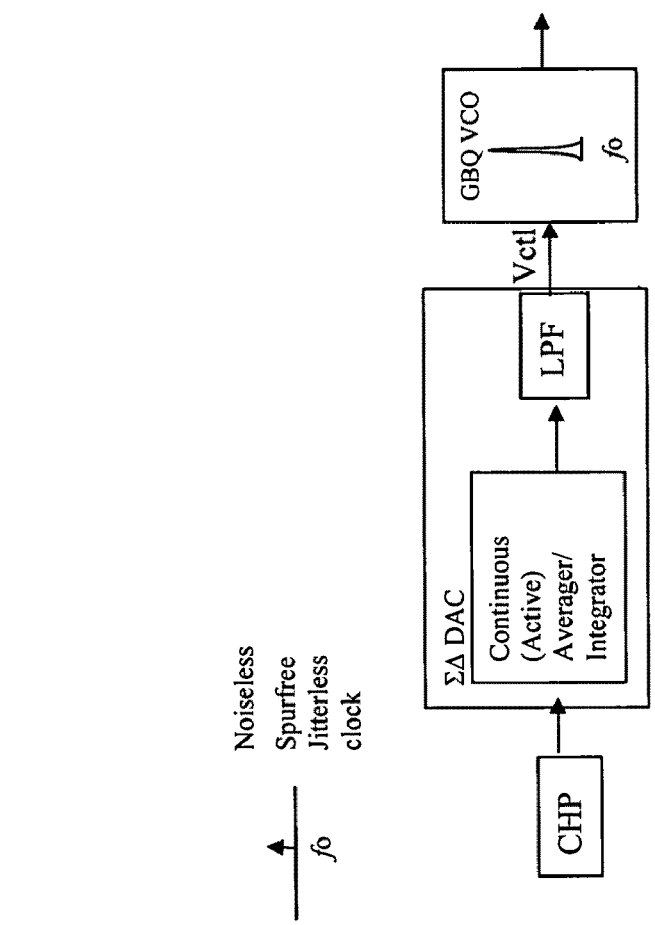
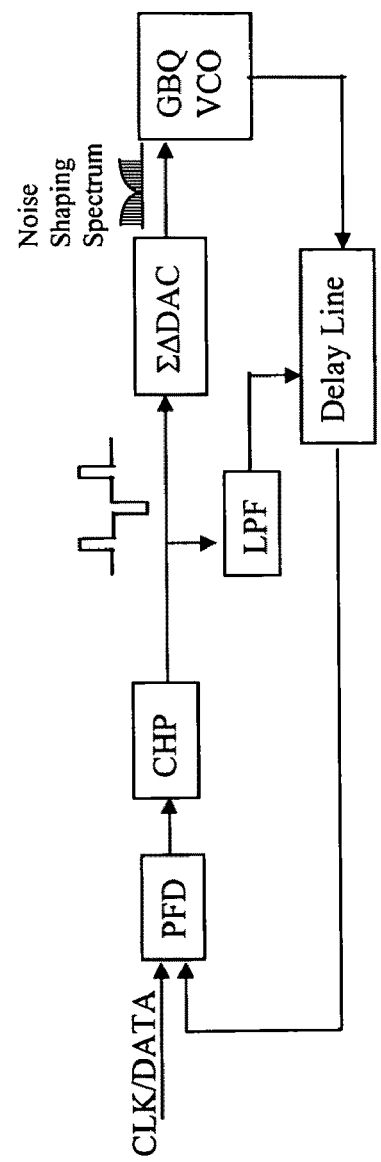
FIG.27A
FIG.27B
FIG.28

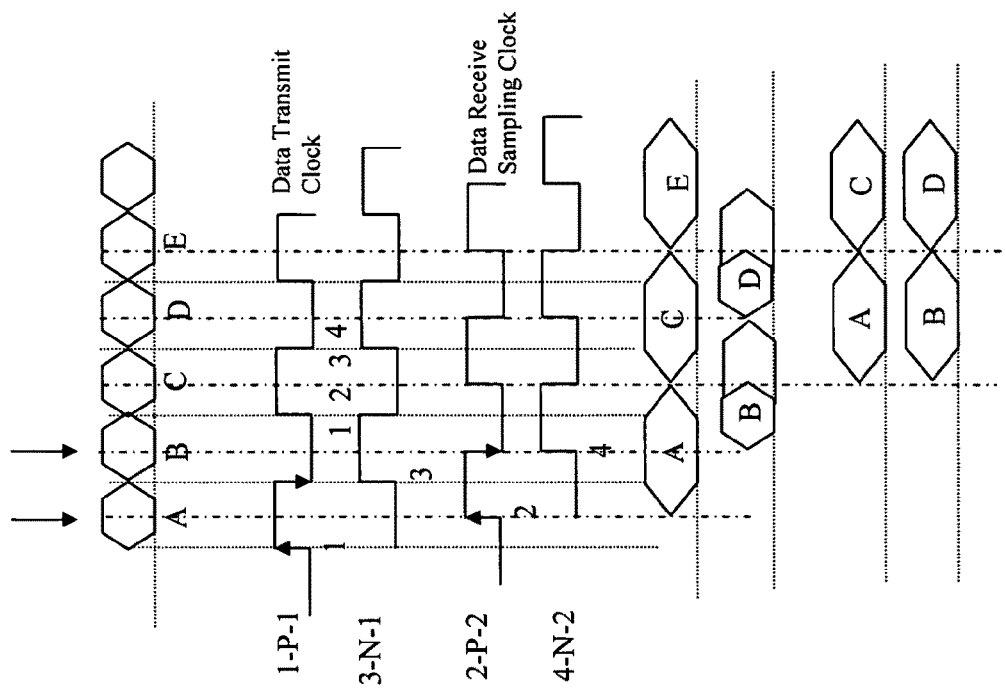
FIG.31B-1
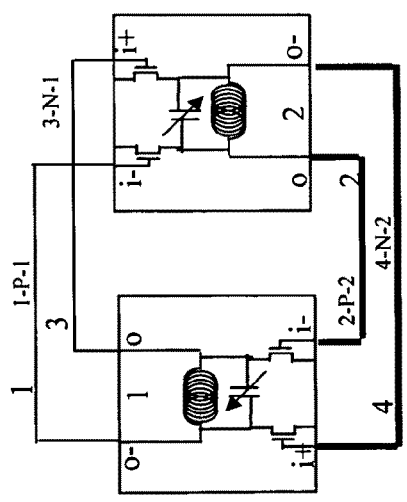
FIG.31A
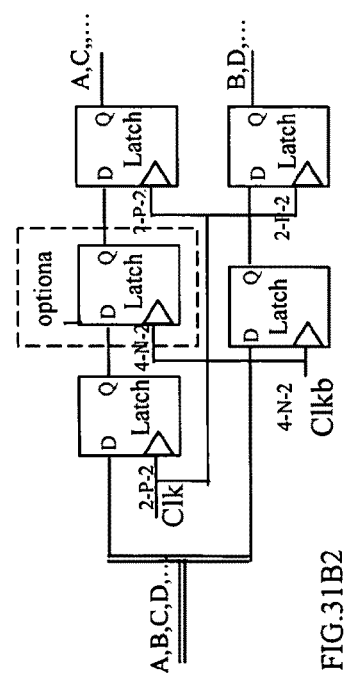
FIG.31B2

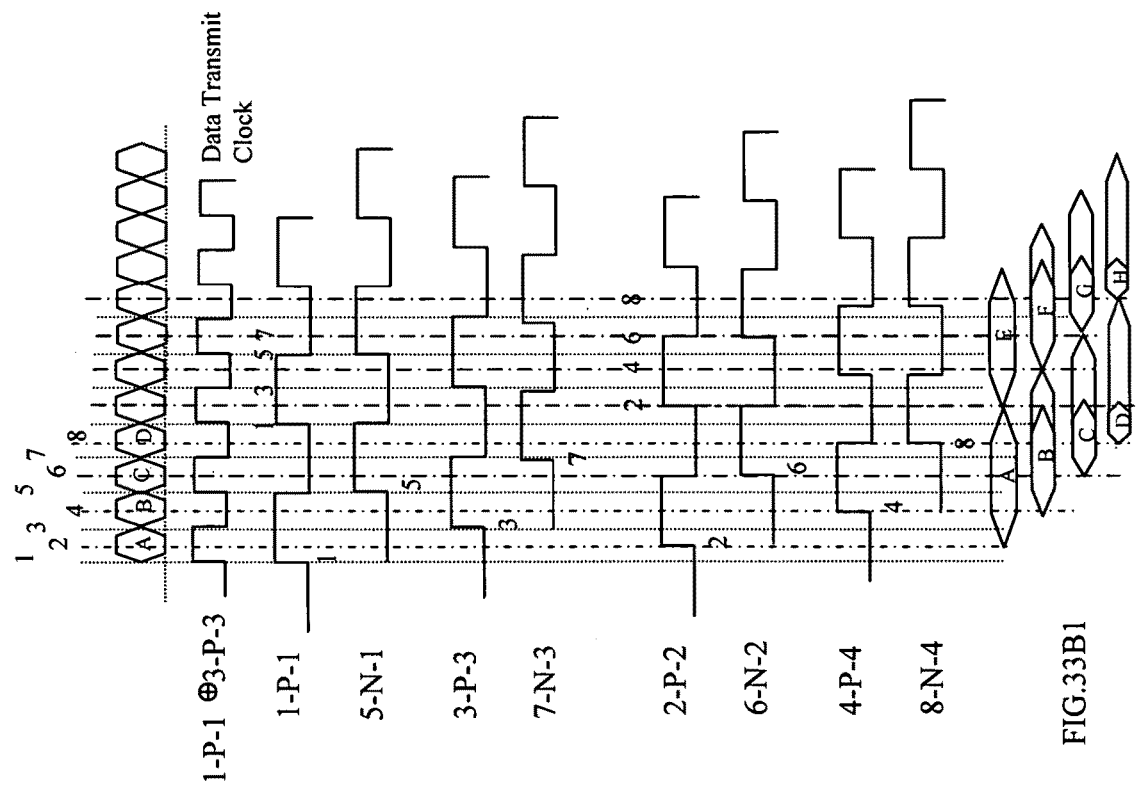
FIG.33B1
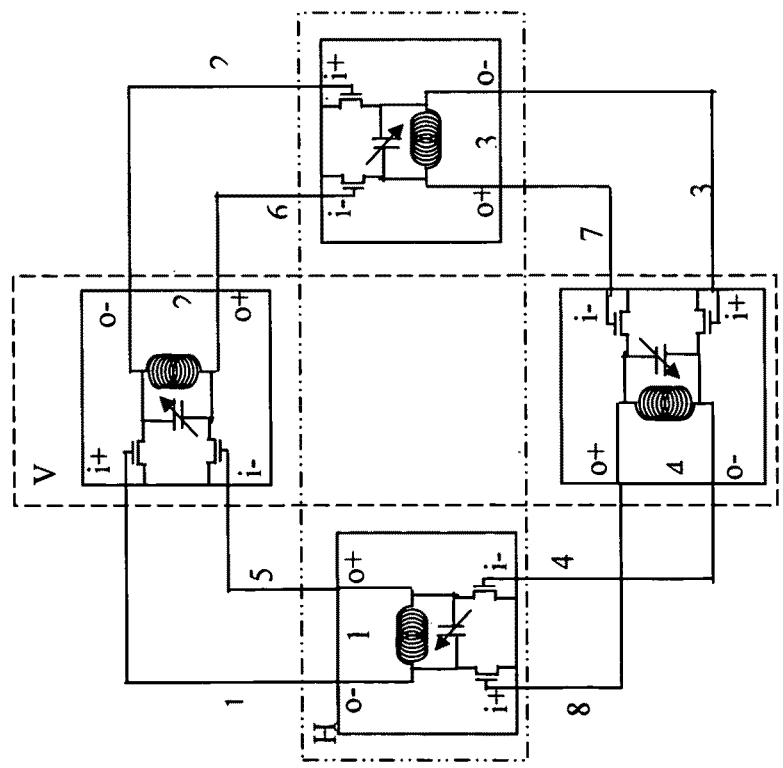
FIG.33A

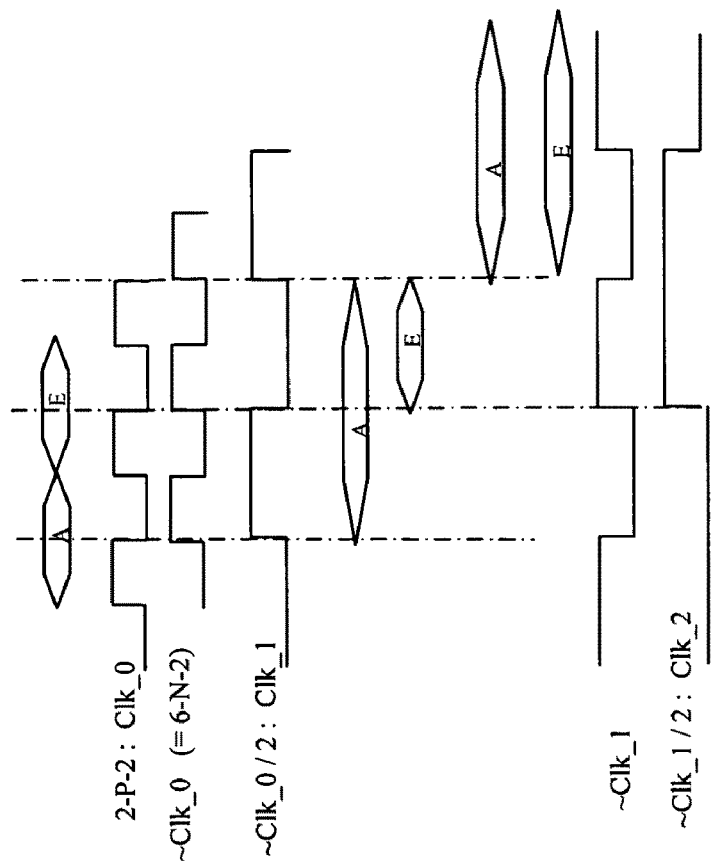
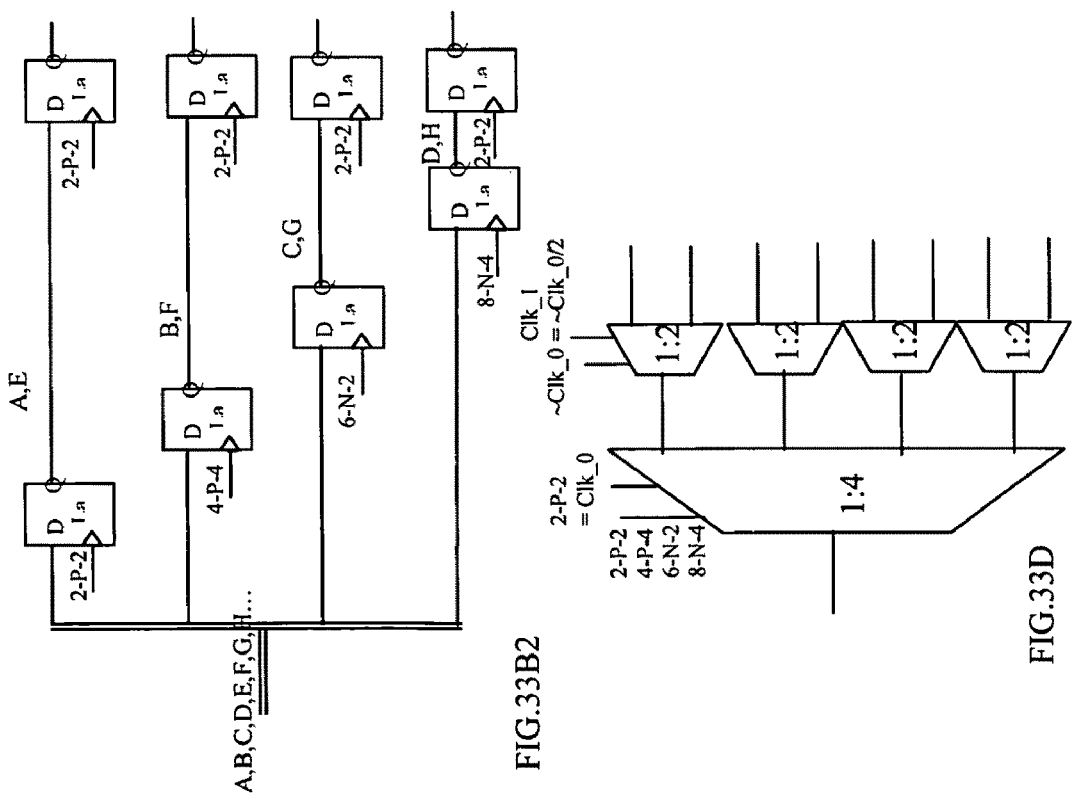
FIG.33C
FIG.33B2
FIG.33D

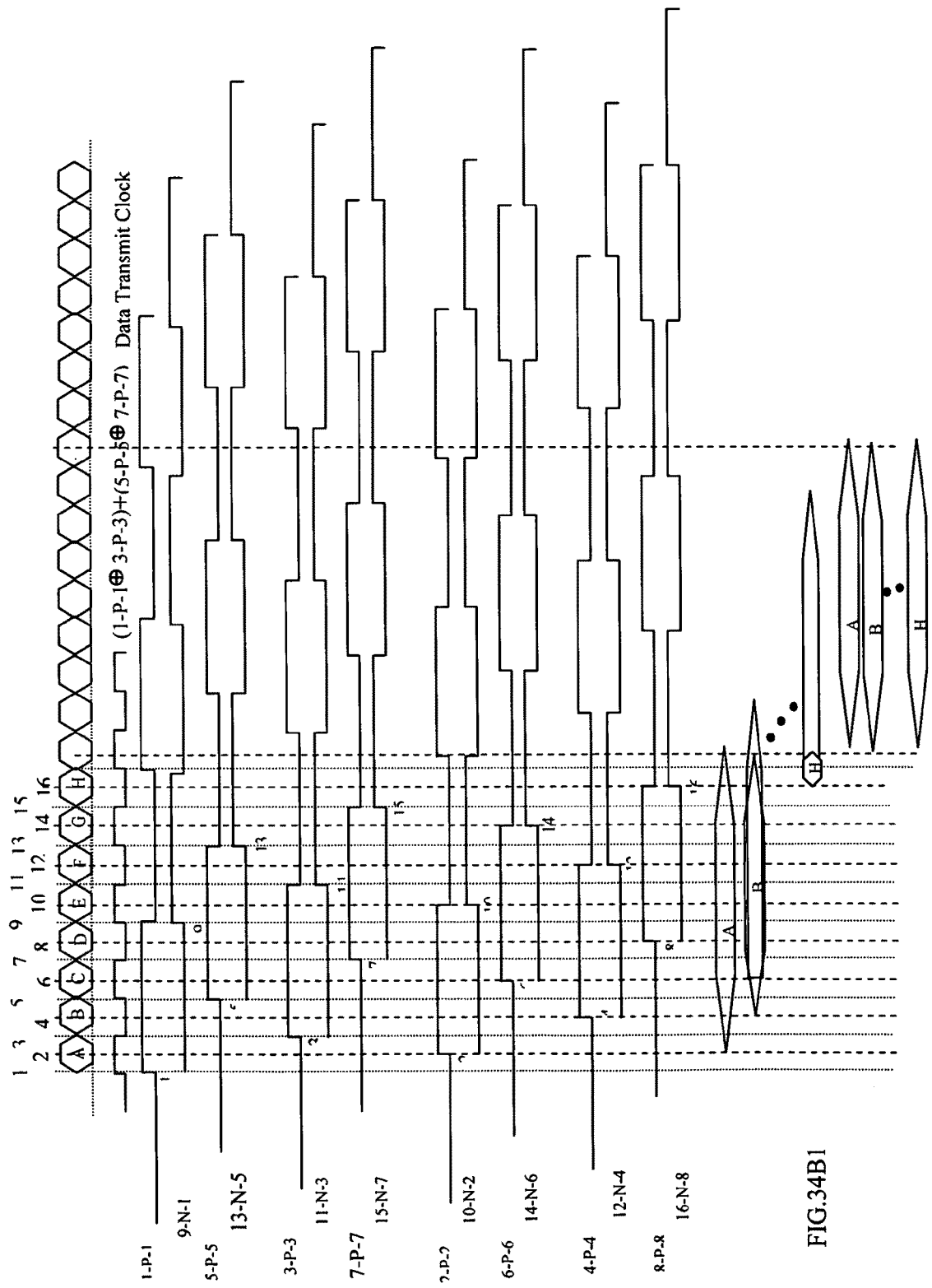
FIG.34B1

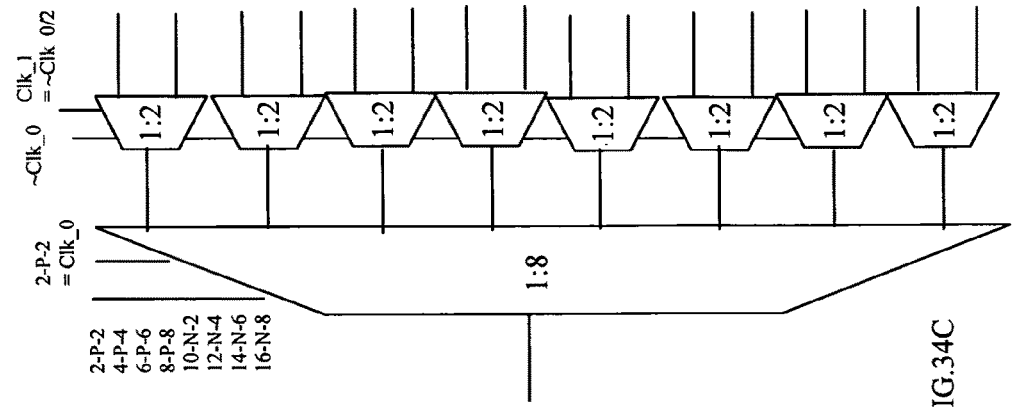
FIG.34C
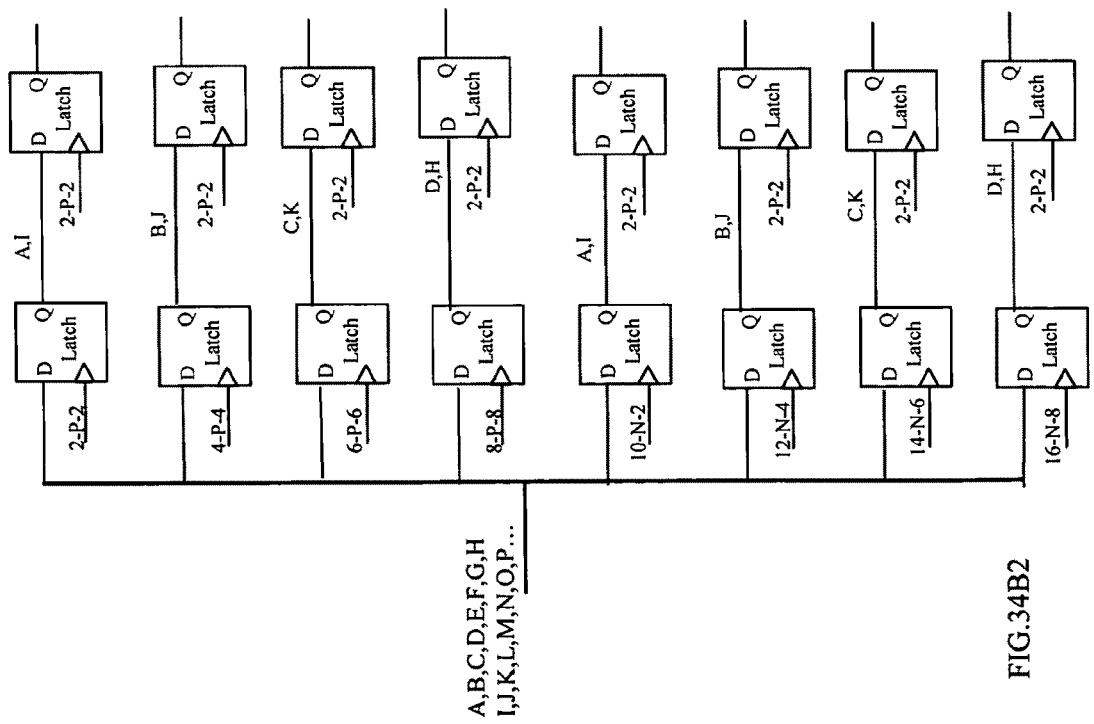
FIG.34B2

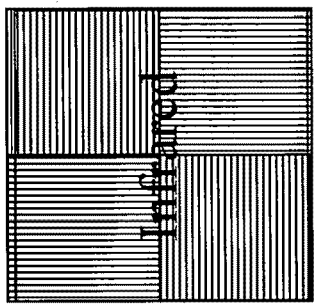
FIG.39C
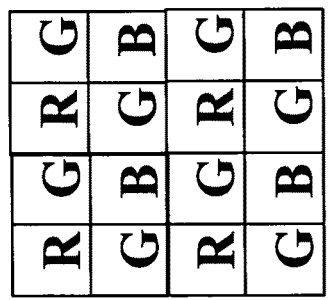
FIG.39B
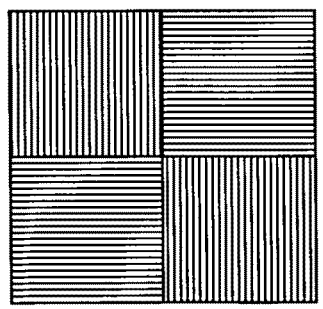
FIG.39A
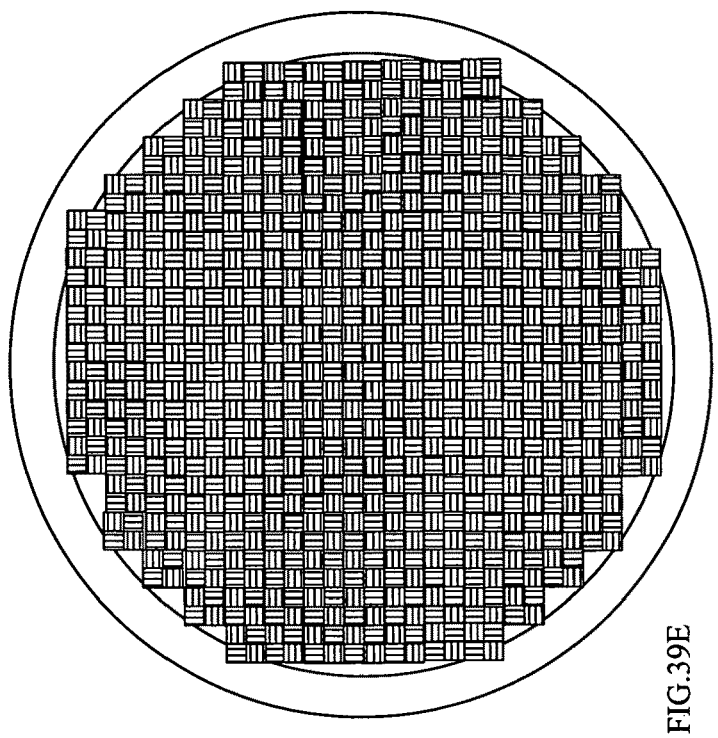
FIG.39E
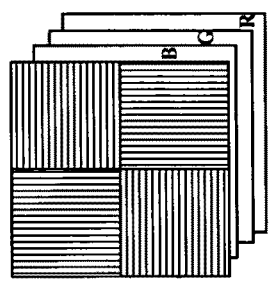
FIG.39D3
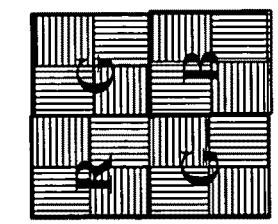
FIG.39D2
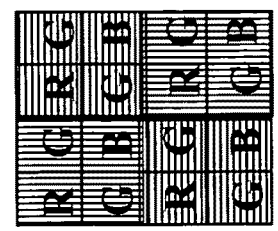
FIG.39D1

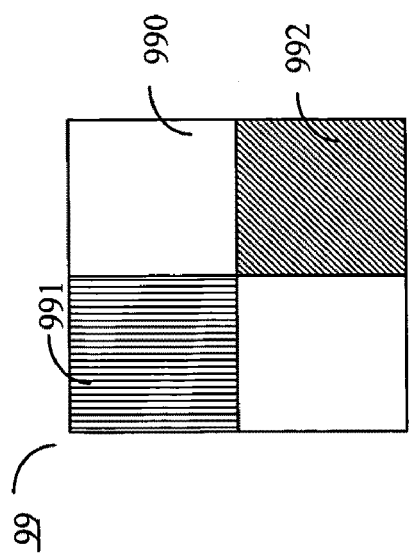
FIG.41A
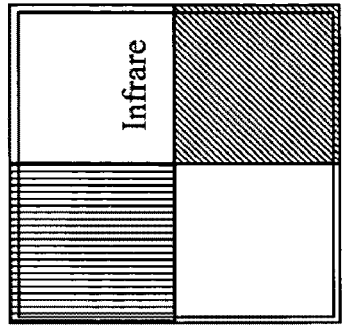
FIG.41B
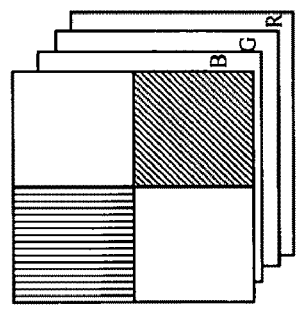
FIG.41C1
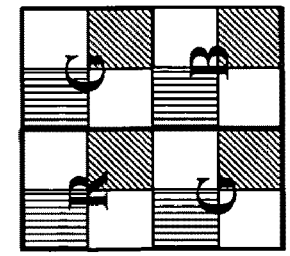
FIG.41C2
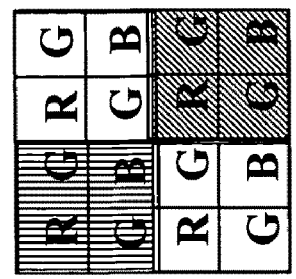
FIG.41C3
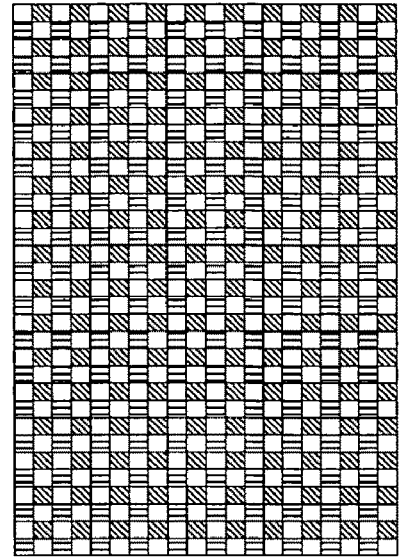
FIG.41D

GREEN TECHNOLOGIES: 7LESS MICROSYSTEMS

This is a Continuation in Part application claims priority of U.S. Pat. No. 5,474,144, U.S. patent application Ser. No. 11/593,271, filed Nov. 6, 2006 now U.S. Pat. No. 7,511,589 and U.S. patent application filed Aug. 22, 2008 which herein incorporated by reference in its entirety.

BACKGROUND

1. Field of Invention

The bankruptcy of the Wall Street is the bankruptcy of American Value system. The lack of the innovative productivity causes the failure of the US. There is no grand innovative infrastructure and system planning. The Harvard University Business & Law school only taught the greedy CEOs and the MIT Science & Engineering schools could not make the leading innovations with the multi-disciplinary education. The US patent office still examines the patent applications piece-by-piece.

Green Technology is an integrated technology system. Green Technology supports the Green Society value structure and Green Society Safety. The grand green technology innovations need four four steps (1) Multi-disciplinary education in Ph.D. level study; (2) the isolate and independent study to strike new approach; (3) Comparing and challenging the existing technology approaches with new approach; (4) Complete and Prototype to prove to be the feasibility solution which is available technology.

The Green Technology has gone through these above four steps. Green Technology is to recycle both the resource and energy. For the resource, it is the "Less" concept. We minimize the wasted resource and find out the substitute way with new design. For the energy, all the residue energy should be recycled in the system instead of discharge and/or dissipation. Furthermore, to have the green safety society, the new and efficient way are adopted for the sensing and feedback.

As shown in FIG. 1, the 7-Less Microsystems is the core technologies of the green technology. The 7-Less Microsystems green technology is to use the re-cycle energy in the system to save the waste of energy to save the earth. The 7-Less Microsystems are constituted of the (1) Xtaless ClkGen, (2) Capless LDVR, (3) Indless SMPS, (4) Resless Current Sensor, (5) the Dioless TRNG, (6) Sawless RF, and (7) Breakless EV.

Even we list the 7Less Microsystems technology, there are other similar technologies. The clockless SMPS is the event drive state machine without clock. The event driven state machine is the self-timing state diagram. It doesn't needs the clock such as pulse width modulation PWM and the pulse frequency modulation PFM does. Therefore, the frequency is independent of current loading. The Brushless motor is very important for the electrical vehicle. Both the Breakless HEV and Brushless Motor are the noncontact frictionless electrical magnetic EM field technology. In the general terms, the EM field and EM energy recycling in the resonating system are the core technology of the Green Technology.

The Xtaless ClkGen is the crystal less clock generator. It is the clock generator has no crystal to be the reference clock. More precisely, the Xtaless ClkGen is the clock generator having no mechanical resonators to be the reference clock. It has only the electronic resonator. The mechanical resonator includes the MEM resonator and crystal. The electronic resonator is the LC resonator. The mechanical resonator has the fatigue problem of the material. The MEM resonator is mechanical resonator having the aging problem.

The Xtaless ClkGen has the unique application of the tire safety. The MEM resonator and the crystal resonator cannot apply in the tire safety requirement. The Xtaless ClkGen serves as the local oscillator to make the wireless communication between the tire and control panel.

The Capless LDVR is the Low Drop Voltage Regulator having no on-board capacitor. The capacitor is small and can be integrated on-chip The Indless SMPS is the Inductor less Switch Mode Power Supply. The inductor is much less that it can be integrated into the package. The Resless Current Sensor is the current sensor for the switch mode power supply SMPS which has no resistor to sense the current. It uses the inductor of the SMPS to measure the current flowing through the inductor. Furthermore, the Green Technology SMPS adopts the clockless event-driven state machine. The state machine is self-adaptive to operate at the optimum condition. The power efficiency will be constant over all the different current loading conditions.

The Dioless TRNG is the True Random Number Generator having no Avalanche diode to generate the true random number. The Sawless RF is the RF circuit has no external on-board Saw filter.

For the transportation, the most important green technology is the momentum energy of vehicle and the electric energy in battery can be recycled. Due to the vehicle not having energy conversion mechanism, the vehicle has poor energy efficiency. The Brakeless EV is the Electric Vehicle having no energy loss in the brake to stop process. All the vehicle momentum energy is recycled to be the battery charge storage. The dynamic balanced battery is the essential technology for the high power efficiency and high density and high capacity battery. The dynamic balanced battery makes the vehicle momentum energy is easily and efficient conversion to the battery energy through the brakeless HEV breaking system.

For the portable media, the green technology is essential to extend the battery life. The power amplifier consumes 75% of the energy of the wireless portal media. The power amplifier is actually an LC resonator. The power amplifier having low efficiency is due to the RF energy not recycling in the LC resonator.

The high efficient power amplifier has another important application for the plasma light. The high efficient power amplifier has the power efficiency being independent of the load that the plasma light can be dimmer. The dimmer plasma light can be used in home to save the electrical energy of home.

To convert the energy from one form to another form, from one level to another lever, all the conversion needs to be power efficient. The residue energy needs to be recycling in the system for the next cycle of energy conversion instead of dissipation and waste. All the system operation needs to be inspected in details.

The on-chip LC resonator is one example. LC resonator is the energy recycling in the electronic system. Before, the LC resonator is free running without any control. The Q of the LC resonator is less than the ¼ of the Q of the on-chip inductor. In other words, the on-chip LC resonator has Q<4. However, this rule is only applied to the passive filter. For the active resonator, the Q for the active resonator should be infinitive. The LC having no active components is referred as the filter. The LC having the active components is referred as the resonator. For the resonator, the Q is infinity. However, before, there is no circuit proving it. Just like the Einstein's Relativity, if there is no experiment to prove it, nobody admits it. Now, with the Green Technology, we makes the innovation in circuit to have the Q>100,000. We prove the active LC resonator having the Q to be infinity. It is referred Gain-Boost-Q resonator technology. The green technology Gain-Boost-Q GBQ resonator technology is a platform which can apply to crystal resonator, too.

Furthermore, we apply this GBQ technology to versatile applications. For the wireless communication, the Sawless LNA is the most important GBQ application. With the high-Q local oscillator made of the Gain-Boost-Q LC, we can accurately mix-down and mix-up to make the modulation of the RF signals to perform the analog signal process. The direct conversion and direct modulation technologies becomes the most important Green Technology.

For the fiber optics and Ethernet, the high-Q GBQ LC ring oscillator can work as multi-phase clock generator to serve as more than 80 Gb/s clock data recovery CDR. the Gain-Boost-Q high-Q makes the phase relation being exact that the CDR doesn't need the blindly random multiple samples to recover the data with the interpolation of multi-phase clock signal. It saves a lot of unnecessary complexity of the circuit design and reduces the bit error rate BER a lot.

Having the diodeless true random number generator TRNG to replace the pseudo random number generator PRNG, the fractional PLL FPLL is spurfree PLL.

The scattering of the RF and optical signal makes the transmitted signal blurred. The green technology polarized antenna and the polarized camera can filter out the scattering signal. The wide dynamic range polarized color pixel design is the best surveillance camera.

Before the surveillance camera uses the wide dynamic range to adapt the contrast of the light intensity. However, there is the scattering light that the surveillance camera fails to detect. To filter out the scattering light, the polarized Camerachip is developed. Furthermore, we make the innovation of the polarized camera chip to have the best commercial chip.

All the green technology of the high efficient wireless communication, polarized camera, etc can be integrated to be the green safety system.

2. Description of Prior Art

Green Technology is still a dream. So far, the Green Technology is not clearly defined yet. The US and the world even fail to recognize and formalize the problems of Green Technology. The US education system only produces the greedy CEOs causing the economic bankruptcy of Wall Street to induce the world disasters. How can the greedy CEOs to recognize the Green Technology? So far, the green technology is only confined to the solar energy and the other substitute energy. In other words, the people still fails to recognize the problem technology of the Green Technology. It is just the substitute energy. It is not green technology. There is no system concept and multi-discipline of the green technology. All the technology is divided to piece by piece. There is no integrated view for all the green technology. Green Technology is not to look for new substitute energy. Before, to most people, the green technology is only to look for the new substitute energy.

In the reality, each cell of the HEV battery has the different charge capacity. There is no dynamic balanced battery that the hybrid electrical vehicle HEV is not power efficient. The static balanced battery can be fully charged. However, the available amount of the charge is still the same as the minimum charge of battery.

Before, all the system design is the board design. It is bulky and consuming a lot of power. The system-on-chip is only to have the glue logic to shrink to be one chip. The mixed-signal design is to have the analog circuit to shrink to the single chip, too. However, the crystal of the clock generator, the inductor of the SMPS, the capacitor of the LDVR, the avalanche diode of the TRNG, the saw filter for the RF, etc still cannot be integrated into the single chip.

The other integrated circuit only considers the variations of the process, voltage, temperature PVT. For the clock integrated circuit, it needs to consider process, voltage, temperature, noise, aging, humidity PVTNAH. The humidity problem causes the clock chip to use the ceramic package instead of the plastic package. The clock chip using the cheap plastic package has the 15% frequency variance between the humidity variance of Florida and Las Vegas. Both the competitors of the Silicon Lab and Mobius Microsystems cannot solve the Moisture Sensitivity Level MSL problems that they have to use the high cost ceramic package. The clockchip is cheap that it has to use the non-hermetic plastic packaging. The ceramic package costs too much for the clockchip that it makes the GBQ-LC Xtaless Clockchip cannot compete with the Xtal Clockchip. Furthermore, the Xtalless clockchip can be the IP to integrate with the other IPs in a system on chip SOC. The vender doesn't want to use the high cost ceramic package due to the Xtalless clockchip IP.

Since there is no Gain-Boost-Q high Q LC oscillator, for the Sawless Radiochip, they use MEM or digital filter to substitute for the SAW filter. Both of them are not realistic implementations. The digital filter is bulky design and doesn't have such high speed to handle the RF front signal.

There is no Gain-Boost-Q high Q LC oscillator that there is no Xtaless clockgen. There is no xtaless clockgen; there is no tire safety.

There is no Gain-Boost-Q high Q LC oscillator that there is no high-Q VCO. There is no high-Q VCO, and then there is no spurfree and jitterless PLL. There is no spurfree PLL, and then there is no high Q local oscillator. There is no high Q local oscillator; a lot of bandwidth is wasted. There is no jitterless PLL, for the high-speed clock data recovery CDR has the difficulty to sample the data at the correct time. It puts the bottleneck for the fiber optics communication.

There is no high Q LC resonator that the Sawless LNA has the poor performance. The saw filter for the radio chip is the big cost. It is due to the on-chip filter doesn't have the good quality. Without the high Q gain-boost-Q GBQ LC resonator, the radiochip has to use the on-board saw filter. It increases the form factor of the board. It increases the cost of the system and board.

Before, there is no true random number generator TRNG that there is spur in the FPLL and the local oscillator. It wastes the bandwidth.

The power amplifier and the power management have the similar circuit. The power amplifier is in the high frequency RF field. The power management is in the low frequency power field. There are the switching loss problems in power management. Therefore, the power management operates at the low frequency. For the low frequency, the power management has the power efficiency to be more than 90%. The power amplifier has the power efficiency to be less than 12%. There is so much difference in power efficiency. However, the RF people take it for granted. There is no cross discussion between the PA of RF design and PMU of the power design to find out what is wrong. No one use the PMU discipline to improve the power efficiency of the PA.

There is no power efficient power amplifier, and then there is no dimmer plasma light. There is no dimmer plasma light, and then there is no home plasma light. The plasma light has the light efficiency more than 90%. The conventional light bulb has the light efficiency 10%. Therefore, a lot of energy is wasted.

Furthermore, there is no power efficient power amplifier; the fourth generation cellular phone cannot be marketed. The large battery charges 2 hours and uses only e hours. So, the fourth generation cellular phone and wireless OFDM system still in holding.

Furthermore, the SMPS design all uses the clock-driven design. The implicit assumption of the pulse width modulation PWM and pulse frequency modulation PFM is clock driven. The PWM is to have the clock frequency to be fixed and the pulse width varying. On the contrary, the PFM is to have the clock frequency varying and the switch-on time fixed to be constant. Both of PWM and PFM are clock driven. For the clock driven, there is one resonating frequency. As the loading current varies, the optimum operating resonant frequency should vary, too. However, the clock driven SMPS has the frequency to be fixed. Therefore, the power efficiency of the clock-driven SMPS will reduce as the current load varies.

There is no polarized color camera chip. It fails to have the best surveillance camera. Before the surveillance camera uses only the wide dynamic range pixel. There is no polarized color wide dynamic range pixel design for the surveillance camera. It fails to detect the disaster scene in the smoky fire environment.

OBJECTS AND ADVANTAGES

The 7Less Microsystems is the core technologies of the green technologies for the next generation green society. The green technology event-driven clockless switch mode power supply SMPS has the highest power efficiency which is independent of the current loading. The green technology boost converter has the recycling capacitor to eliminate the discharging dissipation of the residue boosting energy in each pumping cycle. The green technology dynamic balanced charging battery can operate at the HEV braking and driving conditions to have the maximum battery capacity, safety and power conversion efficiency. The green technology Gain-Boost-Q resonator platform can boost up the quality factor Q of both on-chip LC resonator and the crystal resonator. The frequency and temperature orthogonal tuning architecture make the high performance clock generator. The green technology gain-boost-Q LC ring resonator generates the accurate multi-phase clocks for the ultra-high frequency CDR. The Sawless low noise amplifier is the application of the gain-boost-Q LC resonator. The green technology polarized color Camerachip is the best performance surveillance camera. The green technology green safety system makes the voice and video image through the polarized color camera and communication network to provide the home security for the green society.

DRAWING FIGURES

FIG. 3 (A) is the series charge of the static balanced EV battery; (B1) is the parallel charge of the dynamic balanced EV battery; (B2) is the series operation of the dynamic balanced EV battery.

FIG. 5 (A) is the comparison of the performance of the current load-dependent clock-driven SMPS (switch mode power supply) and current load-independent event-driven SMPS (switch mode power supply); (B) is the generic structure of the boost SMPS (switch mode power supply) and N type PA (power amplifier); (C) is the generic structure of the buck SMPS (switch mode power supply) and P type PA (power amplifier).

Figure 6:
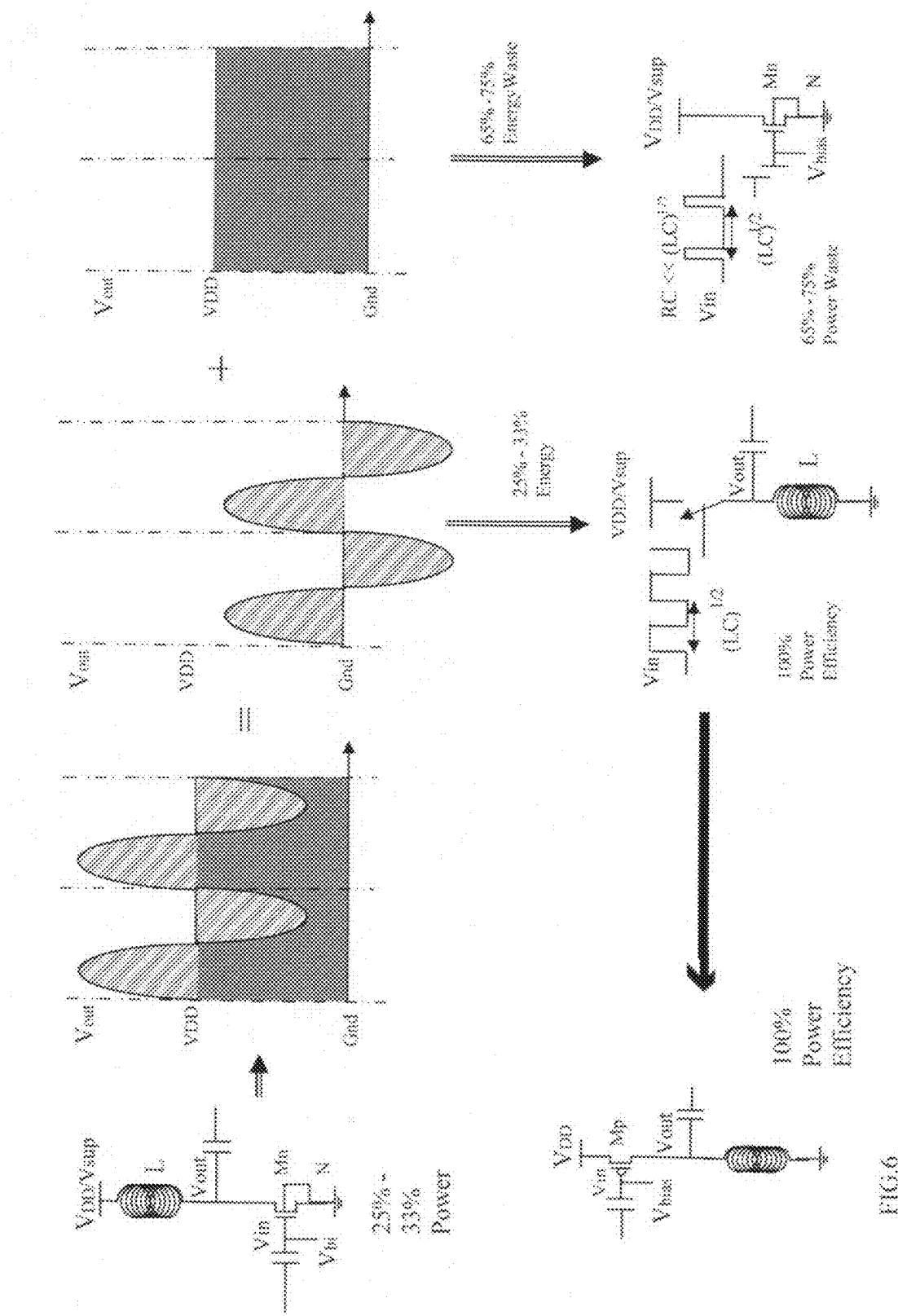

FIG. 6 is the transformation and comparison of the power efficiency of the boost N type power amplifier PA and the buck P type power amplifier PA.

Figure 1:
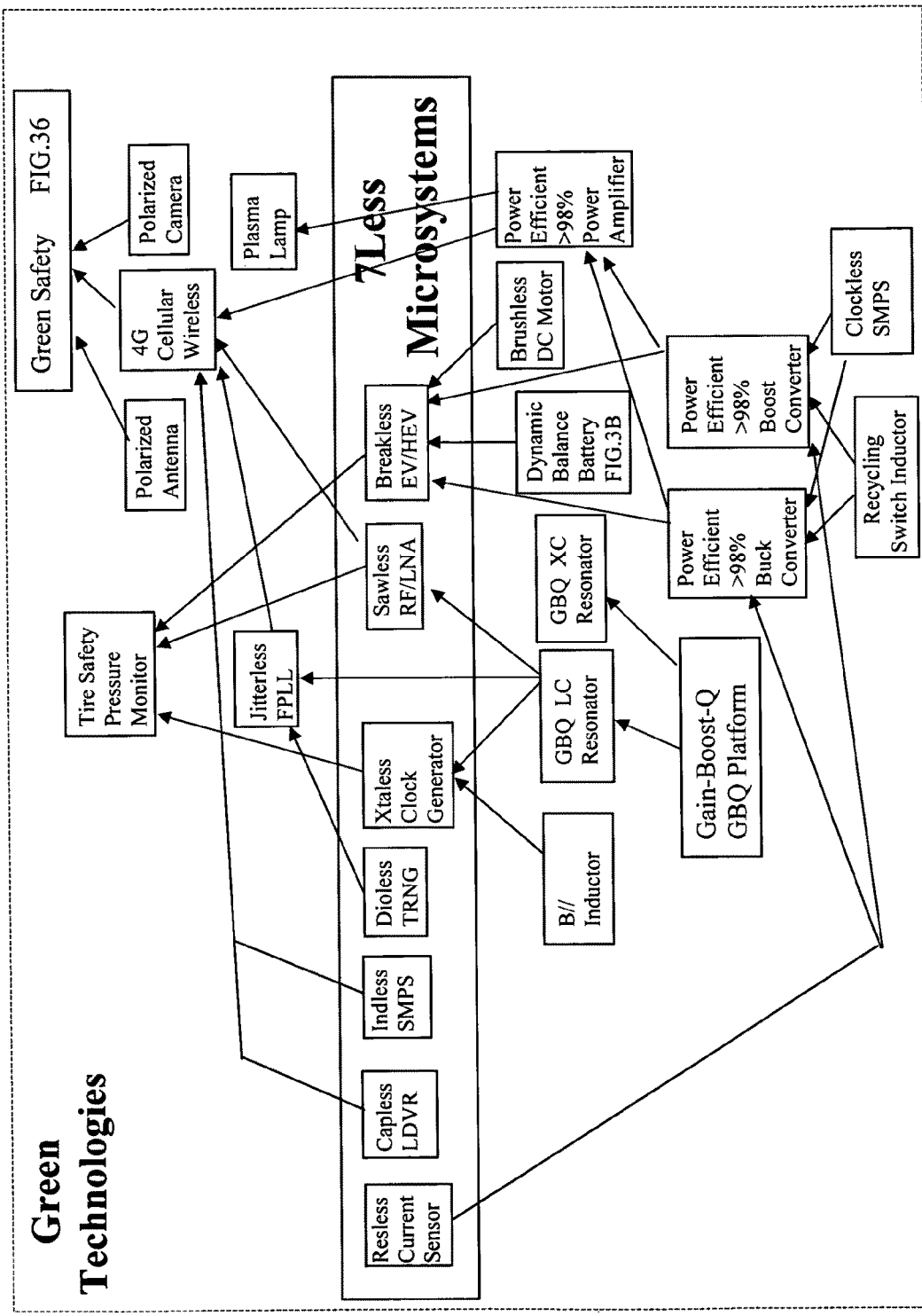
FIG. 1 is the system view of the 7Less Microsystems in the next generation green technology. The arrows indicate the derivative relations.

FIG. 7 (A1) is the conventional idealized boost converter SMPS (switch mode power supply); (A2) is the operational energy and voltage curves of the conventional idealized boost converter SMPS (switch mode power supply) as shown in FIG. 7A1; (B1) is the real boost converter SMPS (switch mode power supply); (B2) is the operational energy and voltage curves of the real boost converter SMPS (switch mode power supply) as shown in FIG. 7B1.

FIG. 8 (A) is the voltage modulation of the buck converter SMPS (switch mode power supply); (B) is the current modulation of the boost converter SMPS (switch mode power supply); (C) is the inductor current energy and discharging NMOS switch-on time for the boost converter SMPS (switch mode power supply).

FIG. 9 (A) is the resistor less current sensor for the inductor current of buck converter SMPS (switch mode power supply); (B) is the resistor less current sensor for the inductor current of boost converter SMPS (switch mode power supply); (C) is the resistor less current sensor for the inductor current of recycling boost converter SMPS (switch mode power supply).

FIG. 10 (A) is the Schottky diode in the boost converter SMPS (switch mode power supply); (B1) is the PMOS switch for the equivalent Schottky diode; (B2) is the PMOS switch for the equivalent Schottky diode having the recycling drive; (C1) is the output voltage controlled switch for the SIMO boost converter; (C2) is the output voltage controlled switch for the SIMO boost converter having the recycling drive.

FIG. 11 (A1) is the conventional boost converter SMSP (switch mode power supply) with the Schottky Diode; (A2) is the energy diagram of the boost converter SMSP as shown in FIG. 11A1; (B1) is the recycling boost converter SMSP with MOS switch; (B2) is the energy diagram of the recycling boost converter SMSP as shown in FIG. 11B1.

FIG. 12 (A1) is the boost converter SMSP with the switch MOS; (A2) is the operation diagram of the real boost SMSP with the switch MOS as shown in FIG. 12A1; (B1) is the boost converter SMSP with the switch MOS and recycling LC resonator tank; (B2) is the operation diagram of the boost SMSP with the switch MOS and recycling LC resonator tank as shown in FIG. 12B1; (C1) is the boost converter SMSP with the switch MOS, recycling LC resonator and the multi-level voltage energy reuse mechanism; (C2) is the operation diagram of the boost converter SMSP with the switch MOS, recycling LC mechanism and the multi-level voltage energy reuse mechanism as shown in FIG. 12C1; (D) is the alternative design of the boost converter SMSP with the switch MOS and recycling LC resonator; (E) is the single input multi-output SIMO boost/buck converter SMSP; (F1) the boost converter SMSP with the transmitting switch PMOS, recycling LC resonator, the multi-level voltage energy reuse mechanism and the resonator drive; (F2) the boost converter SMSP with the transmitting switch NMOS, recycling LC resonator, the multi-level voltage energy reuse mechanism and the resonator drive.

FIG. 13 is the operational analysis of the recycling boost converter SMSP with the switch MOS and recycling LC resonator mechanism; (A) is the initial condition of the recycling operation of the recycling boost converter SMSP, the reverse inductor current is zero (IZS); (B) the switch MOS turns on to build up the forward inductor current; (C) turning off the NMOS switch and the boosting node is charged up; (D) the driver in the high voltage zone switches on the PMOS switch to transfer the boosted energy to the output, the high voltage switching energy flows to low voltage inductor to recycle; (E) the boosting node residue energy is recycled to flow back to the store capacitor and the boosting node is discharged with the LC resonator mechanism; (F) as the boosting node voltage is zero (VZS), the switch NMOS is turned on and held on until the booster converter comes back to the FIG. 13B state due to the LC resonator mechanism.

Figure 14:
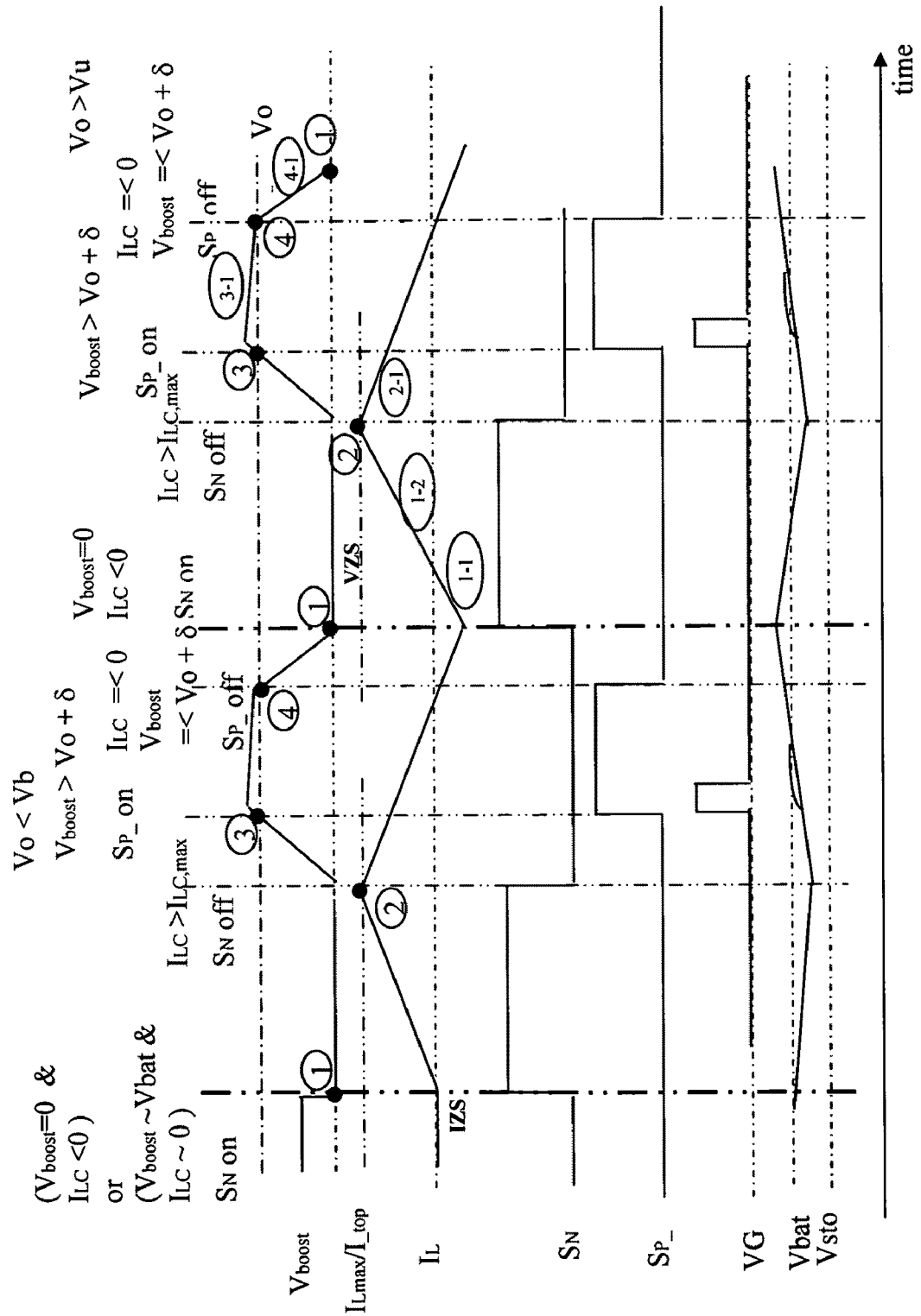

FIG. 14 is the waveform of the operational analysis of the recycling boost SMSP with the switch MOS and recycling LC resonator mechanism.

FIG. 15 (A) is the state diagram of the operational analysis of the recycling boost SMSP with the switch MOS and recycling LC mechanism; (B) is the resonator curves of the Vboost node and the Vstor node.

FIG. 16 is the applications of the principle of the recycling boost converter SMSP to the conventional boost converter SMSP to enhance the power efficiency of the recycling boost converter SMSP; (A) is the modified boost converter SMSP having the clock-driven current mode controller; (B) is the modified boost converter SMSP having the current mode controller with the recycling drive; (C) is the modified boost converter SMSP having the event-driven current mode controller.

FIG. 17 (A) is the Intel's VM type power specification for the PMU having both the LDVR and SMPS; (B) is the window type SMPS converter; (C) is the waveform for the buck converter type SMPS; (D) is the hierarchical state diagram for the buck converter type SMPS with the recycling driver.

Figure 18:
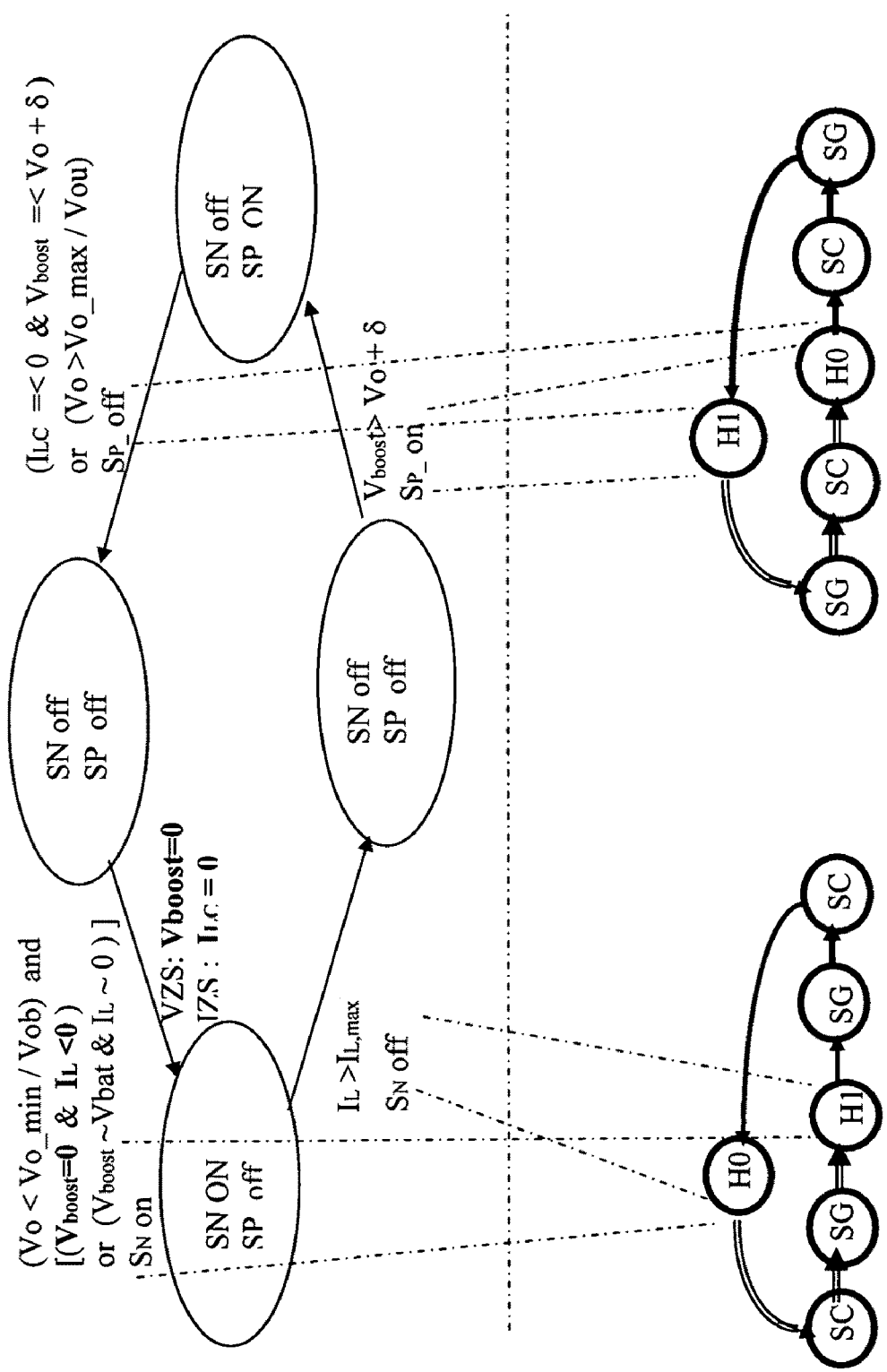

FIG. 18 is the hierarchical state diagram for the boost converter type SMPS with the recycling driver.

FIG. 19 is the operation of the recycling drive from 1 to 0 state.

FIG. 20 is the operation of the recycling drive from 0 to 1 state.

Figure 21:
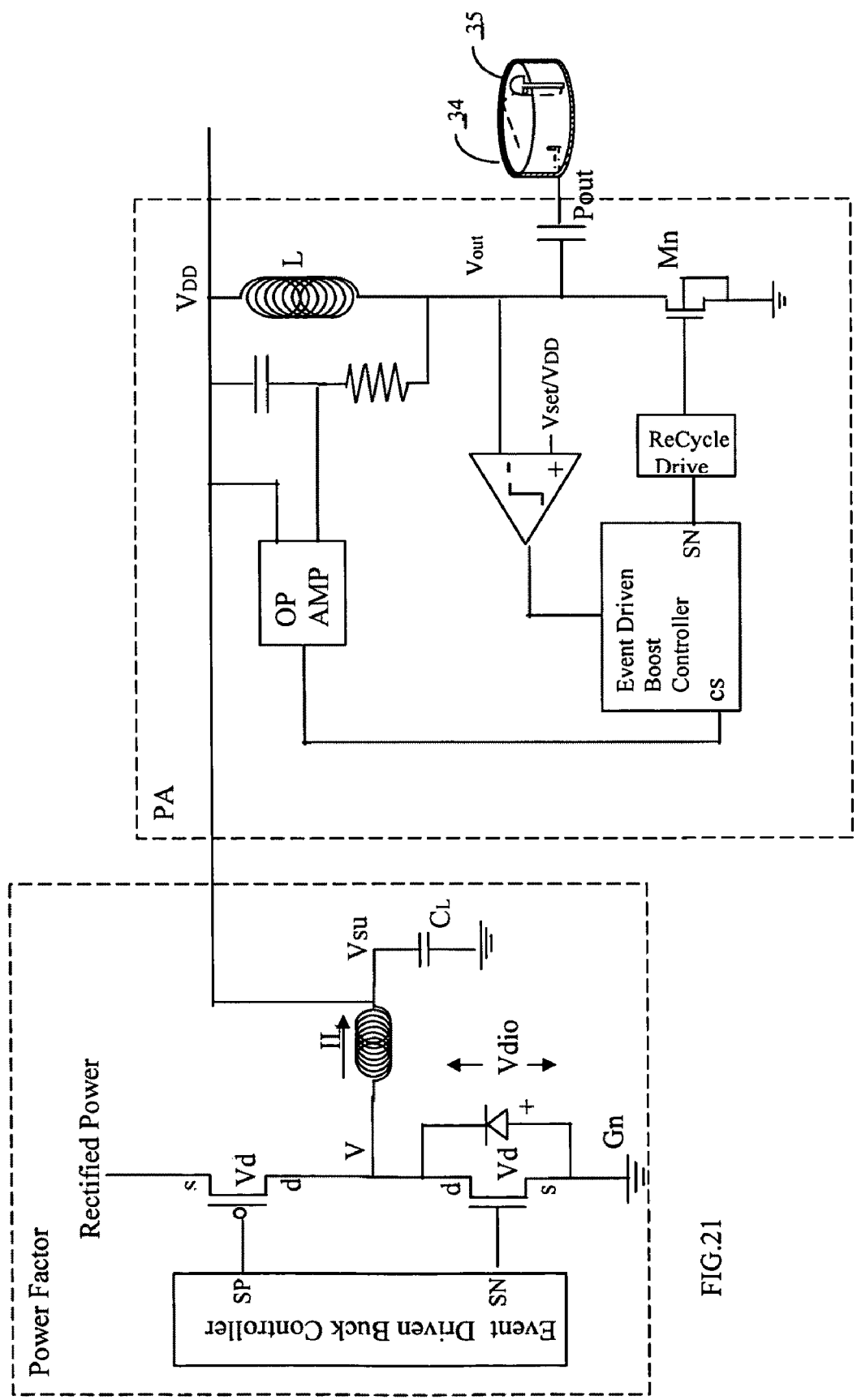

FIG. 21 is the application of the high power efficiency boost converter technologies with the Load Adaptive Synchronization Input to the power amplifier for the plasma light.

Figure 22:
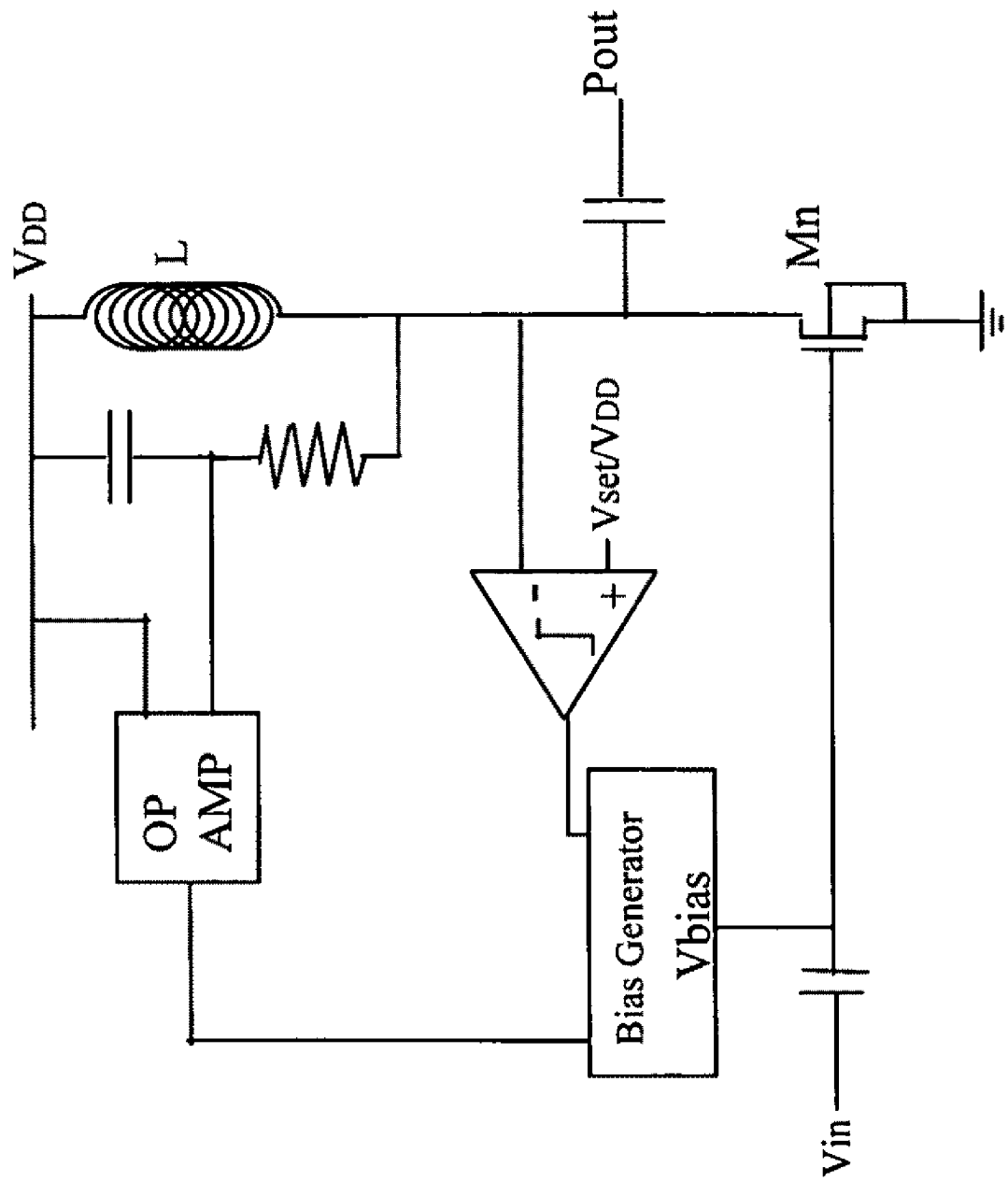

FIG. 22 is the application of the high power efficiency boost converter technologies with N-type Peaking PA of the Peaking Class C with Power Tracking to the power amplifier.

FIG. 23 (A1) is the Xtaless Clock generator having PLL with GBQ-LC resonator as the reference resonator; (A2) is the Xtaless Clock generator having direct frequency synthesis with GBQ-LC resonator as the reference resonator; (B1) is the Clock generator having PLL with GBQ-XC resonator as the reference resonator; (B2) is the Clock generator having direct frequency synthesis with GBQ-XC resonator as the reference resonator; (C) is the detailed architecture of the Clock generator having direct frequency synthesis with GBQ-XC resonator as the reference resonator.

Figure 24:
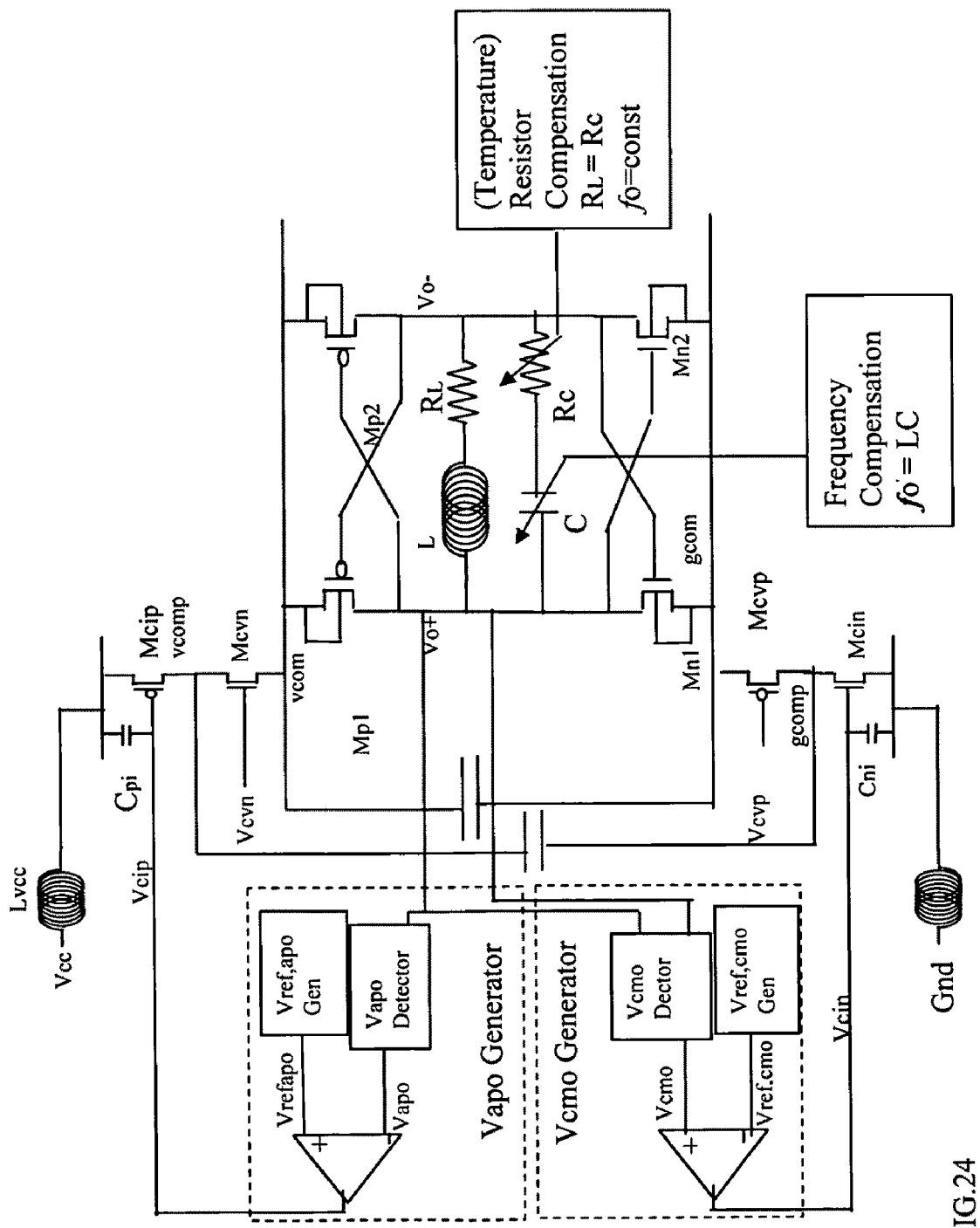

FIG. 24 is the GBQ-LC reference resonator having the frequency selectivity of the tuning capacitance and the temperature compensation of the tuning resistance separately.

FIG. 25 is the magnetic confinement inductor for the GBQ-LC reference resonator; (A) is the illustrative diagram to show magnetic confinement inductor having the magnetic field line B// confined in a plane being parallel to the chip surface; (B1) is the coil type confinement of the magnetic confinement inductor; (B2) is the cross section view of the coil type confinement inductor; (C1) is the core type confinement of the magnetic confinement inductor; (C2) is the cross section view of the core type confinement inductor.

Figure 26:
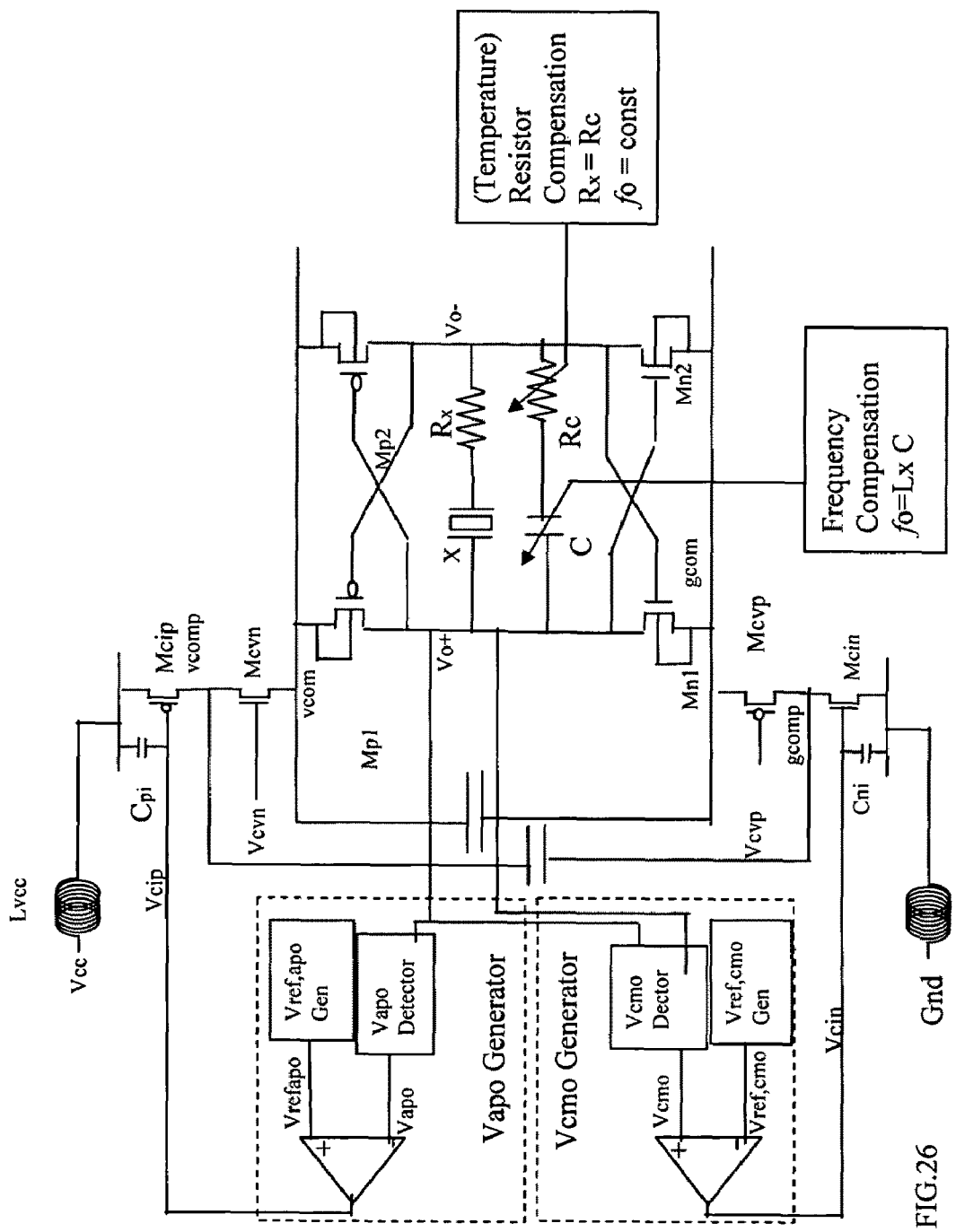

FIG. 26 is the GBQ-XC reference resonator having the frequency selectivity of the tuning capacitance and the temperature compensation of the tuning resistance separately.

FIG. 27 is the core mechanism of the spurfree and jitterless PLL; (A) is the mutual compensate mechanism of the ΣΔ DAC and GBQ VCO; (B) is one of the implementation of the ΣΔ DAC for the spurfree and jitterless PLL.

FIG. 28 is the spurfree and jitterless PLL having the spurfree and jitterless core mechanism.

Figure 29:
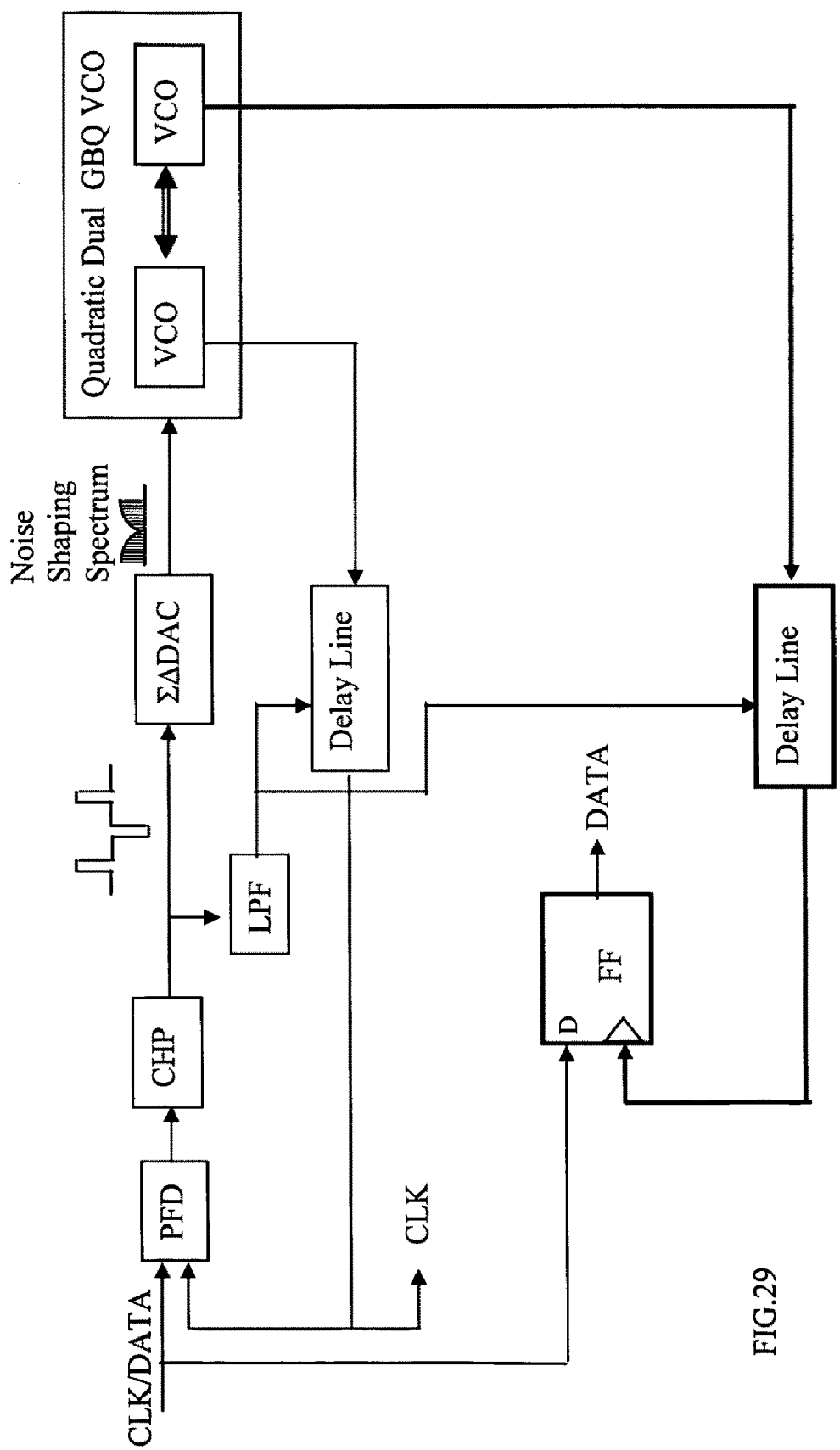

FIG. 29 is the clock data recovery CDR with the spurfree and jitterless PLL having the quadratic GBQ-LC.

Figure 30:
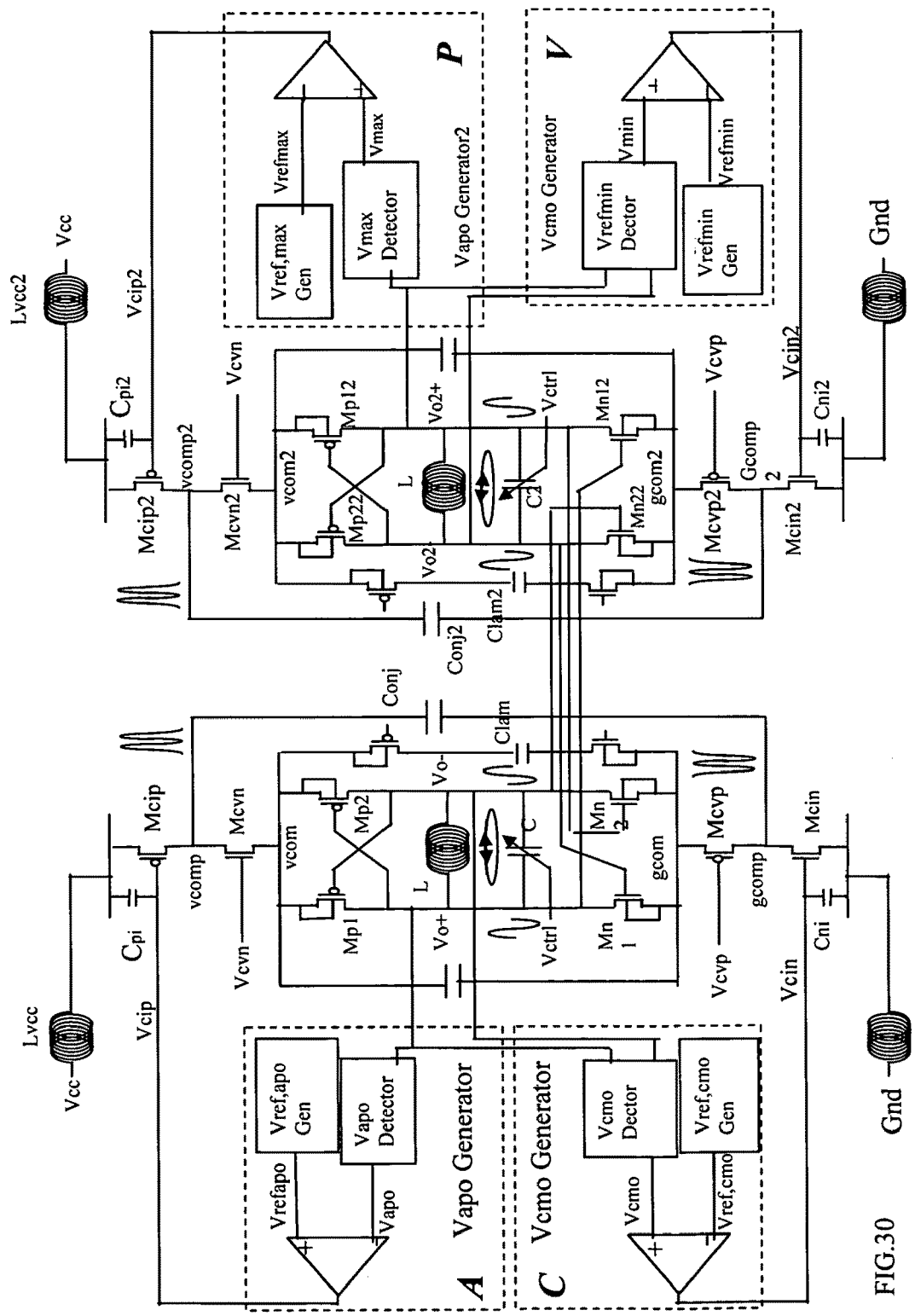

FIG. 30 is the circuit of the quadratic GBQ-LC.

FIG. 31 (A) is the schematics for the Two-Yi GBQ-LC resonator; (B1) is the waveform of the first stage DeMux-2 of the CDR with the Two-Yi GBQ-LC resonator clocking signals; (B2) is the 4 latch of the DeMux-2 of the CDR with the Two-Yi GBQ-LC resonator clocking signals; (C) is the waveform of the second stage DeMux-2; (D) is the schematics of the two stages CDR with the Two-Yi GBQ-LC resonator.

Figure 32:
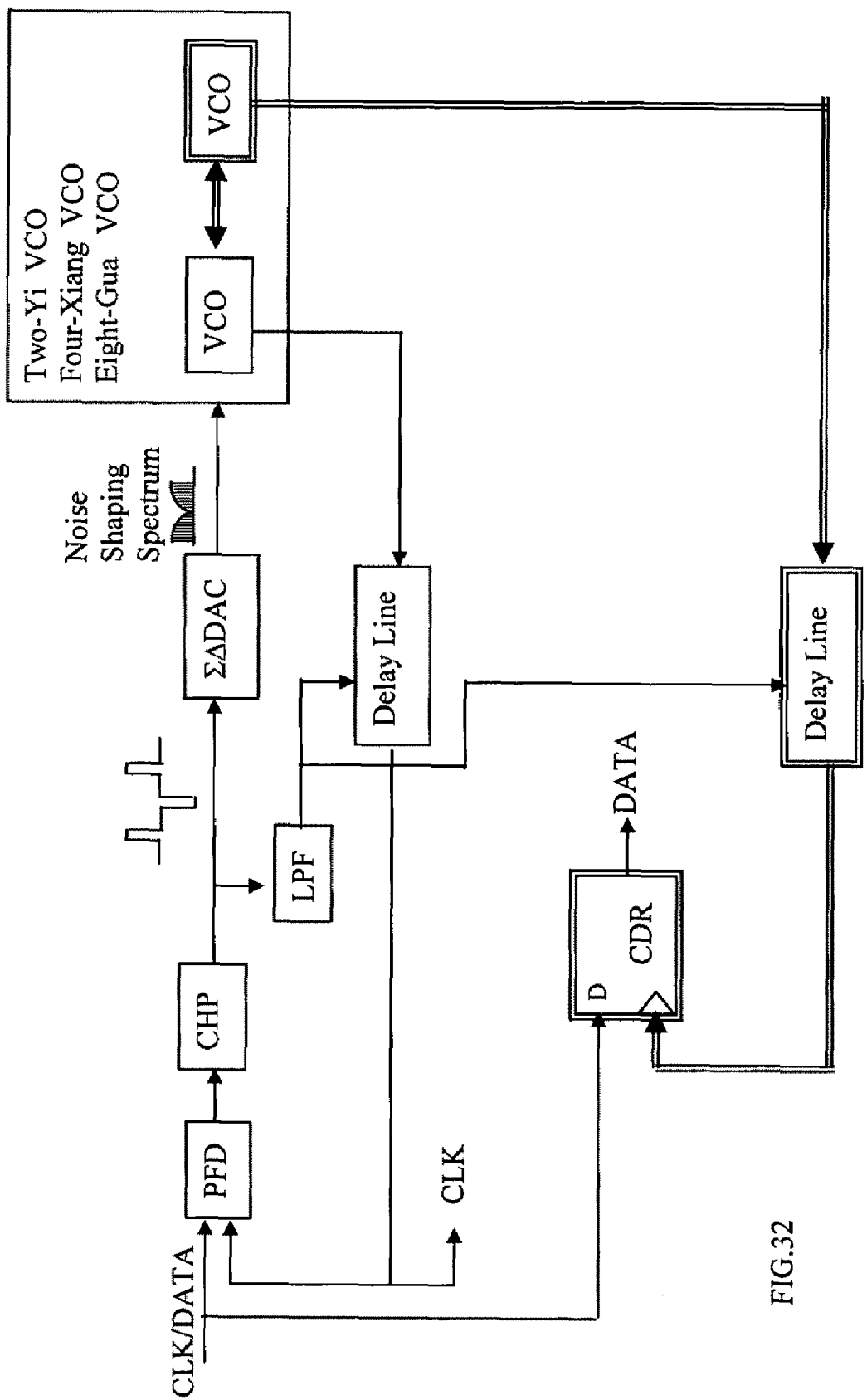

FIG. 32 is the general schematics of the CDR with the PLL having the ring loops being made of the GBQ-LC such as Two-Yi VCO, Four-Xiang VCO and Eight-Gua VCO, etc.

FIG. 33 (A) is the schematics for the Four-Xiang GBQ-LC resonator; (B1) is the waveform of the DeMux-4 of the CDR with the Four-Xiang GBQ-LC resonator clocking signals; (B2) is the 8 latch of the DeMux-4 of the CDR with the Four-Xiang GBQ-LC resonator clocking signals; (C) is the waveform of the second stage DeMux-2; (D) is the schematics of the two stages CDR with the Four-Xiang GBQ-LC resonator.

FIG. 34 (A) is the schematics for the Eight-Gua GBQ-LC resonator; (B1) is the waveform of the DeMux-8 of the CDR with the Eight-Gua GBQ-LC resonator clocking signals; (B2) is the 16 latch of the (C) DeMux-8 of the CDR with the Eight-Gua GBQ-LC resonator clocking signals.

FIG. 35 (A) is the Sawless LNA with the local oscillator being the GBQ-LC VCO; (B) is the Sawless LNA with the local oscillator being the quadratic GBQ-LC VCO.

FIG. 36 (A) is the block diagram of the green safety system for the green technologies; (B) is the schematics of the green safety system for the green technologies.

Figure 37:
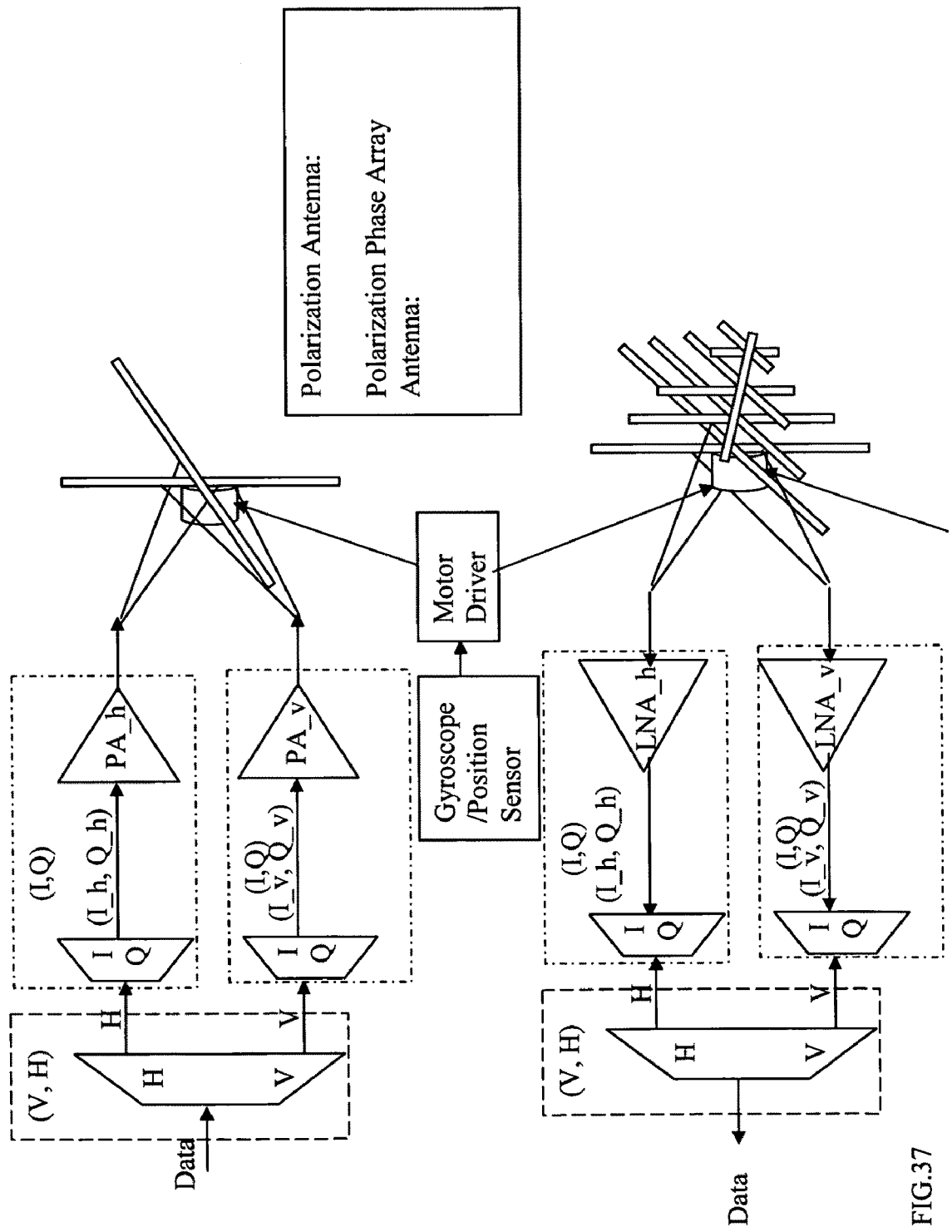

FIG. 37 is the RF system of the green technologies with the polarized antenna.

Figure 38C:
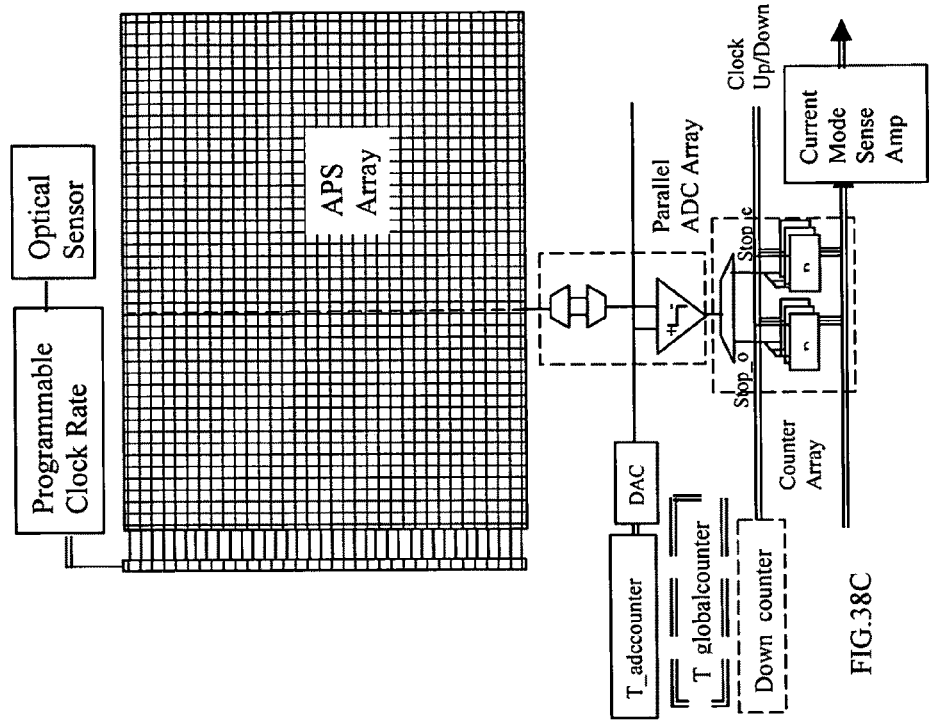
Figure 38A:
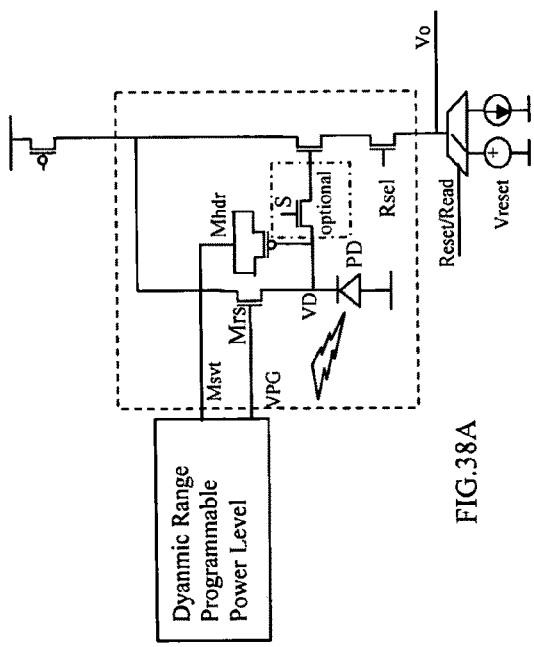

FIG. 38 (A) is the voltage mode pixel design having the pixel level FPN compensation; (B) is the global reset for the pixel as shown in FIG. 38A; (C) is the CameraChip made of the pixel array having the pixel level FPN compensation as shown in FIG. 38A.

FIG. 39 (A) is the polarized micro lens made of the vertical polarizer and the horizontal polarizer; (B) is the RGB micro lens; (C) is the composite polarized infrared micro lens; (D1) is the composite color polarized micro lens; (D2) is the alternative design of the composite color polarized micro lens; (D3) is the alternative design of the composite color polarized micro lens with RGB layers of sensor; (E) is the sensor array made of the composite color polarized micro lens; (F) is the partial rows and columns of the sensor array; (G) is the camera window of the frame of the Camerachip made of the composite color polarized micro lens; (H) is the sensor array of the Camerachip being rotated 45 degrees; (I) is the sensor array of the Camerachip being rotated 90 degrees.

Figure 40:
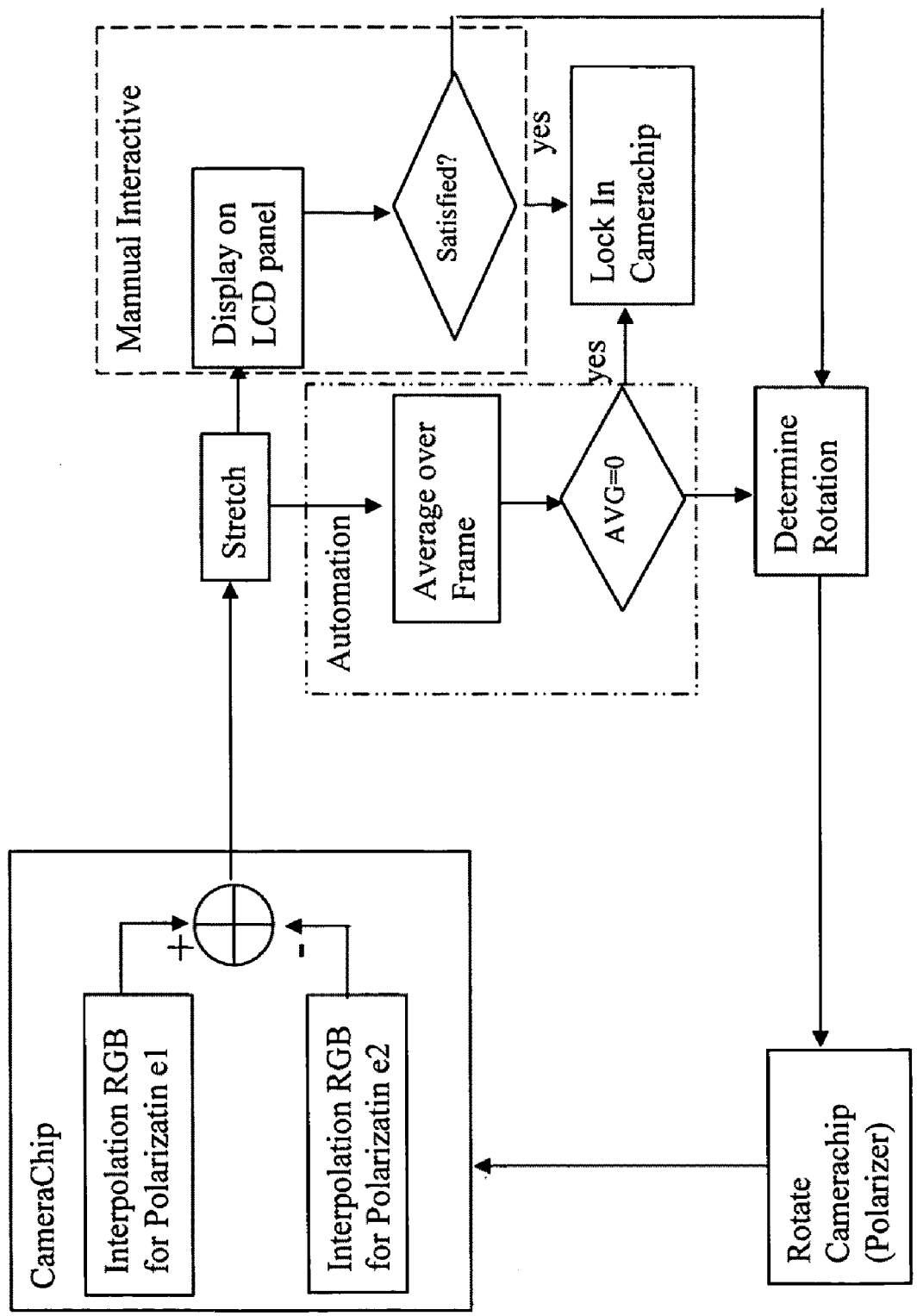

FIG. 40 is the operation of the Camerachip made of the composite color polarized micro lens.

FIG. 41 (A) is the polarized micro lens made of the no polarizer, 0 degree polarizer and the 45 degrees polarizer; (B) is the composite polarized infrared micro lens; (C1) is the composite color polarized micro lens; (C2) is the alternative design of the composite color polarized micro lens; (C3) is the alternative design of the composite color polarized micro lens with RGB layers of sensor; ((D) is the sensor array of the polarized Camerachip.

FIG. 42 (A) is the current mode Camerachip for the polarized camera; (BC) is circuit of the current mode read out circuit.

FIG. 43 (A) is the general N-APS pixel array structure having both the voltage output and current output; (B) is the general P-APS pixel array structure having both the voltage output and current output.

Figure 44B:
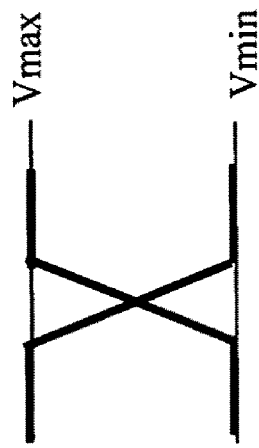

FIG. 44 (A) is he pin driver; (B) is the waveform.

DESCRIPTION AND OPERATION

As shown in FIG. 1, the green technologies uses the 7Less Microsystems design arts to have the green society to save more energy, resource and enhance safety. The 7Less Microsystems is the Xtaless clock generator, the capless low drop voltage regulator LDVR, the inductorless switch mode power supply SMPS, the diodeless true random number generator TRNG, the resistorless current sensor, the sawless RF and the brakeless hybrid electric vehicle BLEV. The energy is recycled and restored in the system. They are the fundamental technologies of the system on chip SOC such as camerachip, radiochip, clockchip, mousechip, etc. To have the safety, the polarized camerachip and the polarized radiochip are developed. The high power efficient power amplifier PA makes the $4^{th}$ generation OFDM communication being realizable. The high power efficient PA also makes the dimmer home plasma light being economic. The dynamic balanced HEV battery makes the battery having the maximum available energy density in the driving operation. The power efficient SMPS makes the conversion of the energy much more efficient to save a lot of power loss. The sawless RF and the spurfree/jitterless PLL are based on the gain-boost-Q LC resonator technologies. The power efficient power amplifiers PA are the applications of the advanced power efficient switch mode power supply techniques to the power amplifier design. The switch inductor technology makes the switch energy recycling that the switch frequency can increase and the inductor size can be reduced to be the inductorless SMPS.

Figure 2:
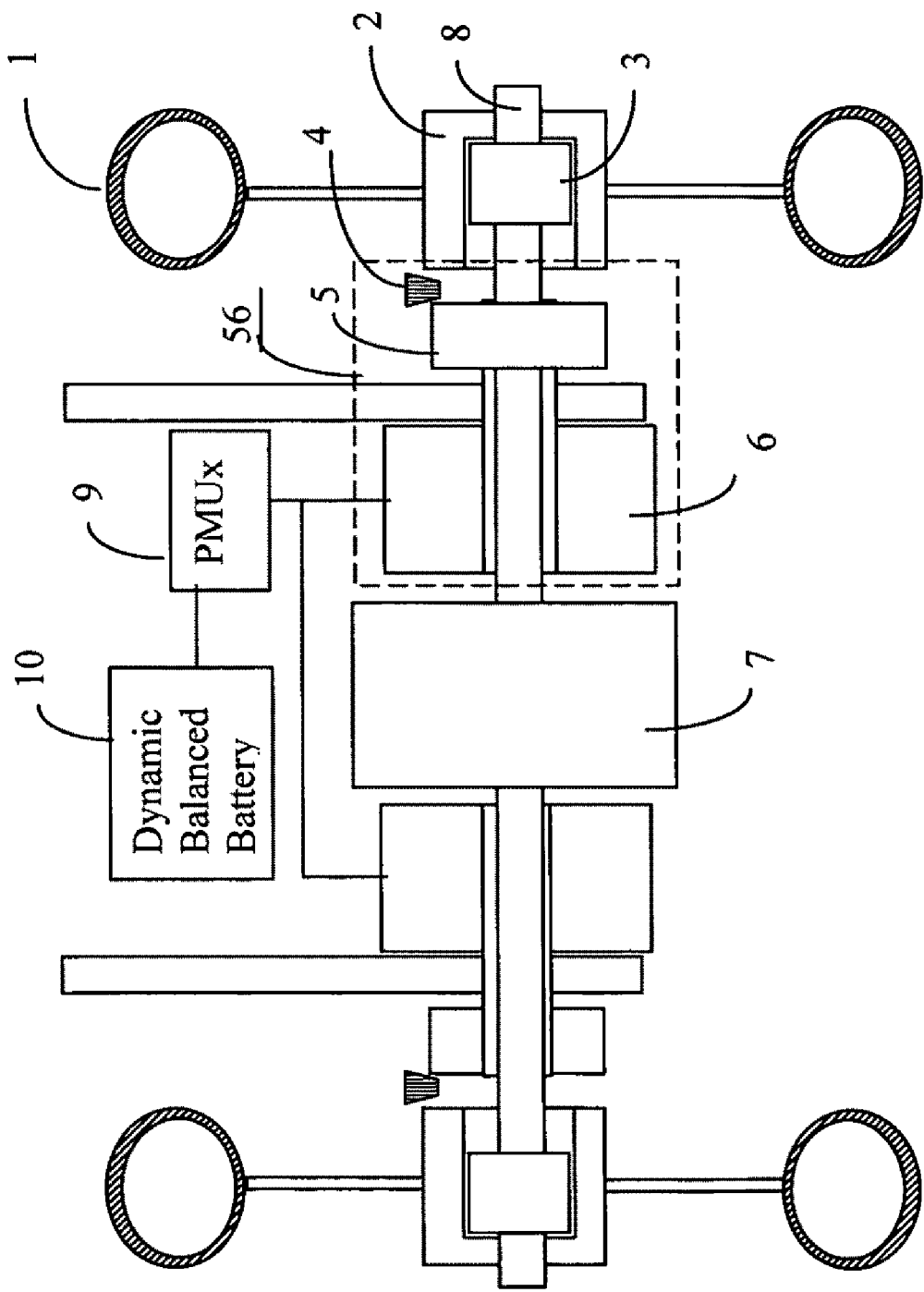
FIG. 2 is the energy recycling system in the brakeless hybrid electric vehicle HEV.

As shown in FIG. 2, the hybrid electric vehicle has the tire 1, hub 2, the drive engaging screw 3, the axle 8, the motor 7, the generator 6, the generator wheel 5, the rotating break engaging cone 4, the power management unit PMU 9 and the dynamic balanced battery 10. The motor 7 rotates the axle 8. The axle 8 drives the screw 3 to engage with the hub 2 to drive the wheel 1 to rotate. As the brake is applied, the rotating break engaging cone 4 is engaged with the hub 2 and the generator wheel 5 and the rotating hub 2 drives the generator wheel 5 to rotate. The generator 6 generates the electricity and the PMU 9 converts the electricity to store the energy in the dynamic battery 10.

As shown in FIG. 3A, it is the series-static charge balanced mode EV battery having N cells. Each individual battery cell has the different charge capacity Ci. With the series-static charge, each cell has the same Q and the voltage for each cell becomes $V_i=(Q/C_i)$. For the safety, the maximum voltage of the cell is V. Then the charge $Q=N*C_i\_minV=(C_1V_1+C_2V_2\ldots+C_iV_i+\ldots+C_nV_n)<(C_1+C_2+C_i\ldots+C_n)V_o$ To have the maximum capacity, the series-static charge balanced mode EV battery bypass the minimum cells which have been fully charged. However, this approach has the following four problems.

(1) For each battery, it needs to have the voltage meter or the comparator to measure its voltage to determine its voltage; the fully charged battery will be bypassed and removed from the series for battery.

(2) To charge the rest battery, the reference voltage for the DC-DC converter will change accordingly;

(3) Even all the cells are full charged, the available charge still is the minimum charge quantity C_minV;

(4) This static balanced charge process is hard to work during the EV in driving condition.

Since the series-static charge balanced mode EV battery has the above four defects, the parallel dynamic charge balanced mode EV battery is invented as shown in FIG. 3B1 and FIG. 3B2. As shown in FIG. 3B1, as the HEV is braked to stop, the PMUx charges the cells in parallel. Even without the charge, the battery has more capacity will be discharged to charge up the battery having less capacity to make the balance of the voltage and capacity among the cells of the battery. As the battery in use, as shown in FIG. 3B2, the battery is connected in series to have the full rated operating battery voltage.

The parallel dynamic balanced battery has the following good characteristics.

(1) The charging boost voltage is low and has more power efficiency.

(2) Even the vehicle is at very low speed, the battery still can be charged, the speed range for charging is much larger than the series-static charge balanced mode EV battery.

(3) All the battery has the same voltage.

(4) The charging process can operate in the EV working environment.

(5) This is continue dynamic balance process.

(6) The battery has the maximum and all available charge $Q=(C1+C2+\ldots+Ci\ldots+Cn)V$.

Figure 4A:
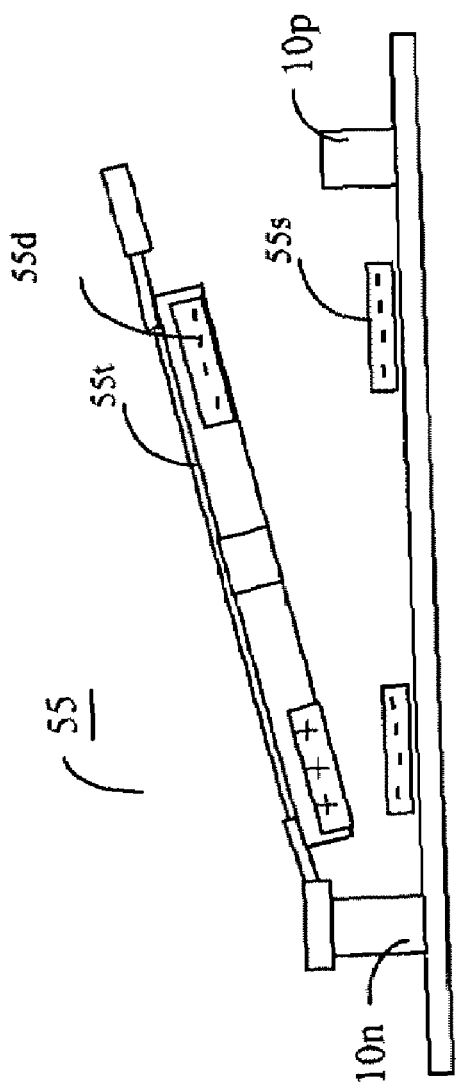
FIG. 4 (A) is the single pole operation micro-switch for dynamic balanced EV battery; (B) is the double pole operation micro-switch for dynamic balanced EV battery.
Figure 4B:
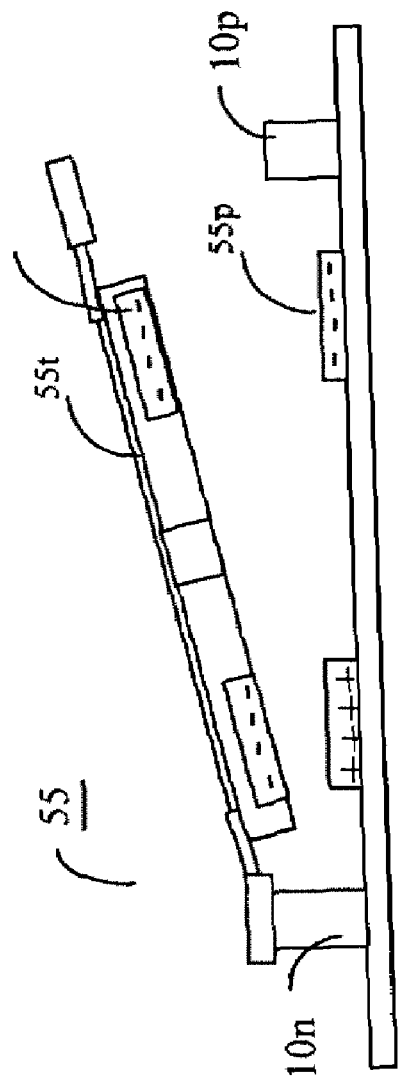

For the large amount current switch of the HEV battery, the micro-switch 55 is shown as FIG. 4. The toggle plate 55t toggles between two poles 10n and 10p to make the different connections. There are the doped charge 55d on the two ends of the toggle plate 55t. FIG. 4A is the single pole operation. Injecting the negative charges, the plate is connected with the pole 10n. Injecting the positive charges, the plate makes the connection in other pole 10p. The injecting charge process can be implement with the recycling energy switch inductor as shown in FIG. 19 and FIG. 20. Two switch-inductors are needed for this Micro-switch. FIG. 4B is the dual pole operation. The positive and negative charges are recycling between two poles. As polarization of the pole in one direction, the toggle plate makes the connection with one pole 10n. As the polarization is reversed, the toggle plate makes the connection with another pole 10p. However, only one of recycling energy switch inductor is needed as shown in FIG. 19. The poles 10n and 10p are the capacitor Cgate and Cstor separately. Furthermore, the doping charge in the isolation layer 55d is only one kind. Therefore, FIG. 4B is the better implementation for the Microswitch.

Figure 5B:
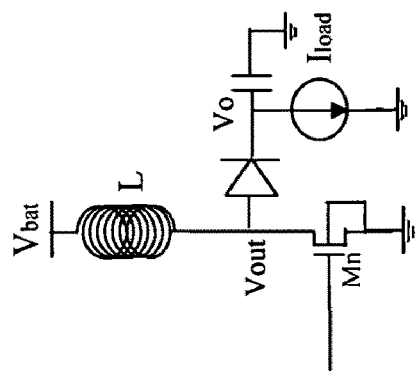
Figure 5C:
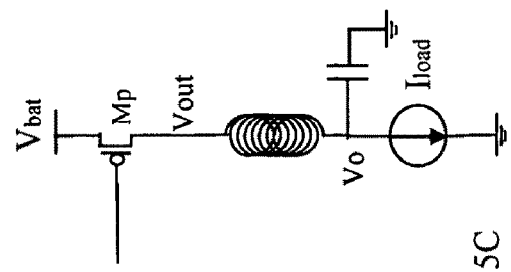
Figure 5A:
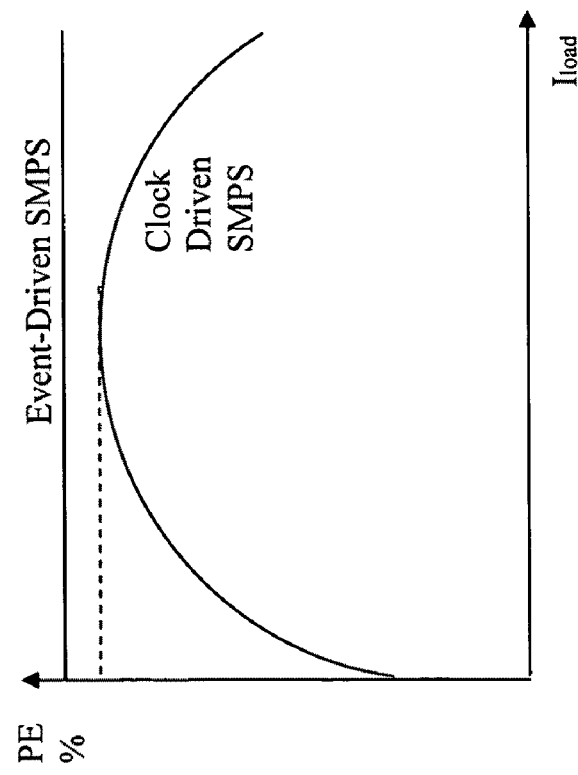

To charge the EV battery, there is the switch mode power supply SMPS. As shown in FIG. 5A, for the clock-driven pulse-width modulation PWM or pulse-frequency modulation PFM, the power efficiency PE is $I_{load}$ load-dependent. To have the high and constant power efficiency PE for the different loading $I_{load}$, the operation of the SMPS must change to be the event-driven. The event driven SMPS is neither PWM nor PFM. For the event driven, the width and frequency both varies to operate at the optimum condition. Therefore, the efficiency for the event-driven operation is constant over the variance of the current loading.

Furthermore, it is noted that the power amplifier PA having the same essential characteristics as the SMPS. As shown in FIG. 5B, it is the essential characteristic circuit of the NMOS power amplifier PA and the boost converter. As shown in FIG. 5C, it is the essential characteristic circuit of the PMOS power amplifier PA and the buck converter. It is well known the PA has much lower PE than SMPS. So, study the PA and understand the low PE mechanism in PA will help the re-design of SMPS to improve PE of SMPS.

As shown in FIG. 6, the NMOS power amplifier PA has the low PE to be 25%-33%. The oscillation curve is the oscillation curve having the VDD to be the centerline. This oscillation curve can be the superposition of the constant VDD curve and the oscillation curve having the ground GND to be the centerline. For the constant VDD curve, it is equivalent to the digital switch circuit to have the dissipation with the pulse switching. For the oscillation curve having the ground GND to be the centerline, it is equivalent to the buck converter to have the signal modulation having the 100% PE (power efficiency). Therefore, the PMOS power amplifier (PA) has the much better PE than the NMOS power amplifier PA.

From the comparison in FIG. 6, it is noted that the boost converter is equivalent to the NMOS power amplifier PA to have the constant VDD curve energy dissipation. To minimize the energy loss to increase the PE, we need to get rid of the constant VDD curve energy dissipation mechanism in the boost converter.

As shown in FIG. 7A1, the conventional boost converter analysis has two implicit assumptions. The first assumption is the diode voltage of the Schottky is zero. The second assumption is the parametric capacitor at Boost node $V_{boost}$ is negligible to be zero. As shown in FIG. 7A2, the energy $E_L$ stored in the inductor current $I_L$ is completely transmitted to be the transmitted energy $E_t$ and $E_t=E_L$. However, this implicit assumption is a terrible mistake. The parametric capacitor at the Boost cannot be neglected at all and $E_t<E_L$.

As shown in FIG. 7B1, it is the real boost circuit has been adopted as the industrial standard circuit. With this industrial standard circuit, we make the analytic study of the defects and energy dissipation of the boost converter circuit.

There are three energy loss mechanisms in the boost converter. The first is the parametric capacitance at the boosting node Vboost.

Due to the parametric capacitance effect, to charge up the Cpar at the Vboost node to the (Vo+Vdiode) to make the energy transmission, there is a minimum inductor current $I_{L\_min}$. The minimum inductor current $I_{L\_min}$ determines the minimum NMOS switch-on time.

To make the energy transmit, the boost Voltage Vboost has to be greater than Vo.

$V_{boost}>Vo$

The inductor current has to charge up the parametric capacitor and the capacitor energy is Ppar=(½)Cpar*Vboost**2

The inductor current energy is

EL=(½)L*$I_L$**2

The minimum inductor current is to charge up the parametric capacitance to reach the output voltage Vo and the energy will be dissipated as the Edis.

½L*$I_{L\_min}$2=½(Cpar(Vo+$V_{diode}$)2)=Edis

The second boost converter energy loss mechanism is the Schottky diode is used to rectify the current.

(1) The voltage drop of the Schottky diode causes the $V_{diode}$ energy loss and the decrease of the power efficiency.
(2) The parametric capacitance is charged up to high voltage Vo and the energy ½(Cpar(Vo+Vdiode) **2)=Edis is dissipated through the discharge as shown in FIG. 7B2.

The Schottky diode Vdiode has two dual-energy-loss mechanism:
(1) the diode drop in bandgap;
(2) the voltage drop at the voltage-boosting node Vboost corresponding to Vdiode stored in Cpar.

Figure 8C:
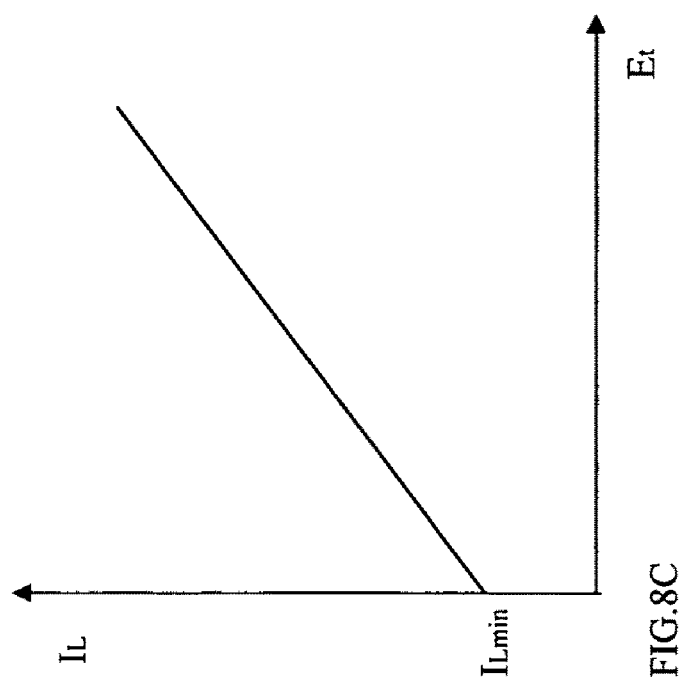
Figure 8A:
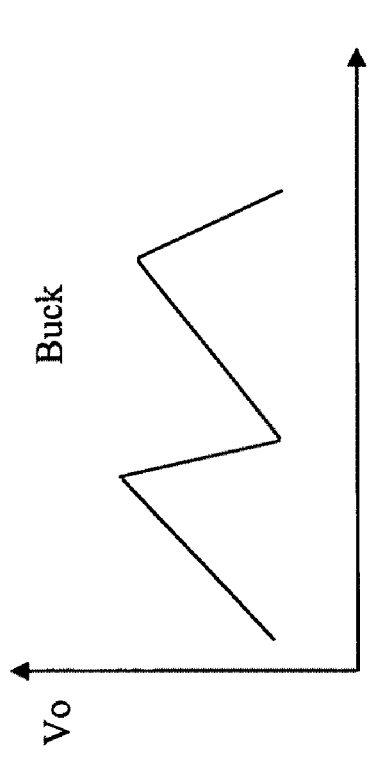
Figure 8B:
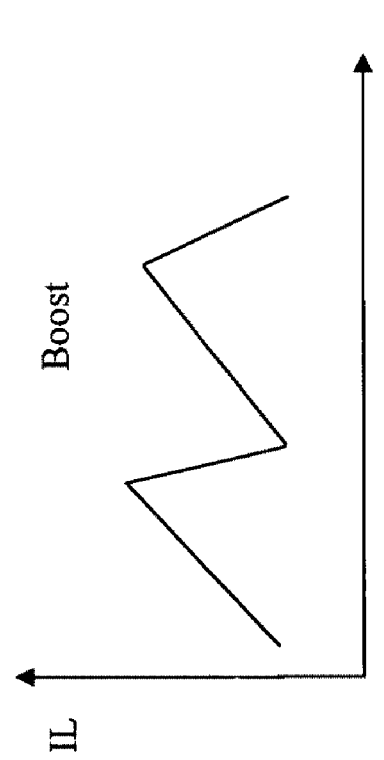

The third boost converter energy loss mechanism is the current sensor resistor Rcs. As shown in FIG. 8A, the buck converter uses the voltage mode controller. As shown in FIG. 8B, the boost converter uses the current mode controller.

To have the current mode control, the IL current flowing through the current sensor resistor Rcs.

The energy dissipation is ½(Rcs*$I_L$**2). Rcs has three energy loss mechanisms, one resistance loss and two derived energy loss.

(1) the resistance loss is due to Rcs itself,
(2) reducing the VGS of NMOS switching gate to increase the resistance
(3) the voltage drop at the voltage-boosting node $V_{boost}$ corresponding to Rcs is non-recycling energy stored in Cpar.

Figure 9C:
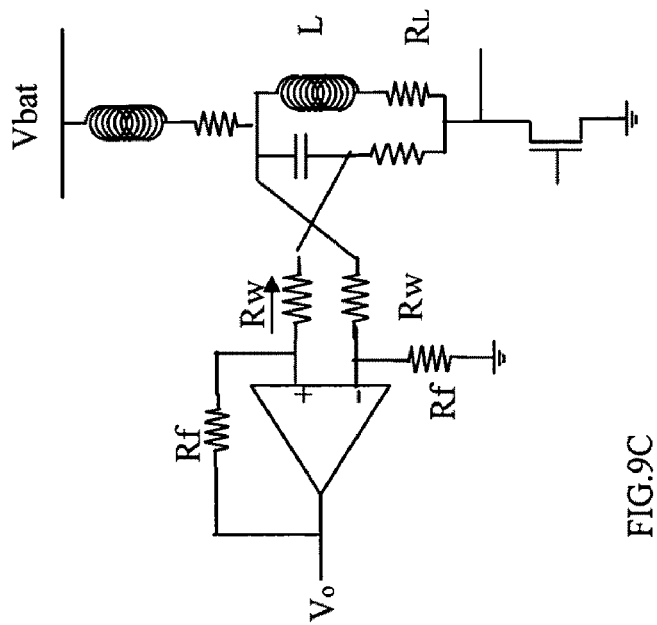
Figure 9A:
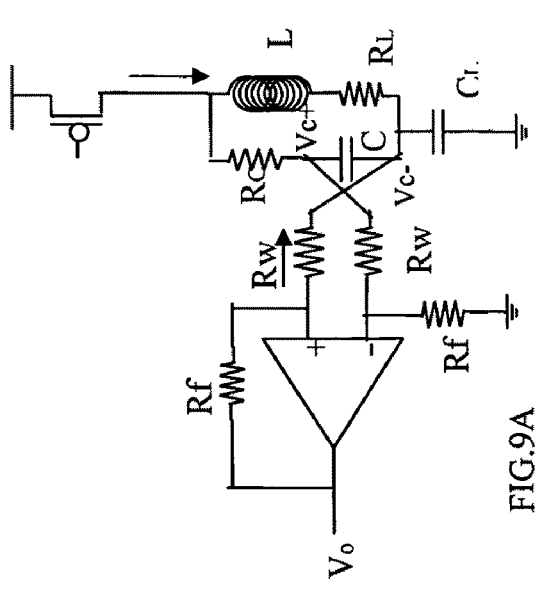
Figure 9B:
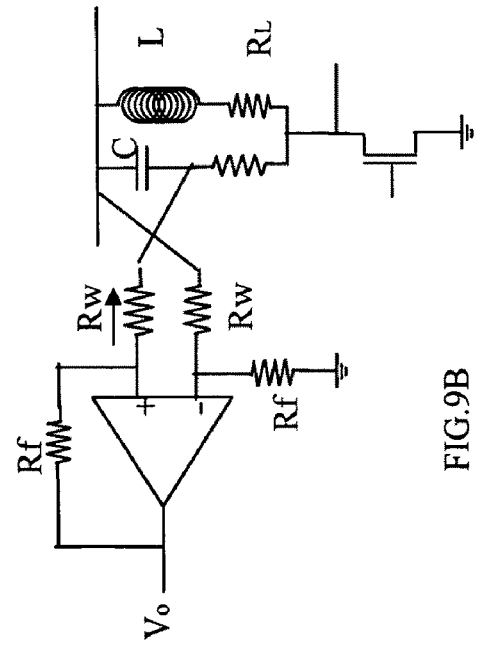

To get rid of the energy losses of the resistor, the resistor-less current sensor is adopted. As shown in FIG. 9, the capacitor C and the resistor Rc are added to be parallel with the inductor L. The inductor L has the parametric resistance $R_L$. FIG. 9A is the current sensor for the buck converter. FIG. 9B is the current sensor for the boost converter. FIG. 9C is the current sensor for the recycling boost converter. The following analysis is for FIG. 9A. However, the results can be applied to the FIG. 9B and FIG. 9C, too.

$$Vc_+ - Vc_- = I_L * \frac{[((sL+R_L)//(Rc+(1/sC)]*}{(1/sC)/[Rc+(1/sC)]}$$

$$= I_L * \frac{1}{\frac{1}{sL+R_L}+\frac{1}{Rc+(1/sC)}} \frac{1/sC}{Rc+(1/sC)}$$

$$= I_L * \frac{1}{\frac{1}{sL+R_L}+\frac{1}{Rc+(1/sC)}} \frac{1/sC}{Rc+(1/sC)}$$

$$= \frac{I_L}{\frac{sCRc+1}{sL+R_L}+1} = \frac{L}{CRc} \frac{I_L}{s+(1/CRc)} + 1$$

$$= \frac{L}{2CRc} I_L \text{ for } CRc = L/R_L$$

$$Vo = \frac{[Rf/(Rf+Rw)]Vc_+ - Vc_-}{Rw} Rf + [Rf/(Rf+Rw)]Vc_+$$

$$= (1/Rw)[Rf/(Rf+Rw)]Vc_+ + [Rf/(Rf+Rw)]Vc_+ - \frac{Rf}{Rw}Vc_-$$

$$= \frac{Rf}{Rw}(Vc_+ - Vc_-)$$

FIG. 10A is the Schottky diode for the boost converter. It has the voltage drop to lose the efficiency. To reduce the energy loss due to the voltage drop, the PMOS switch is adopted.

FIG. 10B1 is for the single input single output boost converter. As the output voltage is less than the boost voltage, the PMOS switch is on to allow the current to flow. FIG. 10B2 is the single input single output PMOS switch with the recycling driver. The Schottky diode is equivalent to the single input single output PMOS switch.

FIG. 10C1 is for the single input multiple output SIMO as shown in FIG. 12E. If the output voltage is already larger than the set target output voltage, then the PMOS switch will not open. FIG. 10C2 is the single input multiple output SIMO switch with the recycling drive. For the SIMO boost converter, the Schottky diode cannot be used. The Schottky diode is only used for the single input and single output SISO boost converter.

FIG. 11 makes the analysis of the energy loss of the boost converter and the recycling boost converter. FIG. 11A1 is the schematic of the boost converter; FIG. 11A2 is energy diagram of the boost converter. Charging and discharging of the capacitance $C_{GN}$ is the switching loss of the NMOS switch. Charging and discharging of the capacitance, $C_{GP}$ is the switching loss of the PMOS switch. Cpar is the parametric capacitor at the $V_{boost}$ node. Rcs is the resistor of current sensor. Rds is the switching on resistor of the NMOS. Edis of Cpar is the energy stored in Cpar will be dissipated. Vdiode is the energy loss due to the Schottky diode. Et is the energy transferred to the output. Vbat is the voltage level of the battery. Vboost is the Voltage level of the boosting voltage Vboost. The dotted line shows all the dissipation energy. The dissipation energy includes the dissipation at the rds, Rcs, CGN, Cpar and Vdiode.

FIG. 11B1 is the schematic of the recycling boost converter; FIG. 11B2 is energy diagram of the recycling boost converter. In FIG. 11B2, the recycling capacitor Cstor is added for the recycling of energy for Vboost node. The PMOS substrate can be either biased as shown in FIG. 12A1 or floating as shown in FIG. 12A2. For the recycling boost converter, only the rds dissipation energy still existed. All the residue energy can be recycled as shown by the arrows. The rds energy dissipation can be minimized with the increase of the NMOS and PMOS size.

FIG. 12 makes the timing analysis of the energy dissipation in the boost converter. As shown in FIG. 12A1, even the Schottky diode has been replaced with the PMOS switch, however, the key issue of the energy loss of the boost converter is the capacitance Cpar of the $V_{boost}$ node. As shown in FIG. 12A2, the Edis energy being (½ $C_{par}$Vo**2) stored in the Cpar is completely dissipated and wasted as the NMOS switching on to discharge the Vboost node.

To recycle the energy (½ $C_{par}$Vo2) stored in the $C_{par}$, as shown in FIG. 12B1, the $C_{sto}$ and $L_{bat}$ are added to the boost converter. As shown in FIG. 12B2, the energy (½ $C_{par}V_O$2) stored in the Cpar at $V_{boost}$ is recycled to store in $C_{sto}$. As the NMOS switches on, the voltage of $V_{boost}$ is zero. There is no voltage difference between the Vboost and the ground node at all. Therefore, the dissipation energy is zero. This is the most important energy saving of the boost converter. To save the energy, we use the switch-free Synchronous Oscillation. This synchronous oscillation will rely on the accurate current sensor of the inductor L current (IZS) and the zero voltage Vboost (VZS).

To save the energy of the PMOS switch, the high voltage zone energy can reuse in the low voltage zone. As shown in FIG. 12C1, the PMOS device PGM adjusts the ground level VG of high voltage zone. The charge in high voltage zone flows through the low voltage inductor to recycle the energy in the synchronous oscillation LC banks. The inductors Ls and L are coupled that the energy coming from the high voltage zone will convert to the inductor current energy immediately without the energy conversion loss.

FIG. 12D shows the alternative design of the recycle boost converter. The Csto with one series connected inductor $L_C$ is connected in parallel with the battery with one series connected inductor L. FIG. 12E shows the single input multiple output (SIMO) boost converter. The single inductor can generate multiple level voltage outputs of Vo, V1, V2 and the negative voltage output Vneg.

FIG. 12F1 and FIG. 12F2 are the synchronous recycling boost converter. Not only the boosting action uses the synchronous resonator but also the MOS switches uses the synchronous drive. In FIG. 12F1, the transferring gate uses the PMOS switch. In FIG. 12F2, the transferring gate uses the NMOS switch. As shown by the recycling drive in FIG. 19 and FIG. 20, the synchronous drive is the recycling drive without the switches of the switch inductor. The synchronous drive is a free running synchronous resonator. The recycling drive is the event-driven resonator. The synchronous drive needs extremely careful design to have all the system in synchronization. The FIG. 12F1 needs two synchronous drives. The FIG. 12F2 needs only one synchronous drive.

FIG. 13 is the detailed operational analysis of the recycling boost converter. As shown in FIG. 13A, the initial state of boost converter is $V_{boost}$=Vbat. As the boost converter is working, as $I_L$<0, the Vboost<Vbat. As shown in FIG. 13B, as $I_L$=0 in the initial state or Vboost=0 in the working state, the NMOS switches on. As the inductor current $I_{L>0}$, the inductor starts to increase current to build up the energy in the inductor. As shown in FIG. 13B, FIG. 8B and FIG. 8C, the inductor current builds up to the maximum inductor current, As shown in FIG. 13C, the NMOS switches off and the voltage $V_{boost}$ boosts up. The inductor current is to charge up the parametric Cpar to the voltage Vo first before the energy can be transferred to the output node. All the charging energy in this period is wasted. The wasted energy is proportional to the parametric capacitance of the huge NMOS and PMOS which cannot be neglect. This is the main wasted energy dissipation in the boost converter.

Figure 13A:
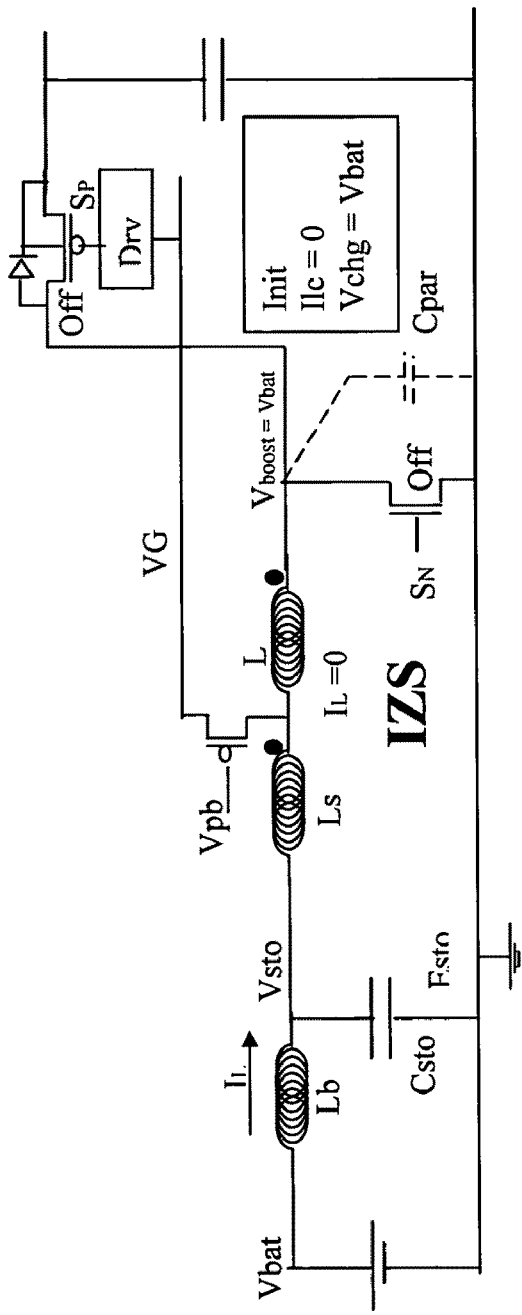
Figure 13B:
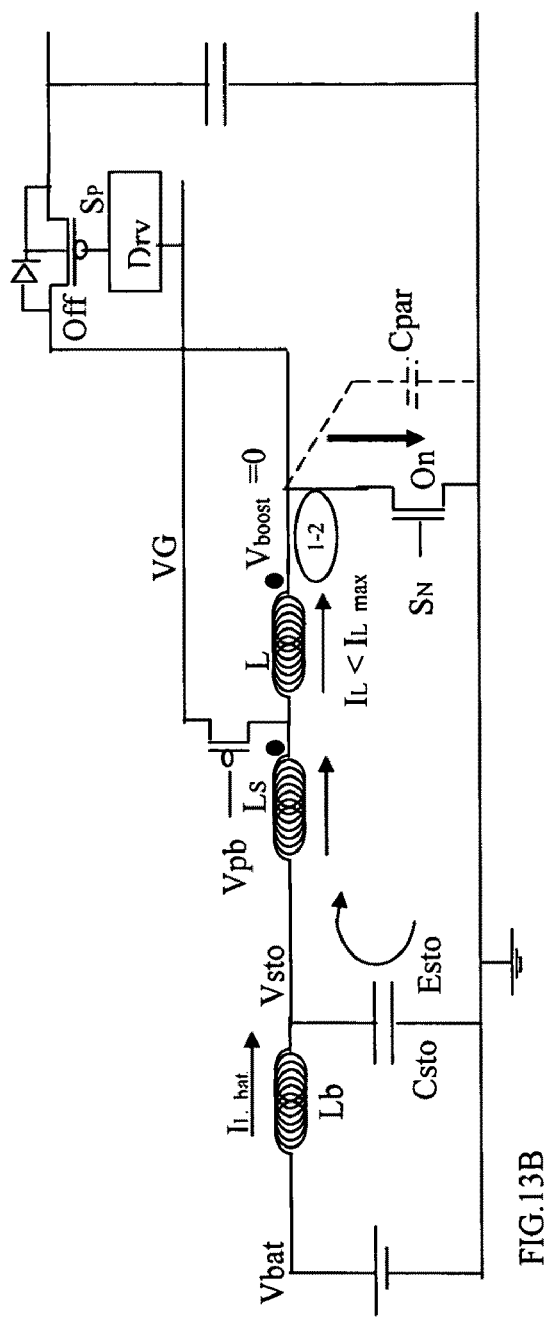
Figure 13C:
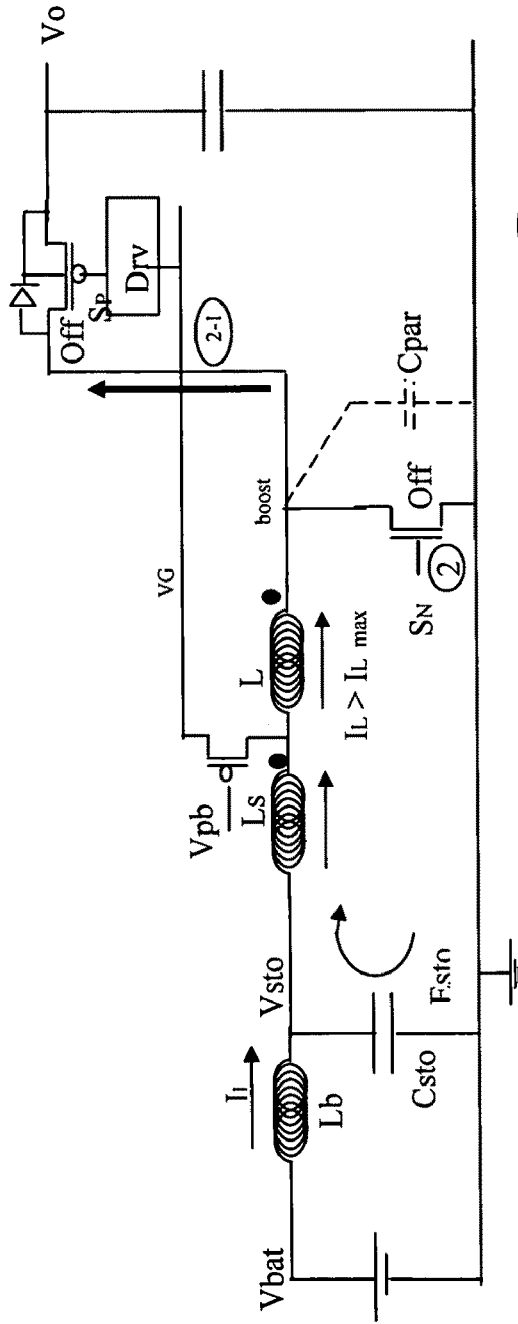
Figure 13D:
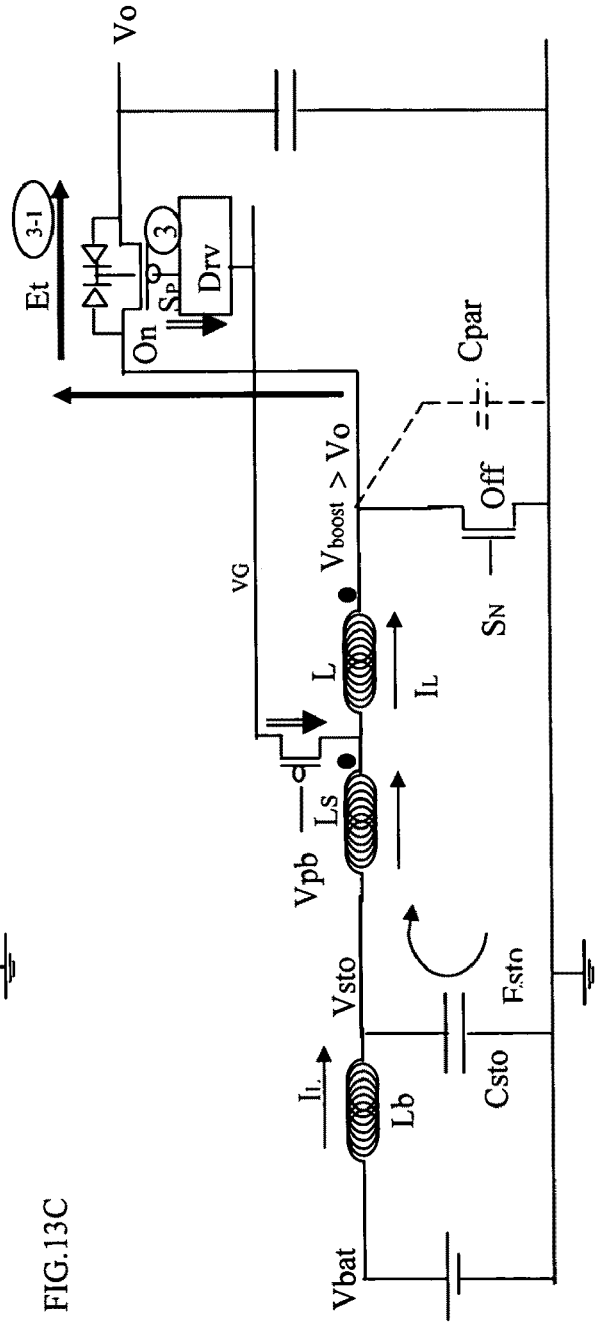

As shown in FIG. 13D, as Vboost>Vo, the PMOS switches on and the current flows to the output Vo. The boost energy needs to finish in the half period of the synchronous boosting operation and the on-resistance needs to be small that the PMOS size needs to be large. It causes the parametric capacitance Cpar is large.

Figure 13E:
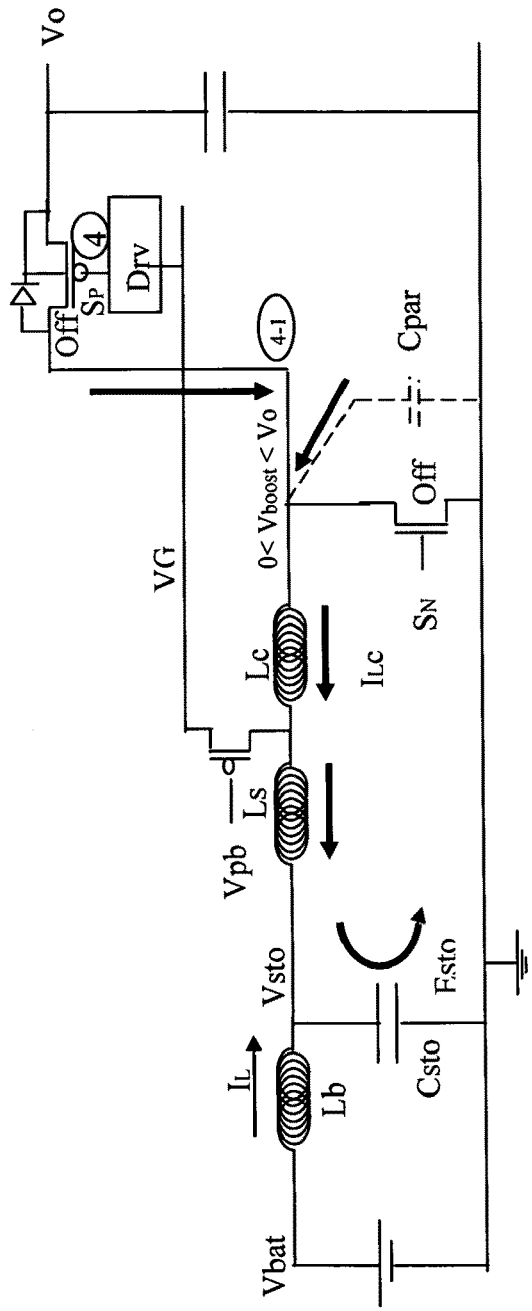

As shown in FIG. 13E, during the discharging cycle of the synchronous oscillation, the inductor current starts to flow back to discharge the residue charge in Cpar which cannot transmit to the output. This energy save action is equivalent to the current amplification of the inductor in the buck converter. The inductor needs to recycle the residue energy to save the energy loss.

Figure 13F:
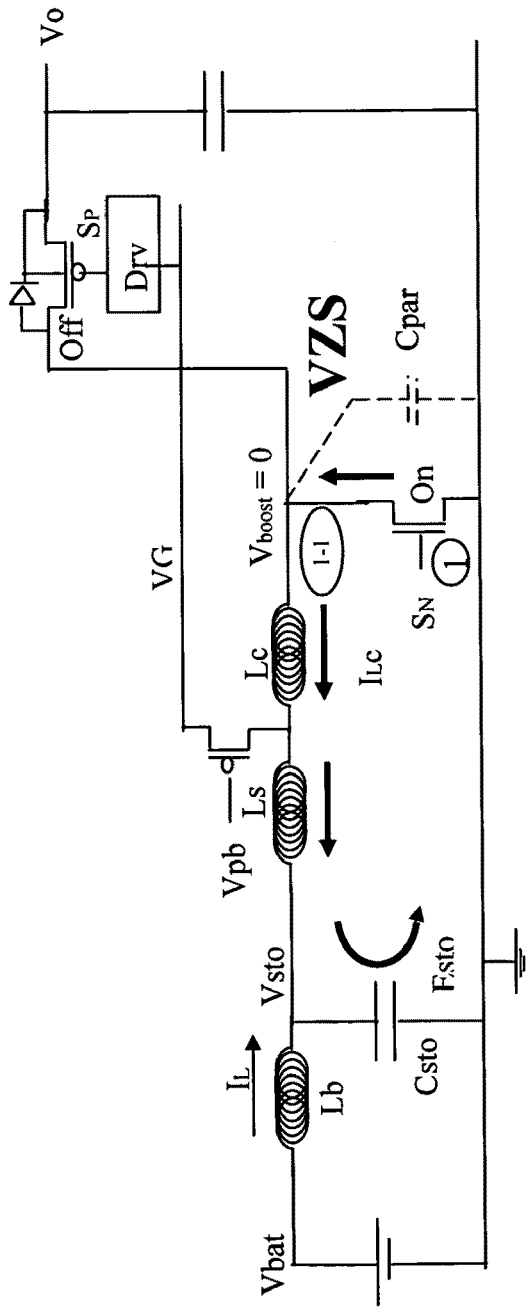

As shown in FIG. 13F, as the Vboost=0, the NMOS switches on. The NMOS is switched on and is held on as shown in FIG. 13B until the inductor current $I_{LC}$ reaches the maximum inductor current to start the next boost charging cycle.

FIG. 14 shows the waveform of the operation of the recycling boost converter.

(1) At node 1, the Vboost voltage drop to zero, the NMOS switches on and the inductor current starts to build on. It is corresponding to FIG. 13B.

(2) At the node 2, the inductor current reaches the maximum allowed current and NMOS SN switches off. The inductor current start to charge up the Cpar and the Vboost voltage starts to boost up. It is corresponding to FIG. 13C.

(3) At node 3, as the Vboost Voltage is larger than the output voltage, the PMOS SP switches on to charge up the output voltage. It is corresponding to FIG. 13D.

(4) At node 4, as the inductor current reverses the flowing direction, as the Vboost<Vo, the PMOS SP switches off. It starts to discharge the Vboost. It is corresponding to FIG. 13E.

As the Vboost voltage drops to be zero, it starts to have the next boost cycle. It is corresponding to FIG. 13F.

Figure 15A:
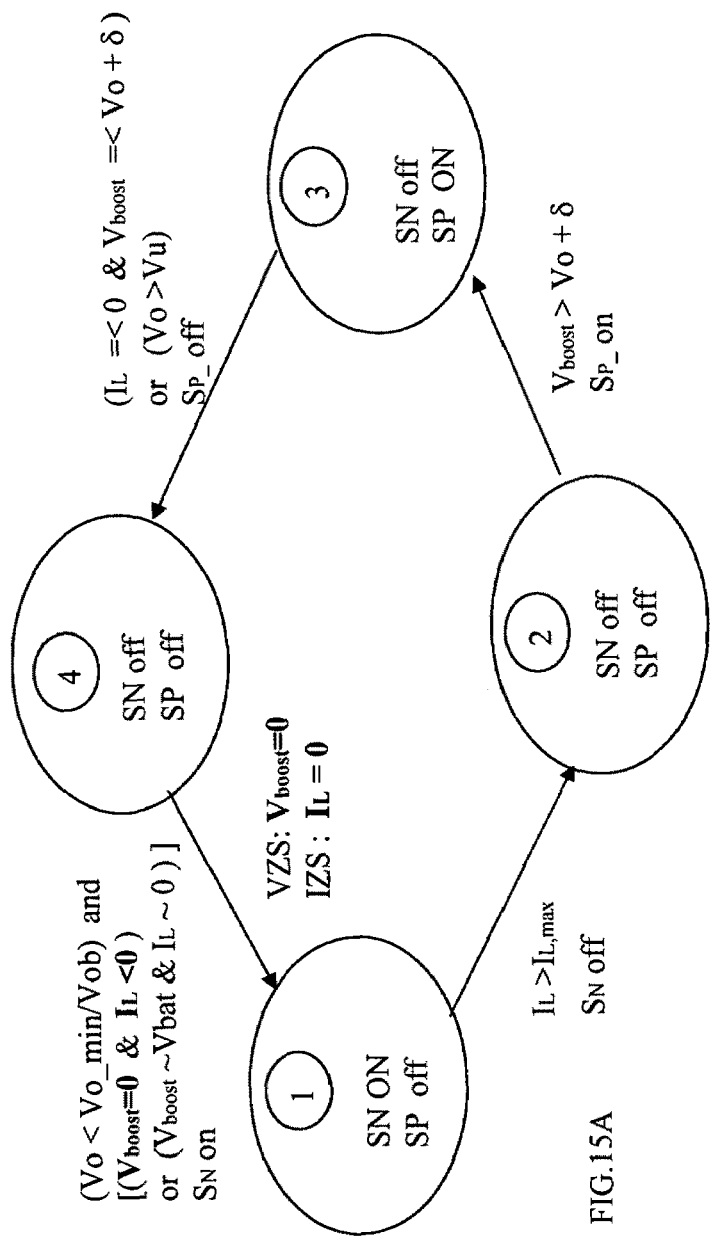
Figure 15B:
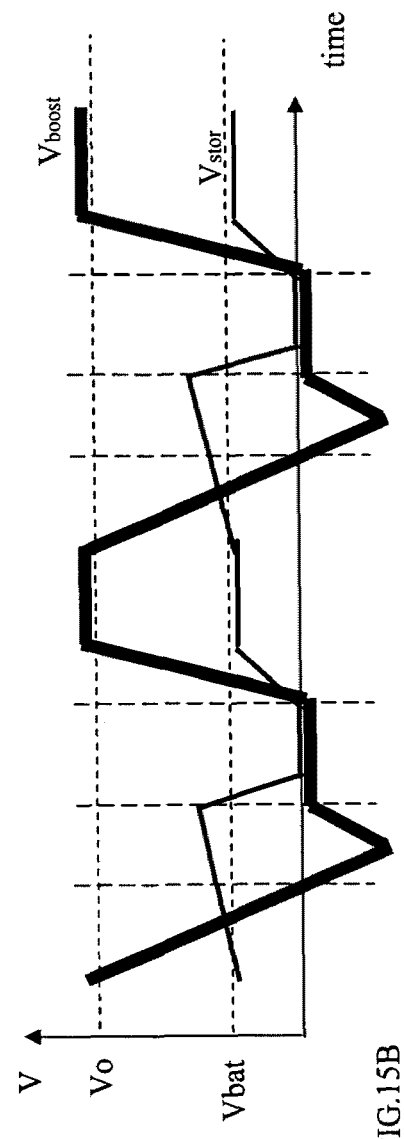

FIG. 15A shows the state diagram being derived from the timing waveform. The nodes 1, 2, 3 and 4 in FIG. 14 are corresponding to the four states in FIG. 15A. FIG. 15B shows the residue energy recycling mechanism of the boost converter. The residue energy recycling is shown as the oscillation curves of the Vboost and Vstor.

FIG. 15A is the complete self-contained state diagram. It can be the event driven to have the asynchronous operation to operate at the optimum condition. It doesn't need the clock event to initialize the state diagram to be the PWM or PFM. However, this state diagram can also to be implemented as the clock-driven state diagram to enhance the convention PWM or PFM boost converter. The PFM boost converter is served as the power factor correction (PFC) for the AC/DC conversion.

Figure 16A:
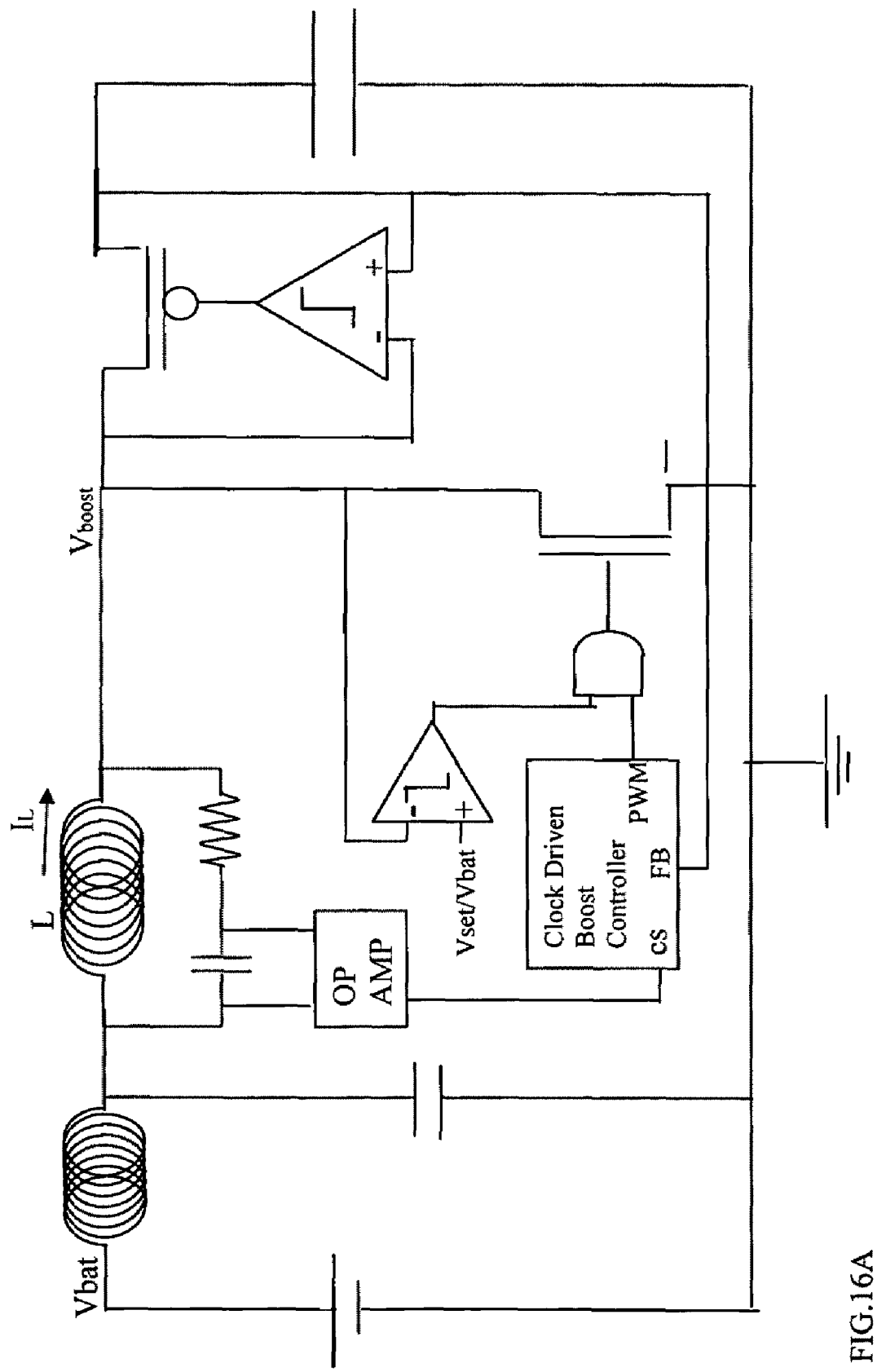
Figure 16B:
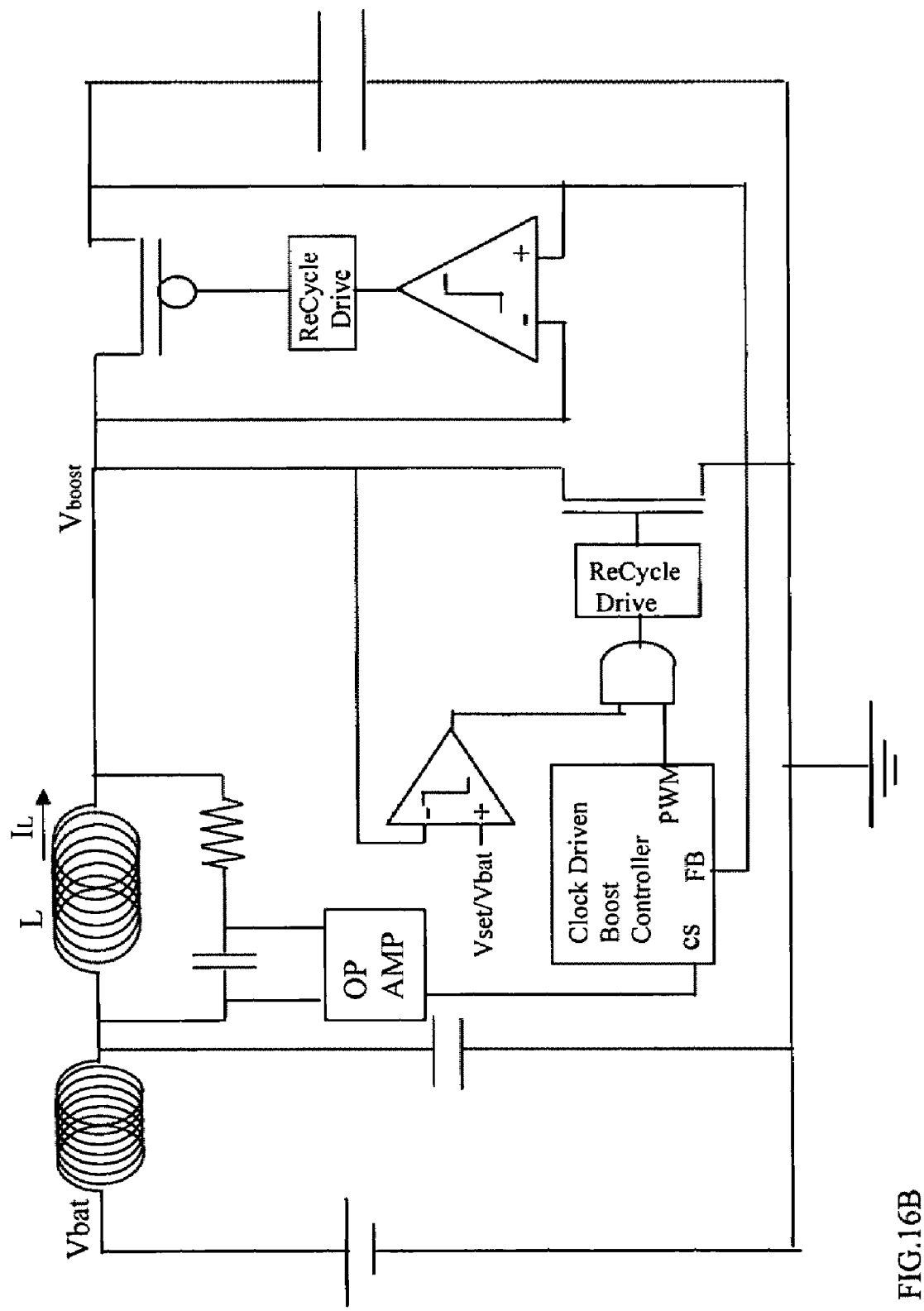

We can apply the event-driven boost algorithm and circuit to the clock-driven PWM to enhance the power efficiency PE of the converter. As shown in FIG. 11A1 and FIG. 16A, the current sensor is replaced the resistorless current sensor. The Shottky diode is replace with the PMOS switch. The PWM type clock driven boost control signal is gated with the (Vboost~0) signal. FIG. 16B is to add the recycling drive to the PMOS and NMOS switches.

Figure 16C:
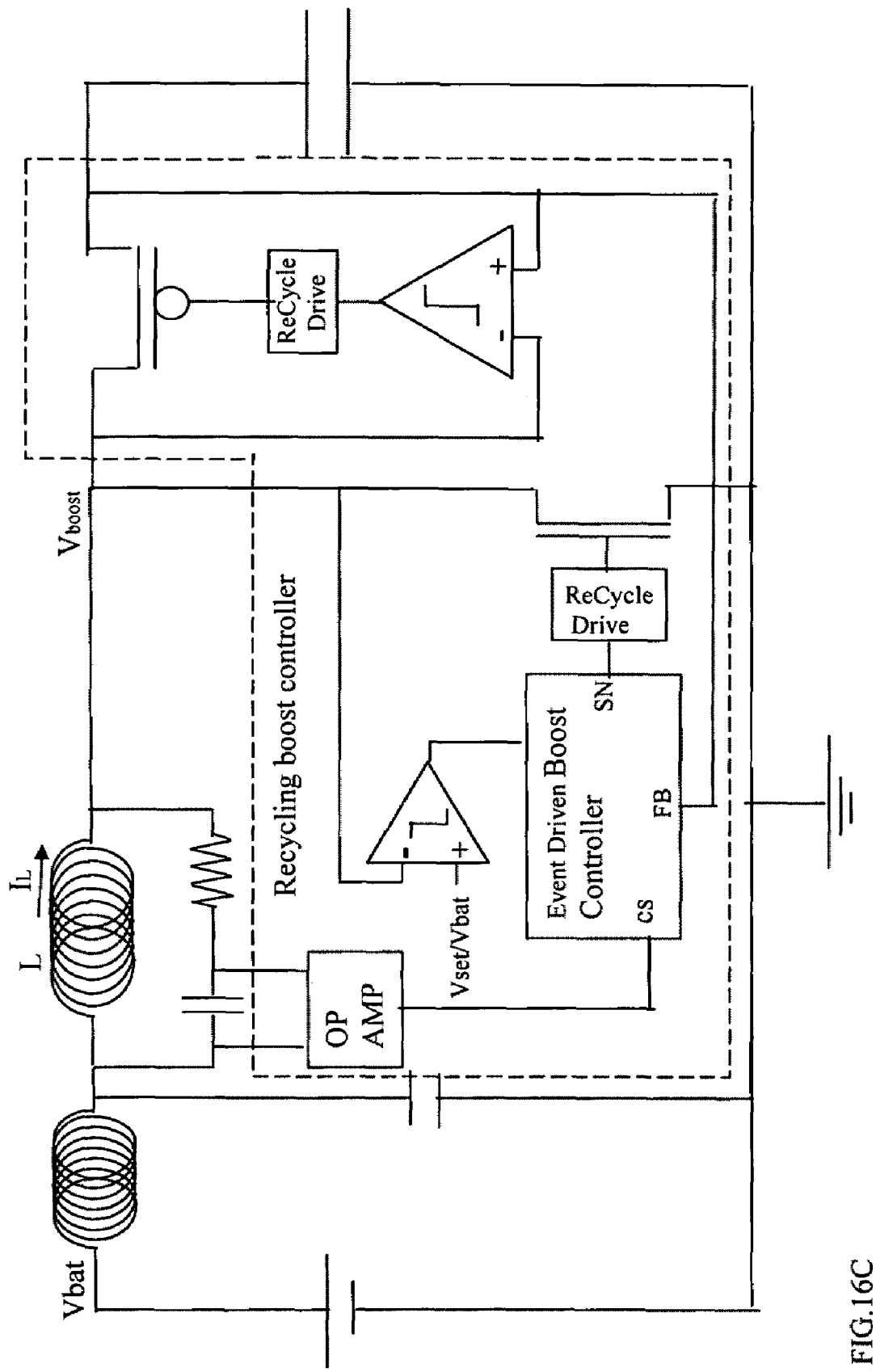
Figure 17A:
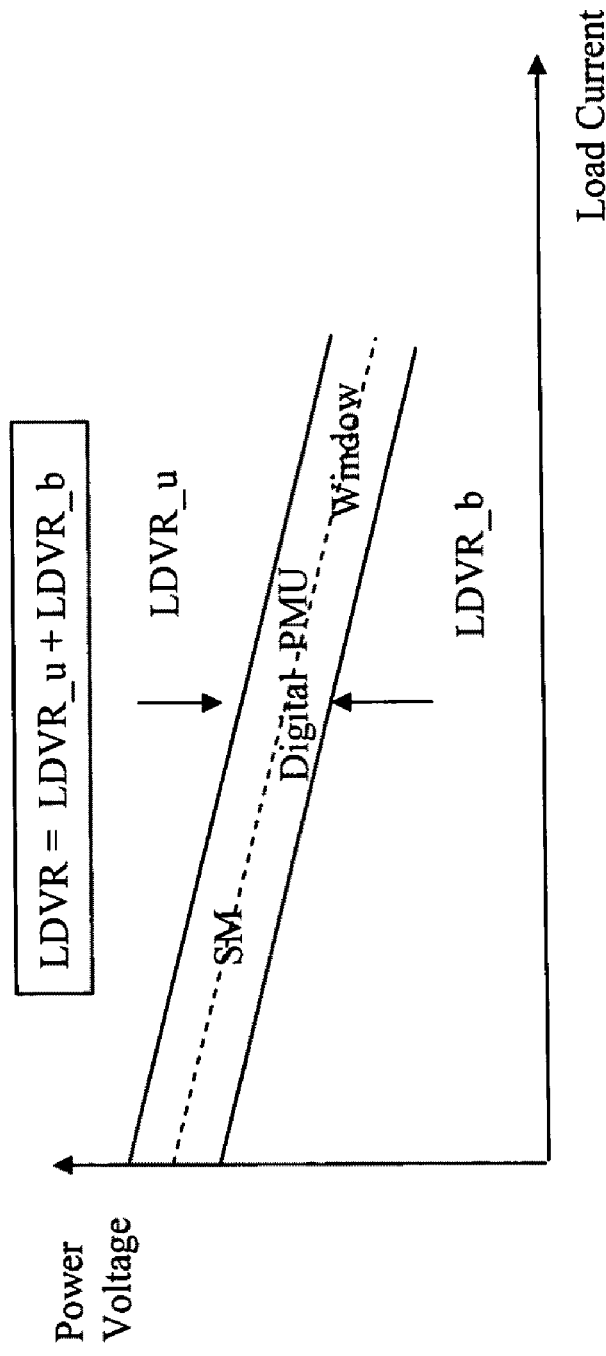
Figure 17B:
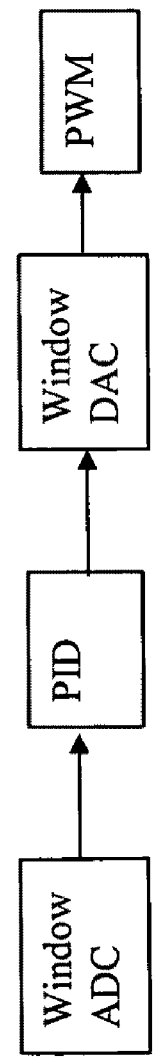
Figure 17C:
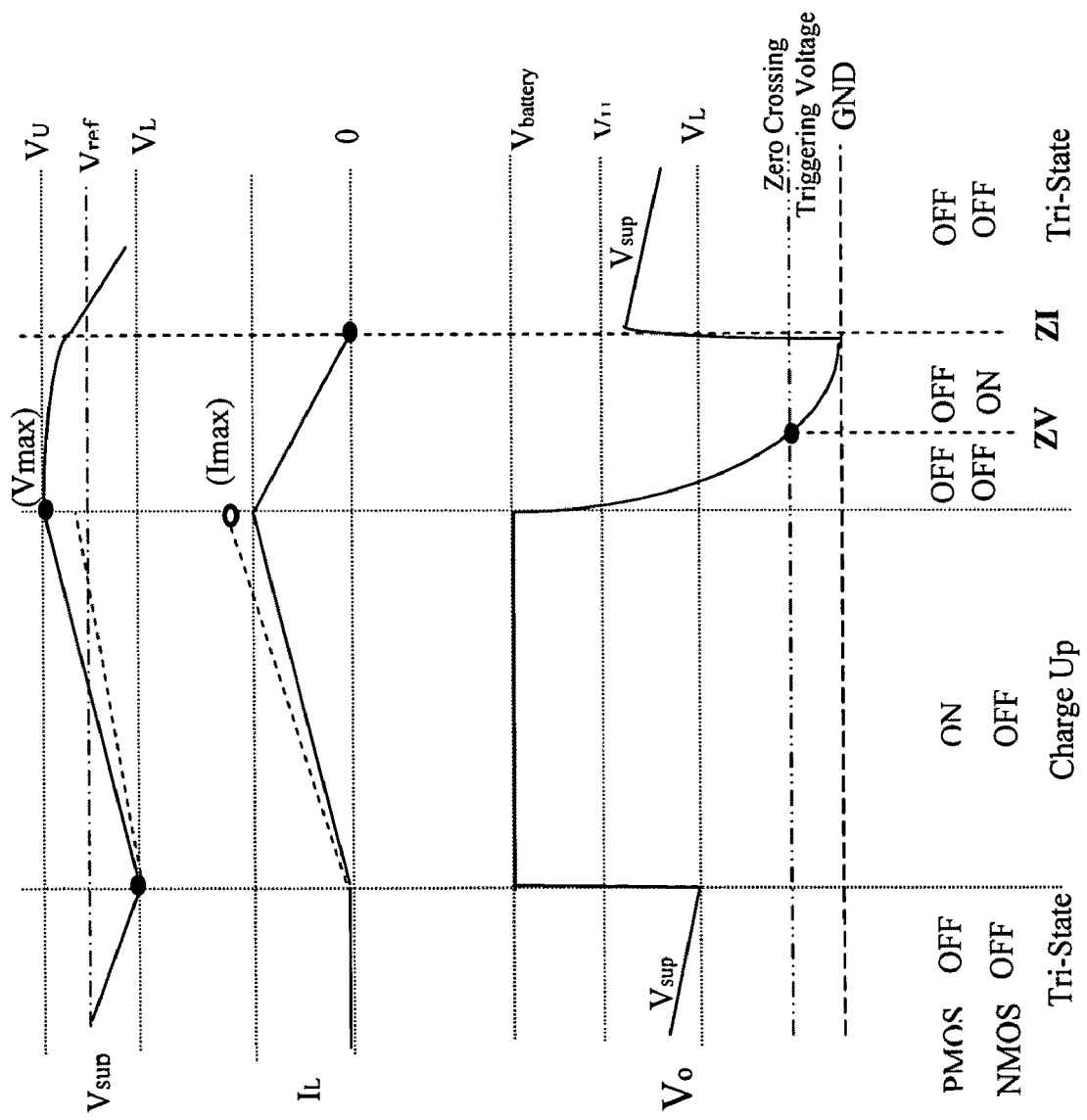
Figure 17D:
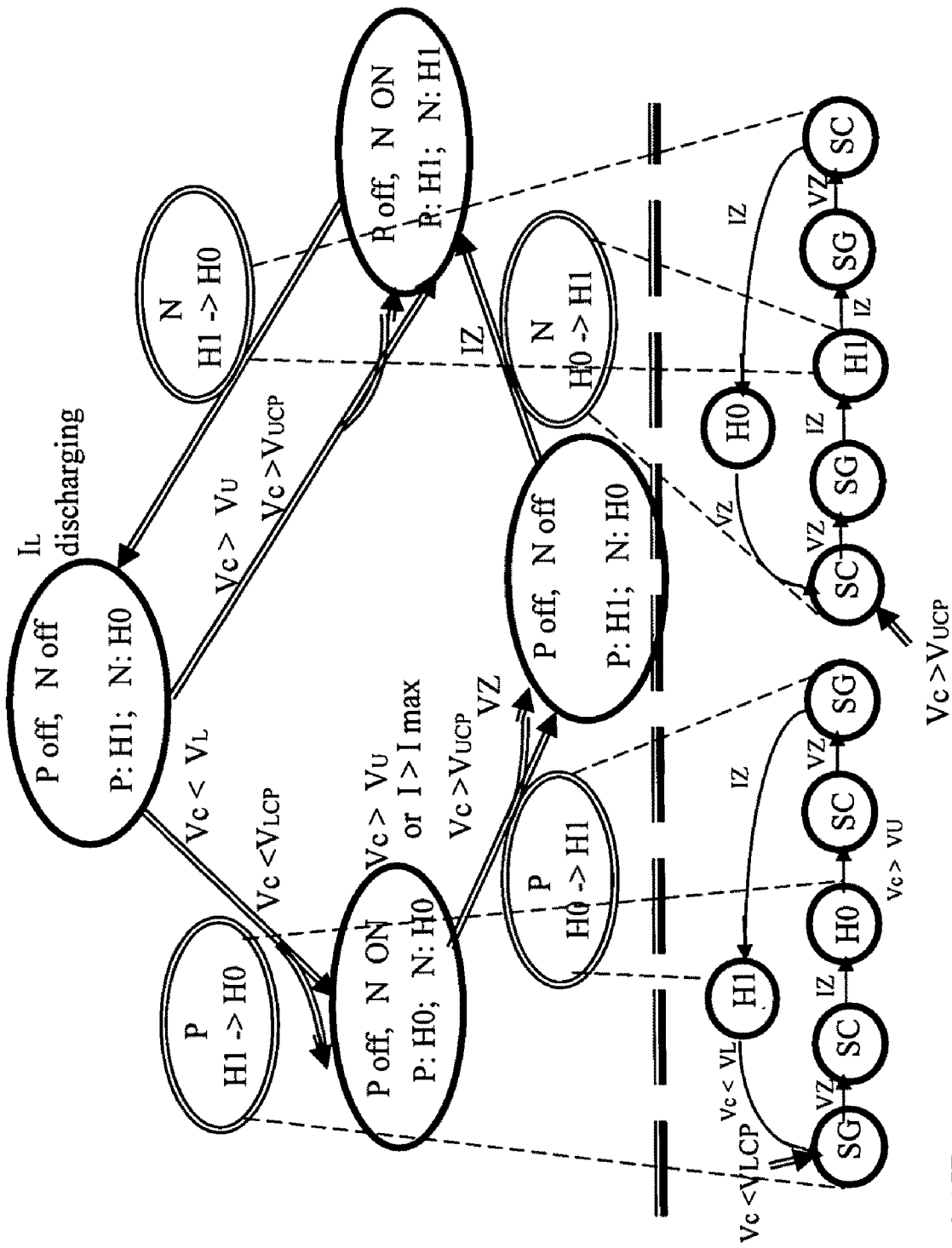

FIG. 16C is the single-chip event-driven recycling boost converter controller. All the components in the dotted line can be integrated in one single-chip. From FIG. 16A to FIG. 16C can be the prototype or product road map for the event-driven booster chip. It is to verify the event-driven booster algorithm first to have the prototype evaluation instead of the huge investment on development of recycling booster converter directly.

FIG. 17 is the general structure of the PMU which includes both SMPS and LDVR to be SMLDVR. It can be applied to both buck converter and boost converter. The buck converter can implement the LDVR to have both LDVR_u and LDVR_b. The boost converter can implement only the LDVR_b to be one half of the LDVR set. As shown in FIG. 17B, the digital controller is implemented with the window ADC and window DAC architecture. FIG. 17C is the waveform of the buck converter. FIG. 17D is the hierarchical state diagram of the controller for the buck converter. As shown in FIG. 15A and FIG. 18, the hierarchical state diagram can be applied to the boost converter for the recycling drive of the switching NMOS and PMOS, too. FIG. 19 and FIG. 20 are the mechanisms for the recycling drive of the switching NMOS and PMOS. The event driven boost converter as shown in FIG. 16C can be implemented with the hierarchical state diagram as shown in FIG. 18.

The energy saving principle of the boost converter can be applied to the power amplifier, too. For the digital switch case of the plasma light, as shown in FIG. 21, the resisterless current sensor, the Vboost gate synchronous mechanism and recycling drive in FIG. 16C are added to the power amplifier PA in FIG. 21. This Load Adaptive Synchronization Input will increase the power efficiency of the power amplifier of the plasma light a lot. For the analog modulation case, as shown in FIG. 22, the resisterless current sensor and the Vboost gate synchronous mechanism are added to the power amplifier PA. The N-type Peaking PA, Peaking Class C with Power Tracking, is equivalent the dynamically adjust bias PA. It will increase the power efficiency the power amplifier a lot.

Almost all the chip needs both the green technology power and clock. After we investigating the green power technology, we investigate the green clock technology. FIG. 23 shows the versatile green technology clock. FIG. 23A I is the xtaless clock generator made of the PLL and on-chip gain-boost-Q LC resonator. FIG. 23A2 is the xtaless clock generator made of the direct frequency synthesis DFS and on-chip gain-boost-Q LC resonator. FIG. 23B1 is the clock generator made of the PLL and gain-boost-Q XC resonator. FIG. 23B2 is the xtaless clock generator made of the direct frequency synthesis DFS and gain-boost-Q XC resonator. FIG. 23C shows the detailed architecture of the xtaless clock generator made of the direct frequency synthesis DFS and gain-boost-Q XC resonator.

The gain-boost-Q GBQ is the platform for all the versatile oscillator. As shown in FIG. 24, the GBQ LC has the constant frequency with the temperature compensation of resistor adjustment. Adjusting the $R_C=R_L$, the oscillation frequency can be keep to be constant over temperature. To vary the oscillation frequency, adjusting the C value that the fo varies according to C. To vary the oscillation frequency, adjusting the C value that the $\omega_O=(LC)^{**1/2}$ varies according to C. In such a way, the temperature and frequency are decoupled to be two orthogonal components. Adjusting the capacitor, the frequency will not vary as the temperature varies.

To eliminate the humidity problem to use the cheap package, as shown in FIG. 25A, the magnetic field B=B// of the inductor of the GBQ-LC is confined on the surface which B// is parallel to the chip surface 11. There are two ways to confine the magnetic field B//. One is the coil confinement and the other is the core confinement. As shown in FIG. 25B1, the coil confinement has the coil 33 wrapped around a magnetic material 22. FIG. 25B2 is the cross-section of the coil confinement as shown in FIG. 25B 1. The magnetic field B// is confined with the coil wire 33. As shown in FIG. 25C1, the core confinement has the magnetic material 44 wrapped around the conductive wire 55 to have the magnetic flow in the magnetic material 44 in the same direction. FIG. 25C2 is the cross-section of the core confinement as shown in FIG. 25C1. The magnetic field B// is confined with the core magnetic material 44.

As shown in FIG. 26, the GBQ-XC has the constant frequency with the temperature compensation of resistor adjustment. Comparing with the GBQ-LC in FIG. 24 with the GBQ-XC in FIG. 26, the inductor L in FIG. 24 is replaced with the crystal X in FIG. 26. The crystal X has the inductance Lx and the parametric resistance Rx. Adjusting the Rc=Rx, the oscillation frequency can be keep to be constant over temperature. To vary the oscillation frequency, adjusting the C value that the $\omega_O=(Lx\,C)^{**1/2}$ varies according to C. In such a way, the temperature and frequency are decoupled to be two orthogonal components. Adjusting the capacitor, the frequency will not vary as the temperature varies.

FIG. 27A is the core structure of the spurfree/jitterless PLL. There is a ΣΔ DAC mechanism before the GBQ VCO gain-boost-Q voltage-controlled-oscillator. The noise will pass the noise-shaping ΣΔ DAC first to filter out the low frequency noise then feed into the high-Q low pass filter of the VCO. Therefore, the output of the VCO of the PLL is the spurfee/jitterless clock/oscillation. FIG. 27B shows one implementation of the ΣΔ DAC. It is also illustrative the difference of the ΣΔ DAC and the LPF. The LPF doesn't have the averaging function as shown in the ΣΔ DAC. After averaging to eliminate the band-band noise signal, the averaging output signal is passed to the LPF to eliminate the high frequency noise in the averaging output signal to get almost constant VCO control voltage Vctl for the VCO.

FIG. 28 shows the spurfee/jitterless Frequency & Phase lock loop FPLL has the frequency and phase adjustment being separated. The delay line is in charge for the phase difference. The VCO is in charge for the frequency deviation. The phase difference information is fed into the delay line to adjust the phase. The phase difference will feed into the ΣΔ DAC first to filter out the band-band control noise of the PFD then feed into the ΣΔ DAC to have the constant average voltage for the GBQ-VCO to adjust the VCO frequency.

FIG. 29 is the spurfee/jitterless FPLL being applied to the clock data recovery CDR. The GBQ-VCO is the quadratic VCO which is also known as the Two-Yi GBQ-VCO. There are two GBQ-VCOs in the VCO of the Two-Yi GBQ-VCO. One GBQ-VCO is to lock with the edge of the data. The output of the other GBQ-VCO is to sample the data.

The Two-Yi GBQ-VCO is shown as FIG. 30. There are four different GBQ mechanisms. One set of GBQ-VCO is to use the common-mode C and constant-amplitude A GBQ mechanisms. The other set of GBQ-VCO is to use the constant peak P and constant valley V GBQ mechanisms. Both set of GBQ mechanisms work and can be applied with the versatile different combinations, such as (1) common-mode C; (2) constant-amplitude A; (3) constant peak P; (4) constant valley V. It has the (4,2)/2=4×3/2=6 different combinations.

As shown in FIG. 30, in the generalization of the GBQ platform for the oscillator, the six different combinations for the individual oscillator of the GBQ-LC, GBQ-XC, GBQ-Ring Oscillator or the other GBQ-Oscillator are (1) {A, C}
(2) {P, V}
(3) {A, P}
(4) {A, V}
(5) {C, P}
(6) {C, V}

The other versatile combinations are also help for the high Q that also classified to be GBQ technologies such as {A}, {C}, {P}, {V}, {A, C, P}, {A,C,V}, {A,C,P,V}, etc.

It is noted that above 10 GHz, the CMOS technology LC resonator has the difficulty to reach the high frequency. So, for more than 10 GHz high-speed clock data recovery CDR, we need to use the most advanced multi-phase GBQ-VCO. For the multi-phase oscillator, there are two different oscillator mechanisms in the Two-Yi GBQ-VCO. One is the local LC resonator, the other is the ring oscillator mechanism. The PMOS as the cross-latch amplifier for each oscillator itself and the NMOS serves as the inverter in the ring oscillator. This structure can be reversed as NMOS as the cross-latch amplifier for each oscillator itself and the PMOS serves as the inverter in the ring oscillator.

Figure 31C:
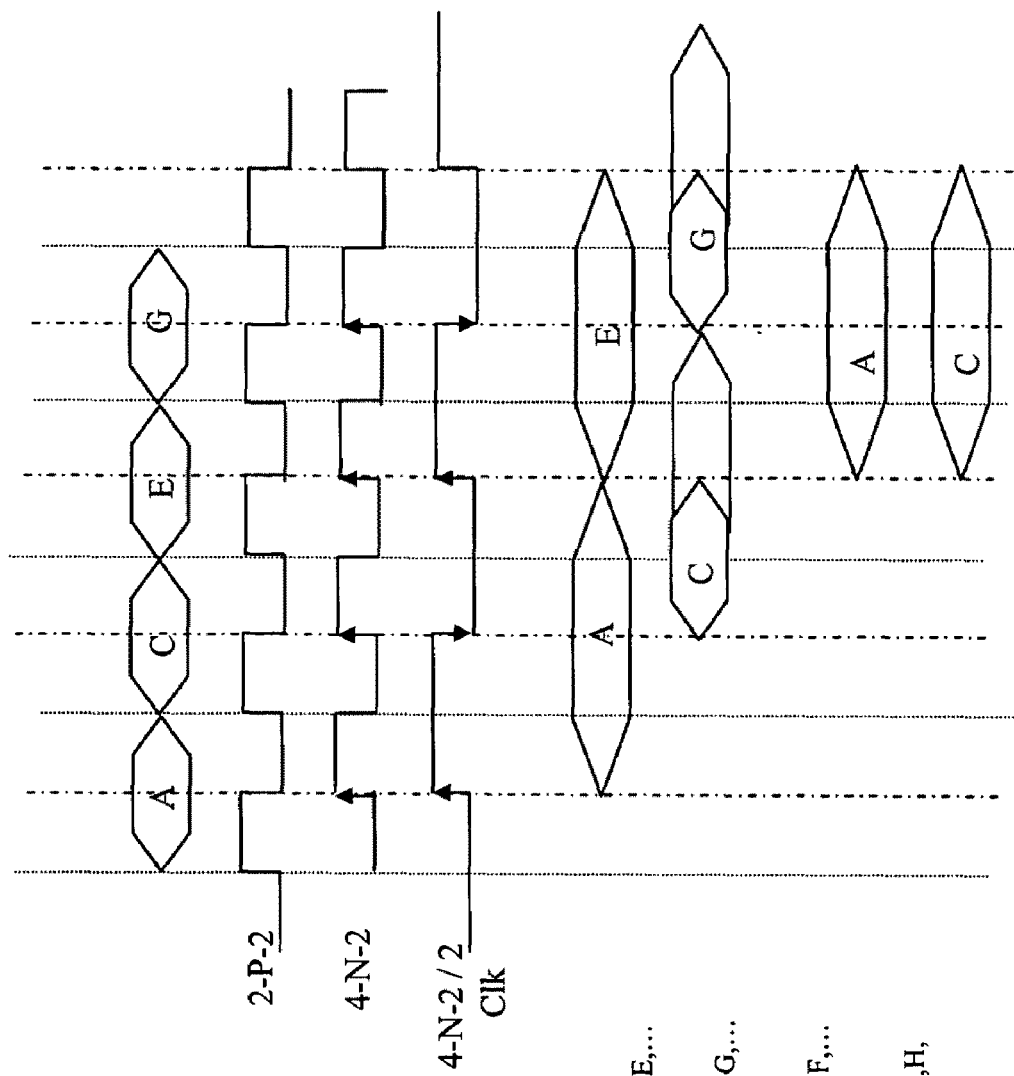
Figure 31D:
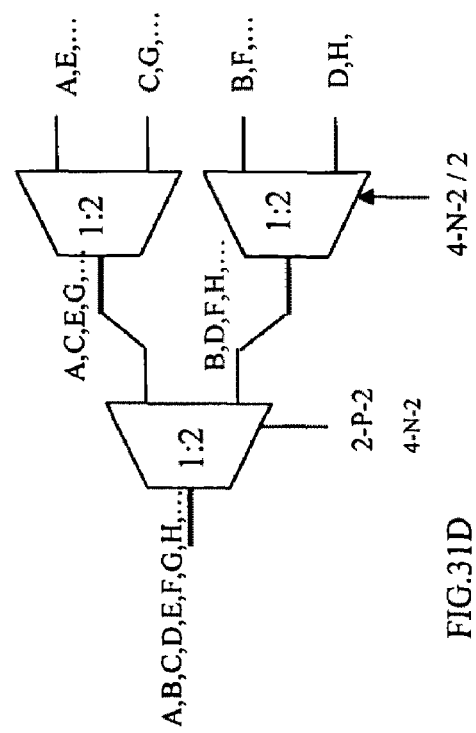

For the multi-phase PLL Locking clock, as shown in FIG. 31, it is the detailed analysis of the 4-phase Two-Yi GBQ-VCO. FIG. 31A is the symbolic representation of the quadratic GBQ-VCO as shown in FIG. 30. FIG. 31B1 is the timing waveform of the Two-Yi GBQ-VCO. FIG. 31B2 is the four (or five) latches of the DeMux-2 which uses the 4-phase clock of the Two-Yi GBQ-VCO. FIG. 31C is the timing waveform for the second stage DeMux-2. FIG. 31D shows the complete two-stage DeMux of CDR with the 4-phase Two-Yi GBQ-VCO.

FIG. 32 shows the general platform of CDR for the FPLL with the multi-phase GBQ-VCO. The GBQ-VCO can be the Two-Yi VCO, Four-Xiang VCO, Eight-Gua VCO, etc. FIG. 33 shows the detailed analysis of the 8-phase Four-Xiang VCO. FIG. 33A is the symbolic representation of the Four-Xiang VCO. FIG. 33B1 is the timing waveform of the Four-Xiang VCO. There are four oscillators in the Four-Xiang VCO. FIG. 33B2 is the eight latches of the DeMux-4 which uses the 8-phase clock of the Four-Xiang VCO. FIG. 33C is the timing waveform for the successive second stage DeMux-2. FIG. 33D shows the complete DeMux of CDR with the 8-phase Four-Xiang VCO.

Figure 34A:
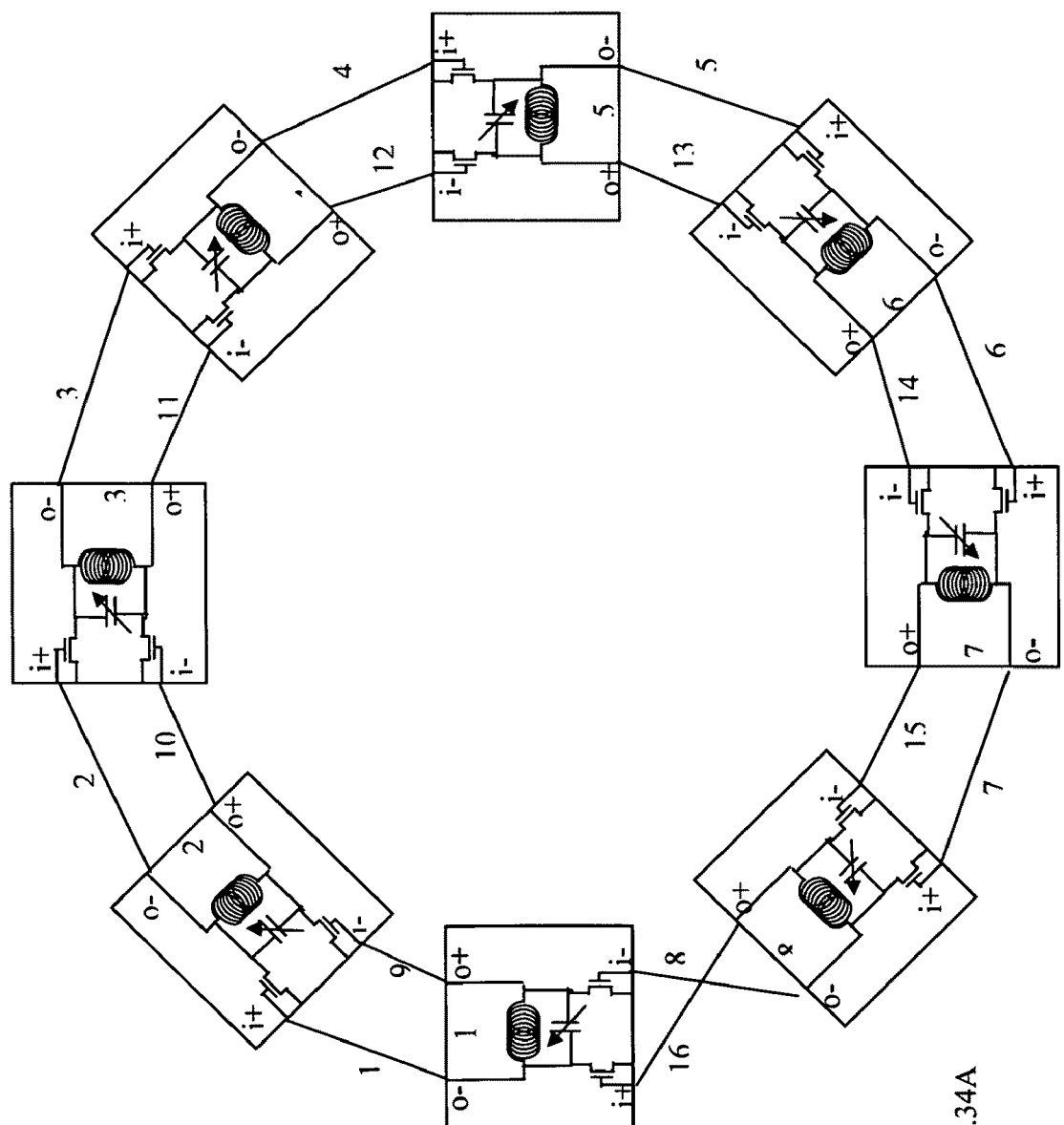

FIG. 34 shows the detailed analysis of the 16-phase Eight-Gua VCO. FIG. 34A is the symbolic representation of the Eight-Gua VCO. FIG. 34B1 is the timing waveform of the Eight-Gua VCO. There are eight oscillators in the Eight-Gua VCO. FIG. 34B2 is the 16 latches of the DeMux-8 which uses the 16-phase clocks of the Eight-Gua VCO. FIG. 34C shows the complete DeMux of CDR with the 16-phase Eight-Gua VCO.

The GBQ-LC VCO has many important applications. The multi-phase is the application of the GBQ-LC VCO in the SERDES and fiber-optics communication. The Sawless LNA and Sawless RFIC are the application of the GBQ-LC VCO in the wireless communication.

Figure 35B:
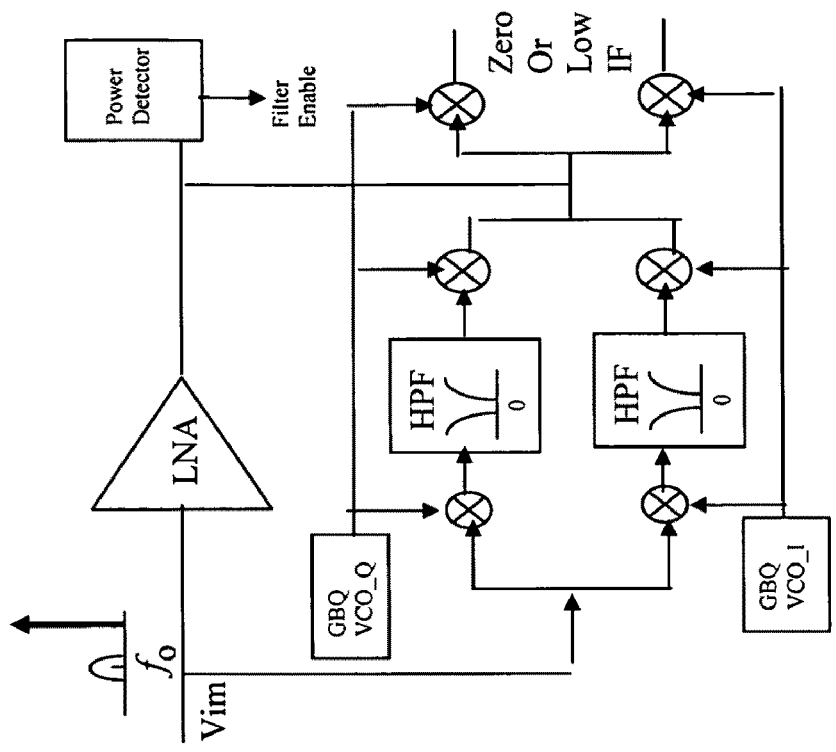
Figure 35A:
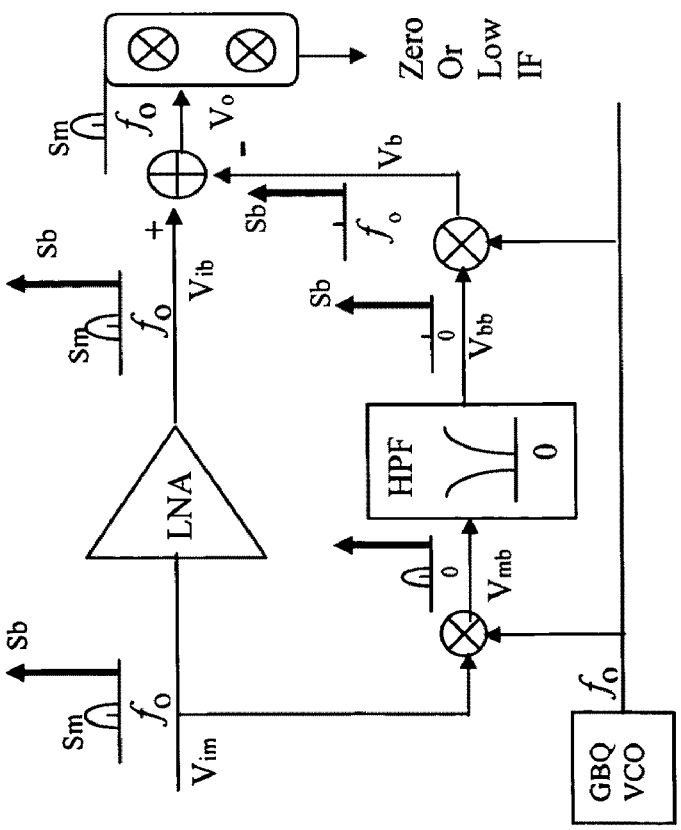

As shown in FIG. 35A, it is the Sawless LNA. The GBQ-VCO generates the high Q local oscillator fc oscillation. It carries the input signal Vim to the baseband low frequency $V_{mb}$ centered at zero frequency. Then the signal $V_{mb}$ passes through the high pass filter HPF to be Vbb. Then Vbb is carried to original high frequency with another mixer to be Vb. Only the blocking signal Sb exists in the output of the mixture path. Then the LNA path signal Vib minuses the mixture path signal Vb. The output signal Vo only has the $S_m$ signal. The blocking signal Sb is filtered out. With the high Q GBQ-VCO signal, this blocking signal Sb can be filtered out perfect. The high Q GBQ-VCO is very important for the Sawless LNA.

FIG. 35B shows the high Q quadratic GBQ-VCO is applied for the Sawless LNA. The quadratic local oscillating signals GBQ VCO$_{\_I}$ and GBQ VCO$_{\_Q}$ are applied to the incoming RF signals Vim with the mixture, HPF and mixture. The output of the GBQ VCO_I and GBQ VCO_Q paths being subtracted from the LNA signal to filter out the block signal.

Figures 36A, 36B:
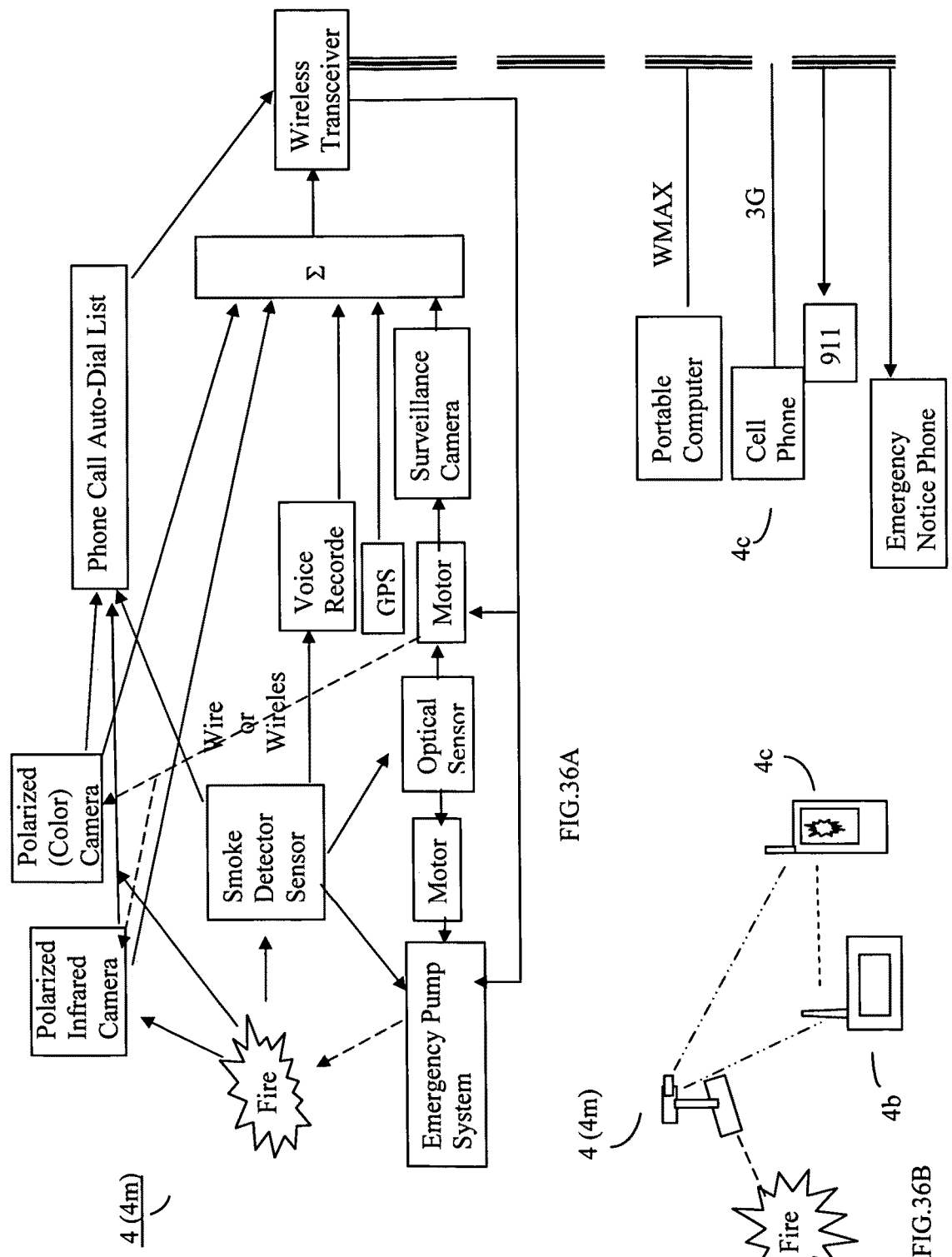

To protect the green forest and society against the fire disaster, we need to have the green safety system. As shown in the FIG. 1 and FIG. 36, the green technology has the very important applications of the green safety system. As shown in FIG. 36B, the fire disaster video and audio warning message signal is transmitted to the house owner and police office with the phone line, wireless and internet connection.

To receive the signal clear through the fog having the scattering light and signal, we need to have the polarized system, both in the wireless RF and optical form. The I,Q decomposition is the signal domain phase orthogonal decomposition. There are the wave domain space orthogonal decomposition. We can use the polarized antenna and polarized camera to increase the channel bandwidth and have the much clearer high quality communication.

As shown in FIG. 37, it is the transceiver architecture having the polarized antenna. The high quality GBQ-VCO and the Sawless LNA is very important in the transceiver architecture having the polarized antenna. There is a motor to rotates the polarized antenna to have the maximum sensitive to the polarized wave transmission.

Figure 38B:
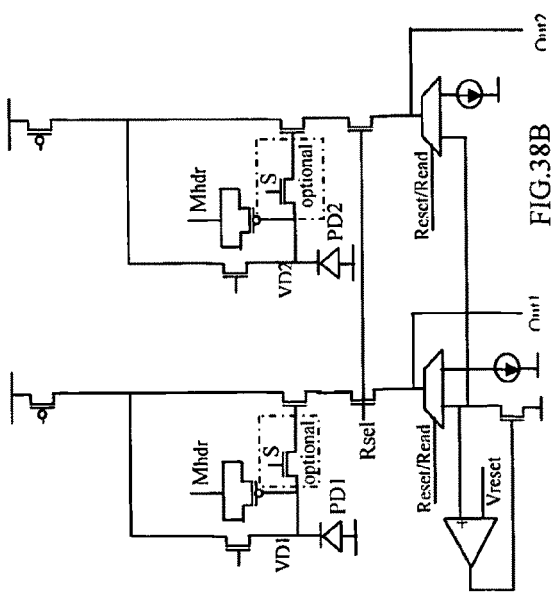

To have the best camera, the best surveillance camera is the polarized camera with the high dynamic range. As shown in the FIG. 38, the high dynamic range surveillance camera has the pixel level fixed pattern noise compensation. As shown in FIG. 38A, during the reset period, the reset device Mrs is turned on, and the voltage VD is self-adjusted to have the output reset voltage to be Vrs. The FPN of the individual pixel is compensated. As shown in FIG. 38B, the Vreset can be implemented as a global reset with OPAMP connected with a NMOS. With such kind of the reset configuration, the reset voltage Vreset can be send out directly as the common reset voltage reference. Each individual pixel will adjust its reset diode voltage VD to satisfy to have the common reset voltage Vreset.

As the diode voltage VD drops, the PMOS device $M_{hdr}$ capacitance increases that the pixel has the nonlinear large dynamic range effect. Furthermore, adjust the bias voltage VPG, the Mrs has the leakage current as the VD drops. It increases the dynamic range, too.

As shown in FIG. 39, it is the polarized micro lens with the vertical and horizontal polarizer. FIG. 39B is the RGB Bayer's pattern. FIG. 39C is the infrared polarized micro lens. It is the infrared sensor being covered with the polarized micro lens. The infrared camera also can have the infrared filter covering on the conventional camera sensor with the polarized micro lens to constitute the infrared polarized camera. FIG. 39D1 is one implementation of the polarized color RGB For each polarized zone. The RGB Bayer pattern further divides each polarized zone to be four sub-color regions. On the contrary, FIG. 39D2 is to divide each color zone to be 4 polarized sub-regions. FIG. 39D3 is the multi-color-layer polarized technology. The color region is divided to be 4 polarized sub-region as the infrared sensor does.

Figure 39G:
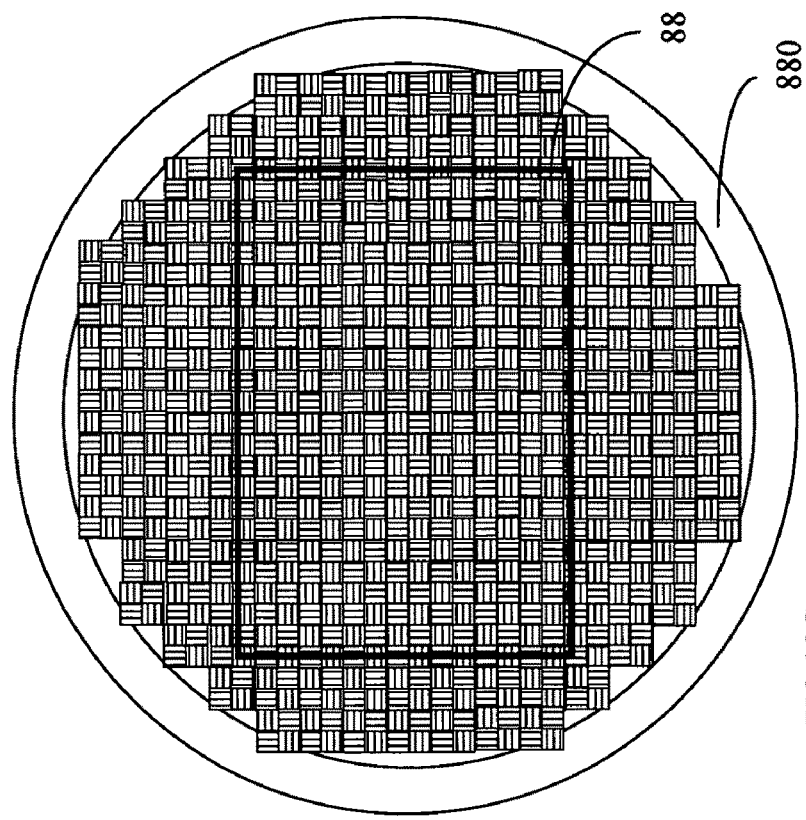
Figure 39F:
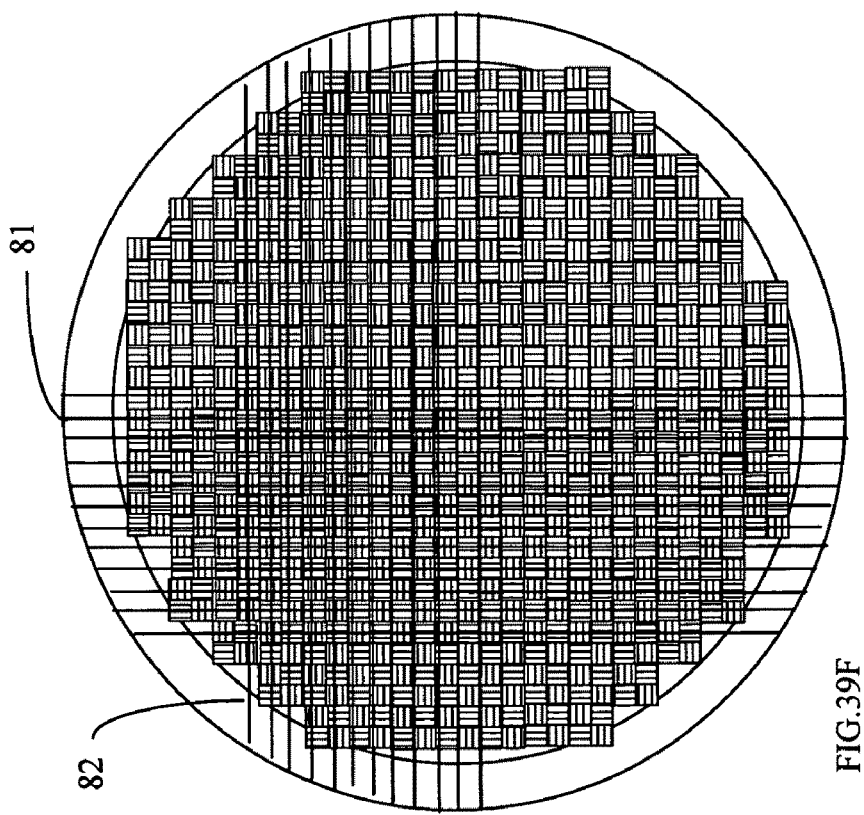
Figure 39I:
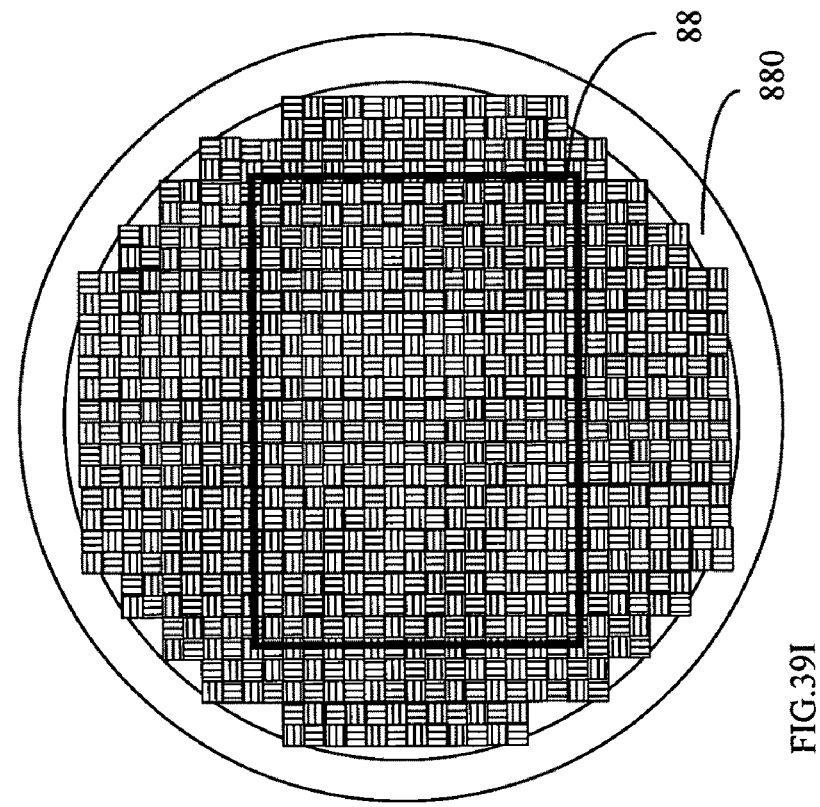
Figure 39H:
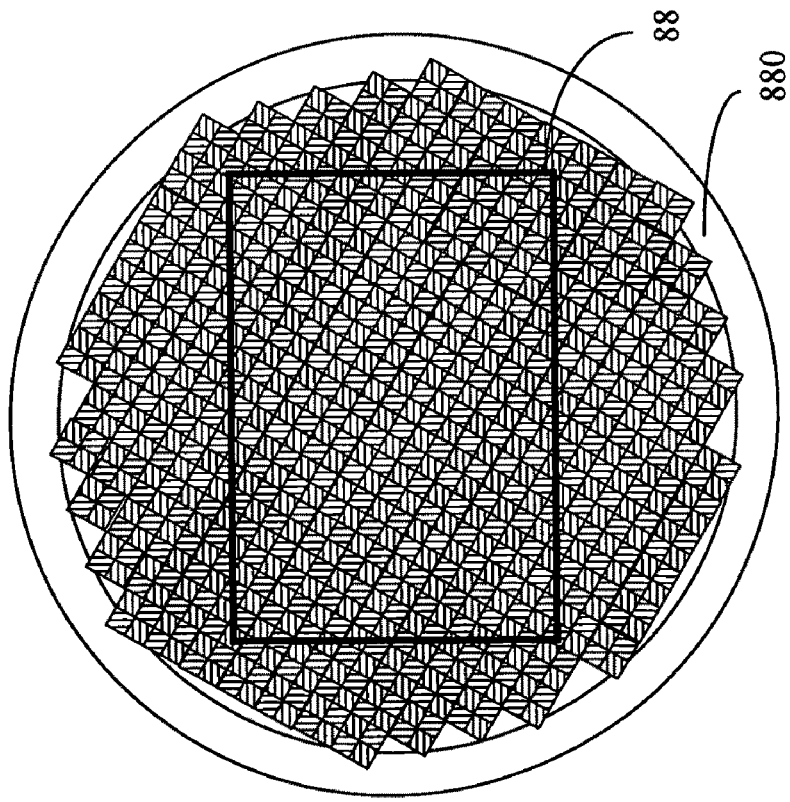

FIG. 39E shows the pixel array in the circular shape. FIG. 39F shows the alignment of the column decoder lines 81 and row decoder lines 82. FIG. 39G is the camera frame 880. The camera visual window 88 is fixed independent of the rotation of the camera chip 880. FIG. 39G is the camera frame 880 rotating 45 degrees. FIG. 39H is the camera frame 880 rotating 90 degrees which has the vertical polarizer become to be the horizontal polarizer, and vice versa. Therefore, the rotation of the camerachip needs only less than 90 degrees to find the optimum rotation angle of the polarizer. FIG. 40 is the block diagram to show the signal processing of the Polarized Camera. First, the camera makes the interpolation for the color-polarized signal RGB. Second, makes the subtraction of the polarized signal pixel by pixel. Third, make the stretch of the difference of signals to the full scale of voltage span. Fourth, take the average over the entire frame. If the average is about 0, then lock the rotation of the camerachip, otherwise, make the increment of the rotation to find out the optimum rotation angle for the camerachip. This process also can implement with the manual interactive process. The signal can send to the LCD panel to make the display. The viewer makes the adjustment of the rotation of the polarized angle to find the optimum angle.

FIG. 41 is the polarized camera without the rotation of the camerachip. FIG. 41A is the polarized mirrors made of no polarized micro lens 990, 0 degree polarized micro lens 991 and 45 degrees polarized micro lens 992. As shown in FIG. 41B, the Infrared camera has the polarized mirrors covering on the infrared sensors. The infrared camera also can have the infrared filter covering on the conventional camera sensor with the polarized micro lens to constitute the infrared polarized camera. FIG. 41C1 is the each polarized zone has the RGB color pattern. FIG. 41C2 is each color zone has the four polarized sub-regions. FIG. 41C3 is the polarized micro lens over the RGB color layers. FIG. 41D is the array sensor of the polarized camerachip.

Figures 42A, 42B:
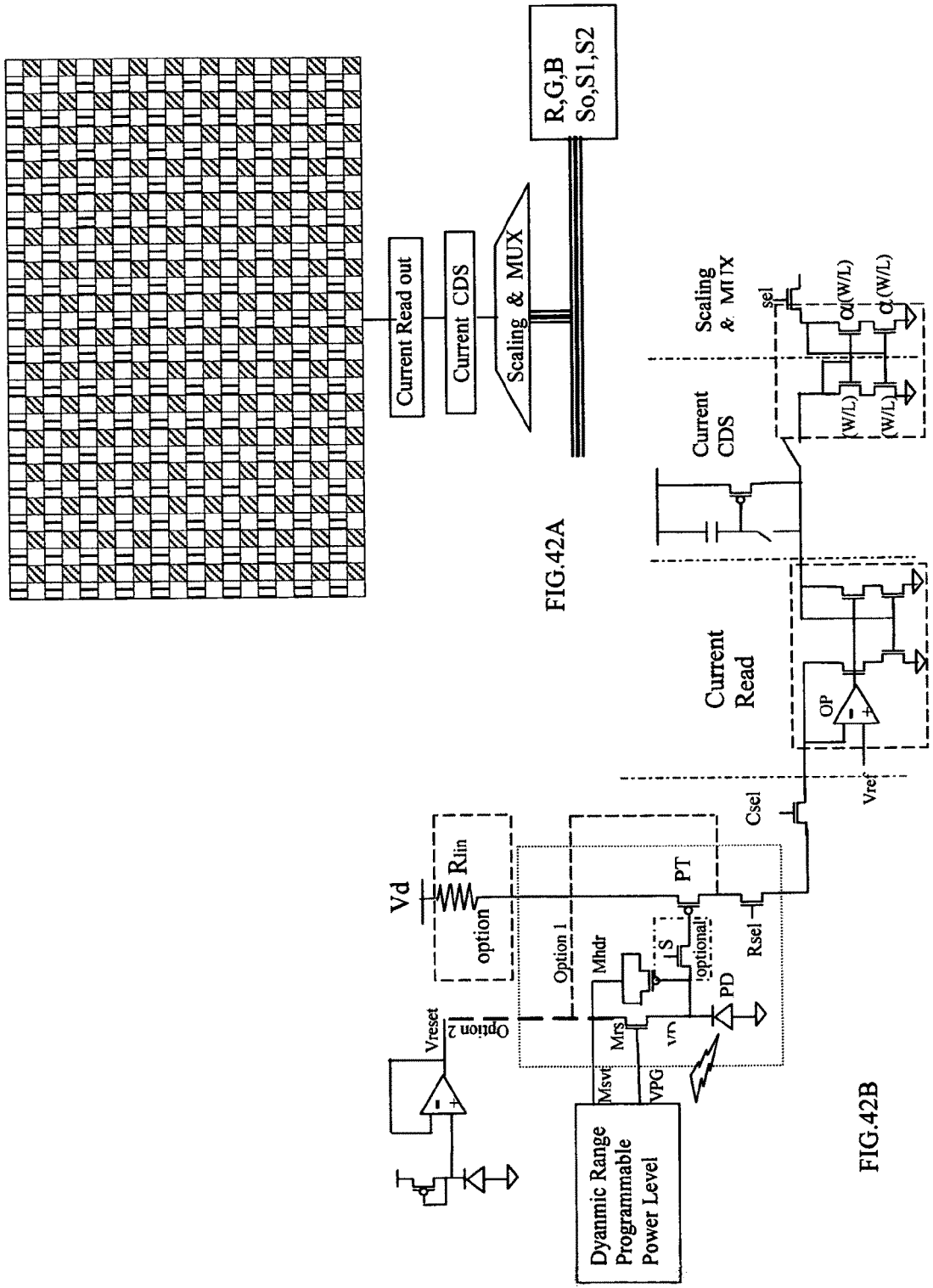

FIG. 42A shows the polarized color camera chip signal process. It can be either voltage mode or current mode. There are RGB and polarized information.

The following computation is based on the FIG. 41C2. For the neighboring 2×2 polarized cells, $S0 = It$ $S1 = 2I(0,0) - It$ $S2 = 2I(45,0) - It$ For the neighboring 2×2 polarized cells, the computation of the Stokes parameters is $Sx = (\alpha_1 I_1 + \alpha_2 I_2 + \alpha_3 I_3 + \alpha_4 I_4)$ for $x = 0$ to $2$ Where It is the total intensity; I(0,0) is the intensity of the e-vector filtered with a 0 degree polarizer and no phase compensation between the x and y components; I(45,0) is the intensity of the e-vector filtered with a 45 degree polarizer and no phase compensation.

FIG. 42B shows the current mode analog signal processing for the polarized information. It has the PMOS device PT working in the linear triode region with the adjustment of the Vref. The current is proportional the voltage variance.

Furthermore, with the addition of the capacitive MOS Mhdr and the leaking device Mrs, it has the wide dynamic range pixel design. The polarized camera not only have the polarized light to have the longer clearer distance, but also has the wide dynamic range of color. It is the best surveillance camera.

Figure 42C:
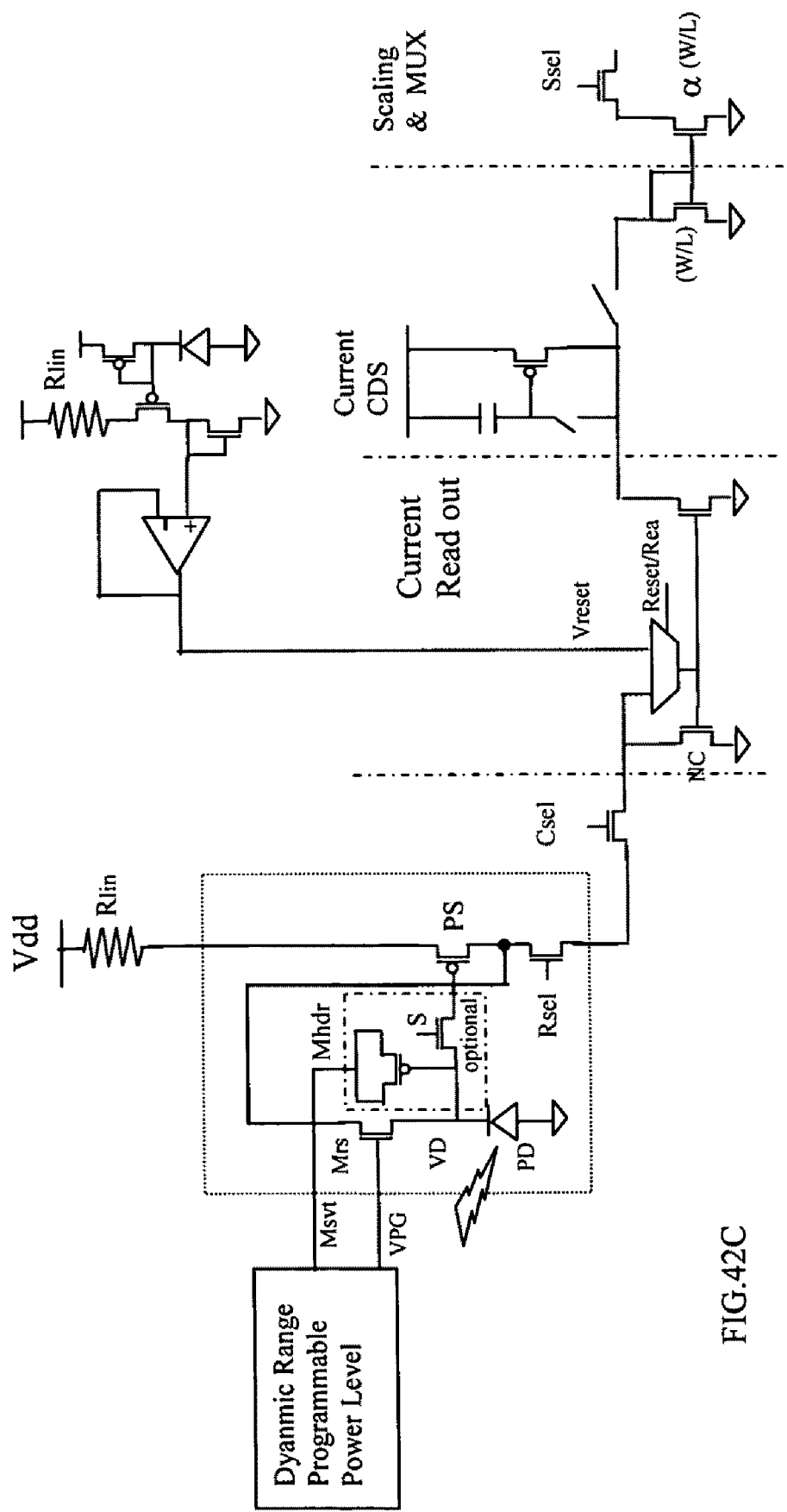

FIG. 42C is the different implementation of the linear current gain analog signal processor. However, the PMOS device PS can work in the saturation mode. There is Rlin to convert the saturation mode to be the linear operation. This is the source follower with resistor Rlin. There is no need for the amplifier OP as shown in FIG. 42B. Furthermore, the output of the reset device Mrs is connected to the drain of the PMOS device PS. With this configuration, it has the pixel level fixed pattern noise (FTP) compensation. During reset, the NMOS device NC is biased with the Vreset. During read out, the NMOS device NC is in the diode connection.

Figure 43B:
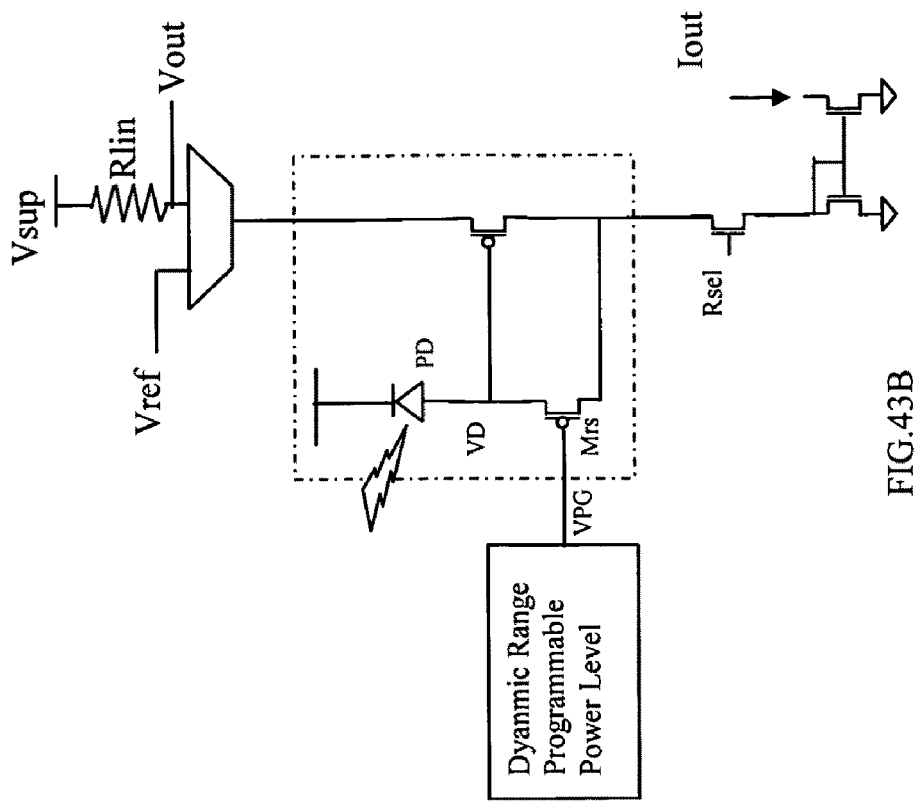
Figure 43A:
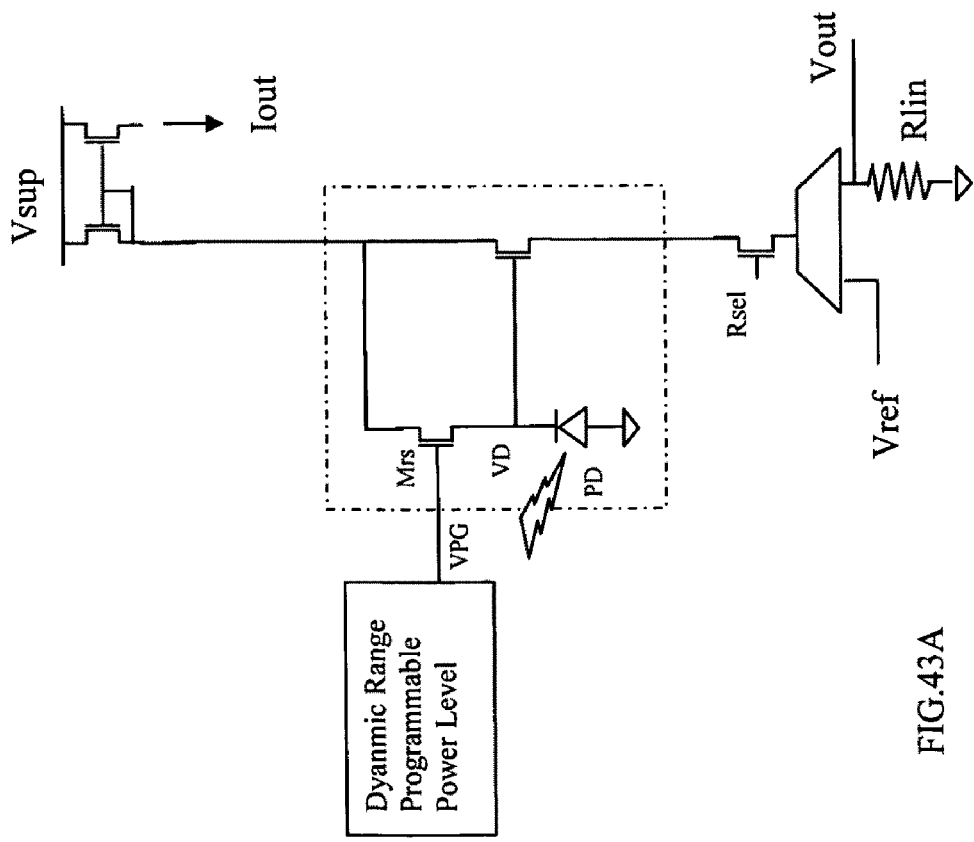

For the polarized camera pixel having both the current output and voltage output, FIG. 43A is the N type APS pixel array structure; FIG. 43B is the N type APS pixel array structure. It has the leaky Mrs device to have the wide dynamic arrange. The reset with the external Vref is to have the common reset voltage and have the pixel-wise FPN compensation.

With the polarized color pixel design of the FIG. 39D2 or FIG. 40C2, after the polarized cell computation, then the DSP can process the interpolation for RGB pattern as the conventional color camerachip does. The polarized color camera is compatible the existing color camera.

Figure 44A:
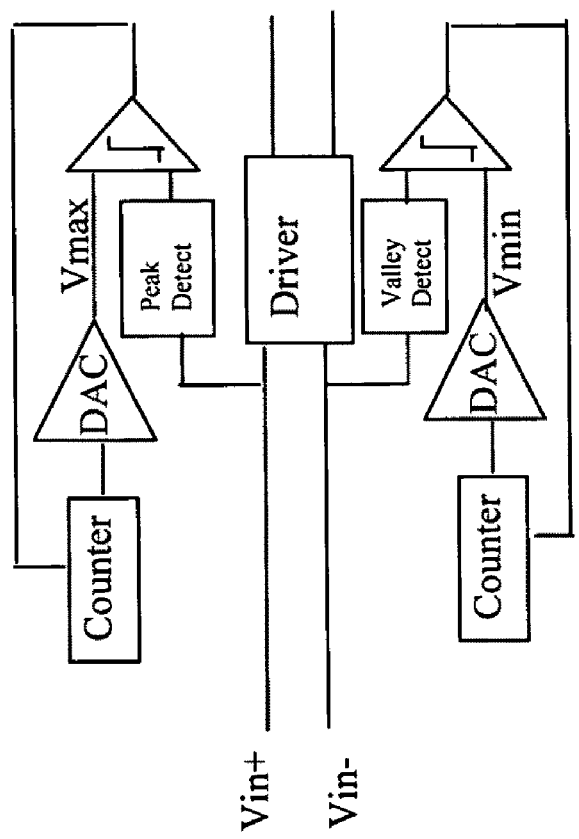

For the color-polarized data, the polarized camera needs the high-speed data transmission. FIG. 44A shows the PIN driver receiver for the high-speed data transmission. FIG. 44A has the circuit detects the data maximum voltage $V_{max}$ and the data minimum voltage Vmin as shown in FIG. 43B. The MAX detector detects the peak value of the input signal. The counter count up and down. The DAC converts the count to be the analog voltage. The source follower resistor $R_{lin}$ can increase the linearity at low intensity light.

Furthermore, the polarized microlens can cover on the amorphous silicon technology to have 100% filled factor. All the circuit are implemented on the beneath layers. For example, as shown in FIG. 41C2, the polarized color microlens covering on the amorphous silicon is one of the best combination of the high performance wide dynamic range surveillance color camera.

While the invention has been particularly shown and described with reference to the preferred embodiments thereof, it will be understood by those skilled in the art that various changes in form and details may be made therein without departing from the spirit and scope of the invention.

We claim:

1. A green technology means being constituted of energy recycling means and resource saving design to have the energy recycling in said green technology means, said energy recycling means having residue energy being recycled in said green technology efficiently.

2. A green technology means according to claim 1 further comprising a dynamic balance battery means,
said dynamic balance battery means further comprising a plurality of cells,
said cells being connected in parallel during charging process;
said cells being connected in series during discharging process to operate at rated voltage.

3. A green technology means according to claim 1 further comprising micro-switching means,
said micro-switching means further comprising a toggle conducting plate means and electrical pole means and two connection means;
as electricity being injected to said electrical pole means, said toggle conducting plate means being connected to one connection means;
as electricity being reverse polarity, said toggle conducting plate means being connected to another connection means.

4. A green technology means according to claim 1 further comprising a boost converter means,
said boost converter means further comprising an inductor means, a capacitor means, a discharging N device means and a forward conducting device means,
said N device means connecting with a terminal of said inductor means and a positive terminals of said forward conducting device means at a boosting node;
said capacitor means connecting with another terminal of said inductor means at a storing node;
said N device means switching on to discharge charge stored in said capacitor and build up inductor current of said inductor means then switching off to charge up said boosting node to boost up voltage to have current flowing through said forward conducting device means;
as said inductor current in said inductor means reversing current flowing direction, residue charge of said boosting being discharged and said storing node being charged up to save said residue charge.

5. A green technology means according to claim 1 further comprising a recycling energy means for vehicle means,
said recycling energy means being constituted of generator means, wheel means and generator engaging means,
as a break means of said vehicle means being applied, said generator engaging means engaging with said wheel means and said generator means to drive said generator means to rotate to generate electricity.

6. A green technology means according to claim 1 further comprising a current sensor means to measure current flowing through an inductor means,
said inductor means further comprising an inductance and a parametric resistance,
said current sensor means further comprising a series connection of a resistance and a capacitor being connected in parallel with said inductor means,
an operation amplifier connecting two terminals of said capacitor to read out current flowing through said inductor.

7. A green technology means according to claim 1 further comprising a forward conducting device means,
said forward conducting device means being constituted of a comparator means and a switching device means,
as voltage at a positive end being greater than voltage at negative end, said comparator means switching on said switching device;
as voltage at a positive end being less than voltage at negative end, said comparator means switching off said switching device.

8. A green technology means according to claim 4 said boost converter further comprising a PWM controller means, current sensor means and boost voltage monitoring means,
said current sensor means further comprising a series connection of a resistance and a capacitor being connected in parallel with said inductor means,
said boost voltage monitoring means monitoring voltage of said boost node and gate a PWM signal for said PWM controller means to switch said N device.

9. A green technology means according to claim 4 said boost converter further comprising an event driven controller means, current sensor means and boost voltage monitoring means,
said current sensor means further comprising a series connection of a resistance and a capacitor being connected in parallel with said inductor means,
said boost voltage monitoring means monitoring voltage of said boost node and gate said event-driven controller means to switch said N device.

10. A green technology means according to claim 1 further comprising a plasma light power amplifier means,
said power amplifier means further comprising an inductor means, N switch means, current sensor means, output voltage monitoring and current sensor means,
said current sensor means further comprising a series connection of a resistance and a capacitor being connected in parallel with said inductor means,
said output voltage monitoring means monitoring voltage of said output node and gate said controller means to switch said N device.

11. A green technology means according to claim 1 further comprising a power amplifier means,
said power amplifier means further comprising an inductor means, N device means, current sensor means, output voltage monitoring and current sensor means,
said current sensor means further comprising a series connection of a resistance and a capacitor being connected in parallel with said inductor means,
said output voltage monitoring means monitoring voltage of said output node and adjusting bias voltage of said N device.

12. A green technology means according to claim 1 further comprising a LC resonator,
said LC resonator comprising an inductor and a tuning capacitor and tuning resistance,
said inductor having parametric resistance;
tuning said tuning resistance to have said tuning resistance being equal to said parametric resistance of said inductor, a resonant frequency of said LC resonator being independent of variance of temperature;
tuning said tuning capacitor varying said resonant frequency of said LC resonator.

13. A green technology means according to claim 1 further comprising a XC resonator,
said XC resonator comprising a crystal and a tuning capacitor and tuning resistance,
said crystal having parametric resistance;
tuning said tuning resistance to have said tuning resistance being equal to said parametric resistance of said crystal, a resonant frequency of said XC resonator being independent of variance of temperature;

tuning said tuning capacitor varying said resonant frequency of said XC resonator.

14. A green technology means according to claim 1 further comprising a chip having LC resonator,
  a inductor of said LC resonator having magnetic field being confined in a plan parallel to surface of said chip.

15. A green technology means according to claim 14 further comprising a chip having LC resonator,
  a inductor of said LC resonator having magnetic field being confined in a plan parallel to surface of said chip with a coil.

16. A green technology means according to claim 14 further comprising a chip having LC resonator,
  a inductor of said LC resonator having magnetic field being confined in a plan parallel to surface of said chip with a core of magnetic material.

17. A green technology means according to claim 1 comprising a ring oscillator being made of a plurality of LC resonators,
  said LC resonators being connected as a ring;
  each LC resonator having one pair of cross latching mechanism and an output pair of LC resonators being connected to input of next stage LC resonator.

18. A green technology means according to claim 1 further comprising a green safety system,
  said green safety system comprising disaster detector, surveillance camera and wireless means,
  as said disaster detector means detecting disaster, said surveillance camera sending voice warning message and imaging signal through said wireless means.

19. A green technology means according to claim 1 further comprising a polarized camera,
  said polarized camera having polarized micro lens covering on RGB pixels.

20. A green technology means according to claim 1 further comprising a sawless LNA,
  said sawless LNA comprising low noise amplifier LNA, mixers, high pass filter HPF and gain-boost-Q GBQ LC resonator,
  a RF signal passing through a first mixer, said high pass filter HPF and a second mixer then being subtracted from said RF signal passing through LNA,
  said first mixers and said second mixer having said gain-boost-Q GBQ LC resonator as local oscillator.

* * * * *